(12) United States Patent
Saito et al.

(10) Patent No.: US 6,222,779 B1
(45) Date of Patent: Apr. 24, 2001

(54) SEMICONDUCTOR STORAGE DEVICE WITH AUTOMATIC WRITE/ERASE FUNCTION

(75) Inventors: Hidetoshi Saito, Yokohama; Hideo Kato, Kawasaki; Naoto Tomita; Tokumasa Hara, both of Yokohama, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/460,644

(22) Filed: Dec. 15, 1999

Related U.S. Application Data

(63) Continuation-in-part of application No. 09/298,403, filed on Apr. 23, 1999, now abandoned.

(30) Foreign Application Priority Data

Apr. 24, 1998 (JP) .................................................. 10-115625

(51) Int. Cl.$^7$ ..................................................... G11C 7/00
(52) U.S. Cl. ...................................... 365/189.09; 365/229
(58) Field of Search ................................. 365/189.09, 229

(56) References Cited

U.S. PATENT DOCUMENTS 6,134,171 * 10/2000 Yamagata et al. .................... 365/229

* cited by examiner

Primary Examiner—Terrell W. Fears
(74) Attorney, Agent, or Firm—Hogan & Hartson, LLP

(57) ABSTRACT

A semiconductor storage device, which has an automatic write/erase function, and uses a potential obtained by boosting a power supply voltage upon write/erase, has a write division control circuit which shifts the selection timings of bit lines upon write, so as to decrease the number of bits to be written simultaneously, thereby reducing the consumption current and compensating for insufficient current supply performance of a power supply circuit in case the power supply voltage is low, and refers to the contents of erase flags upon pre-programming in erase, and erase only blocks that require erases, while, when the power supply voltage is high as the power supply voltage has a wide range or the write time is short as in an acceleration test, the number of bits to be selected at the same time is increased to prevent an increase in write/erase time.

22 Claims, 34 Drawing Sheets

| DS0 | DS1 | DIVISION SCHEMES |
|---|---|---|
| 0 | 0 | 16-BIT BATCH SELECTION |
| 0 | 1 | 16-BIT BATCH SELECTION |
| 1 | 0 | TWO-DIVISIONAL SELECTION (EVERY 8 BITS) |
| 1 | 1 | FOUR-DIVISIONAL SELECTION (EVERY 4 BITS) |

| A | B | DIVISION METHOD |
|---|---|---|
| 0 | 0 | BATCH MODE (16 BITS) |
| 0 | 1 | TWO-DIVISION MODE (8 BITS) |
| 1 | 1 | FOUR-DIVISION MODE (4 BITS) |

| A | B | C | D | DIVISION METHOD |
|---|---|---|---|---|
| 0 | 0 | 0 | 0 | BATCH MODE (16 BITS) |
| 0 | 0 | 0 | 1 | TWO-DIVISION MODE (8 BITS) |
| 0 | 0 | 1 | 1 | FOUR-DIVISION MODE (4 BITS) |
| 0 | 1 | 1 | 1 | EIGHT-DIVISION MODE (2 BITS) |
| 1 | 1 | 1 | 1 | 16-DIVISION MODE (1 BIT) |

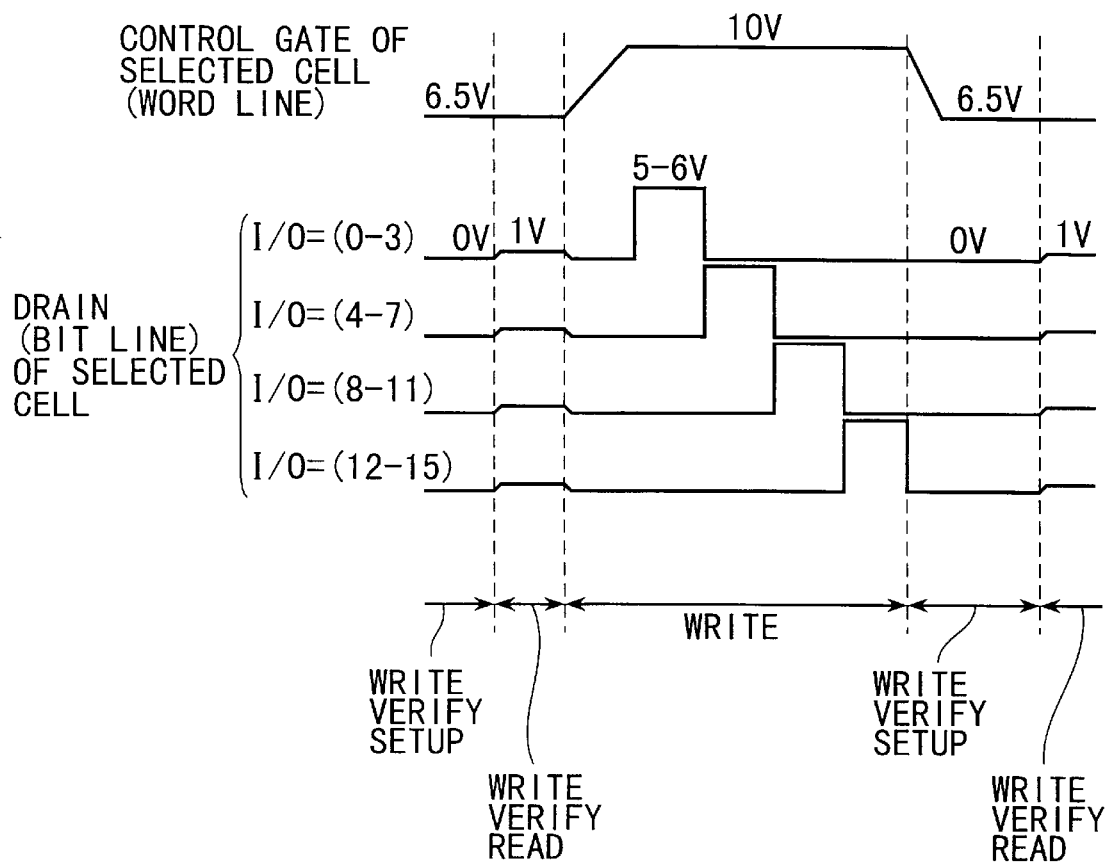

SEMICONDUCTOR STORAGE DEVICE WITH AUTOMATIC WRITE/ERASE FUNCTION

CROSS-REFERENCE TO RELATED APPLICATIONS

This application is a continuation-in-part application of U.S. Ser. No. 09/298,403, filed Apr. 23, 1999, NOW ABN. which application is hereby incorporated by reference in its entirety.

BACKGROUND OF THE INVENTION

The present invention relates to a semiconductor storage device which has an automatic write/erase function, and uses an external high voltage or a voltage obtained by boosting a power supply voltage upon write and erase.

A semiconductor storage device with an automatic write/erase function, e.g., a flash EEPROM, can write input data up to its internal predetermined threshold voltage in a memory cell designated by an input address by automatically discriminating the input data, upon reception of a command indicative of, e.g., a write mode. A memory cell which is written with data and has a high threshold voltage is defined by "0", and a memory cell with a low threshold voltage is defined by "1". This write function is similarly used in a pre-programming operation being performed during the erase mode.

FIG. 36 is a schematic block diagram showing the circuit arrangement of a conventional flash EEPROM with the automatic write function. Referring to FIG. 36, reference numeral 11 denotes a memory cell array. In this memory cell array 11, each row of memory cells is selected by a row decoder 12, and each column of memory cells is designated by a column decoder 13D via a Y selector 13S. An address signal is supplied to an address register 14, multiplexer 15, and command register 16. The output signal from the address register 14 is supplied to the multiplexer 15, and selection signals from the multiplexer 15 are supplied to the row and column decoders 12 and 13. Data in a memory cell selected by the row and column decoders 12 and 13 is supplied to, and sensed and amplified by a sense amplifier 17 via the Y selector 13S, and the amplified data is read out via an I/O buffer 18. On the other hand, write data input to the I/O buffer 18 is latched by a data register 19, and the data latched by the data register 19 is written in a memory cell selected by the row and column decoders 12 and 13 via a write data generation circuit 20 and write switch 21. The write data generation circuit 20 receives the output signal from the sense amplifier 17 and is controlled to generate write data.

The command register 16 receives a control signal and command, and its output signal is supplied to the data register 19 and a control circuit 22. The control circuit 22 controls the operation mode of the flash EEPROM and the like in accordance with the control signal and command supplied to the command register 16, and a timer 23, power supply circuit (booster circuit) 24, verify circuit 25, and the like are controlled by the output signal from the control circuit 22. The time measurement output of the timer 23 is supplied to the control circuit 22. The power supply circuit 24 shifts the level of a power supply voltage (i.e., boosts it), and supplies high voltages for write to the row and column decoders 12 and 13, write data generation circuit 20, write switch 21, and the like. The verify circuit 25 receives the output signal from the write data generation circuit 20, and supplies a verify result to the control circuit 22.

In the above arrangement, upon reception of a write command, the command register 16 recognizes a write mode, and data input to the I/O buffer 18 and an address signal are respectively held by the data register 19 and address register 14. The multiplexer 15 selects the address signal held by the address register 14, and supplies it to the row and column decoders 12 and 13. By respectively decoding row and column addresses by the row and column decoders 12 and 13, a memory cell corresponding to the input address is selected.

Upon reception of an establishment signal from the command register 16, the control circuit 22 begins to operate, and its internal control enters a write verify state. After an elapse of a setup time set in the timer 23, the control circuit 22 reads out data from the written memory cell and compares the readout data with input data. As a result of comparison, if the written data matches the readout data, it is determined that write is satisfactorily done, and write operation ends; otherwise, if the two data do not match, rewrite is started based on the written data (only bits that are "0" in the input data but "1" in the readout data are rewritten).

More specifically, as shown in the flow chart in FIG. 37A, when write verify is started, a write verify setup is made (step S1), and a write verify read is done (step S2) after an elapse of a power supply setup period around 1 $\mu$s. It is checked by comparison if the input data matches the readout data (step S3). If the two data match each other, a read setup is done (step S4), thus ending the process. On the other hand, if the two data do not match, it is checked if the number of rewrite cycles has reached a limit (step S5). If NO in step S5, the input data and inverted data of the readout data are ANDed to obtain write data (step S6). The input data, readout data, and write data in step S6 have a logic relationship shown in FIG. 37B. Subsequently, write is done (step S7). In this write operation, the voltage supplied to the memory cell is a high voltage obtained by boosting a power supply voltage $V_{DD}$ (e.g., 3V) by the power supply circuit 24. As shown in the timing chart in FIG. 38, for example, a voltage of 10V is applied to the control gate (word line) of a selected cell transistor, and a voltage around 5V to 6V is applied to its drain (bit line). The write method to this cell transistor is hot electron injection, and a drain current around 500 $\mu$A/bit is required. A write continues for a write time, e.g., about 5 $\mu$s, set in the timer 23. After that, the number of cycles is incremented by 1 (step S8), and the flow returns to step S1 to repeat the aforementioned write verify process until the input data matches the readout data. If the two data do not match even after the number of cycles has reached a predetermined limit, a defect is determined (step S9), and a read setup is done (step S4), thus ending the process.

Since all currents required in the above-mentioned write verify process are supplied from the power supply circuit (booster circuit) 24, currents obtained by multiplying currents consumed by memory cells by efficiency are required. Assuming that the output voltage of the power supply circuit 24 is constant, the booster efficiency lowers as the power supply voltage $V_{DD}$ boosted by the power supply circuit 24 is lower. Normally, the current supply performance of the power supply circuit 24 is nearly proportional to the area of the capacitor in the charge pump circuit in this circuit 24. Hence, when the power supply voltage $V_{DD}$ is lowered while the output voltage (boosted voltage) upon writing data in a memory cell remains the same, the area of the capacitor must be increased in correspondence with the current supply performance drop of the power supply circuit 24, resulting in an increase in chip area.

As described above, in the conventional semiconductor storage device which has the automatic write function and uses a high voltage obtained by boosting a power supply voltage upon write, if the power supply voltage drops, the current supply performance of the booster circuit that generates a high voltage for write lowers, resulting in a long write time.

When the lowered power supply voltage is designed to use, the area of the capacitor must be increased in correspondence with the current supply performance drop of the booster circuit, resulting in a large chip area.

On the other hand, in an electrically data rewritable flash EEPROM, data is erased in units of erase blocks. This process includes a series of operations such as pre-erase write (pre-programming) for setting all cells in a given block in a write state, batch-erase/over-erase verify processes of a block, and the like.

However, when automatic erase is done for a block which had been erased previously and has not undergone any write, i.e., a block which does not require any erase, a series of erase operations are similarly done for that block. That is, the same erase time as that for a block that actually requires erase is required. For this reason, when many blocks, i.e., all blocks in a chip, are to be erased, a maximum erase time is always required irrespective of the size of written data.

The pre-program time accounts for a large percentage of the actual erase time. Hence, in order to shorten the erase time as a whole, the pre-program time must be shortened. The reason why a long pre-program time is required is that a verify process is done for all cells before and after pre-programming.

Furthermore, when the power supply voltage is low (e.g., 1.8V), the number of bits to be written simultaneously may be reduced to prevent insufficient current supply performance of an internal booster circuit upon write, and one I/O may be divisionally written. In such case, a long pre-program time is also required.

BRIEF SUMMARY OF THE INVENTION

The present invention has been made in consideration of the above situation, and has as its object to provide a semiconductor storage device which can shorten write and erase times.

It is another object of the present invention to provide a semiconductor storage device which can lower the power supply voltage without increasing the chip area.

According to the present invention, a semiconductor storage device which has an automatic write function, and uses a potential obtained by boosting a power supply voltage upon write, comprises booster means for generating a high voltage for write by boosting the power supply voltage, write division control means for, upon writing data, divisionally making a write in a plurality of number of times by shifting selection timings of bit lines by selectively ON/OFF-controlling a bit line write switch that controls whether or not input data is supplied to a bit line, and write means for writing data by supplying the high voltage output from the booster means to a memory cell connected to the bit line selected by the write division control means.

With this arrangement, when the power supply voltage drops, the bit line selection timing is shifted by the write division control means to decrease the number of bits to be written simultaneously and to reduce the consumption current, thereby compensating for a current supply performance drop of the booster means and suppressing an increase in write time. Also, the power supply voltage can be lowered without increasing the chip area. Furthermore, since the number of bits to be written simultaneously can be increased to attain a wide range of power supply voltage and to shorten the write time in acceleration tests, an increase in write time can be prevented. Moreover, since a bit line is selected upon completion of boosting of a word line, variations of write characteristics can be reduced.

In one aspect of the present invention, selection times of bit lines divisionally selected in the plurality of number of times by the write division control means are substantially equal to each other. In this way, when the selection times of the bit lines are set to be equal to each other, variations of write characteristics can be reduced.

In another aspect of the present invention, the device further comprises power supply voltage detection means for detecting the power supply voltage of the booster means, and a control method is changed on the basis of a level of the power supply voltage detected by the power supply voltage detection means. In this way, when the control method is changed by detecting the power supply voltage, an optimal control method can be used in correspondence with the power supply voltage, thus shortening the write time and reducing the test cost.

In still another aspect of the present invention, the device further comprises power supply voltage detection means for detecting the power supply voltage of the booster means before data is written, and when the power supply voltage detected by the power supply voltage detection means has a low level, the number of divisions by the write division control means is increased, and when the detected power supply voltage has a high level, the number of divisions is decreased. In this way, when the number of divisions is changed by detecting the power supply voltage, an optimal control method can be used in correspondence with the power supply voltage, thus shortening the write time and reducing the test cost.

In still another aspect of the present invention, the device further comprises power supply voltage detection means for detecting the power supply voltage of the booster means, and the power supply voltage detection means detects a power supply voltage immediately after the beginning of an automatic write process, and when the detected power supply voltage has a low level, the number of divisions by the write division control means is increased, and when the detected power supply voltage has a high level, the number of divisions is decreased. In this manner, when the power supply voltage is detected immediately after automatic write, even when the power supply voltage has changed during write operation, an optimal control method can be used in correspondence with the power supply voltage, thus shortening the write time and reducing the test cost.

In still another aspect of the present invention, the device further comprises control data storage means for storing a control method data, and a control method is changed on the basis of the control method data stored in the control data storage means. In this fashion, when the control method is changed on the basis of the control method data stored in control data storage means, the write time can be shortened and the test cost can be reduced by an optimal write time, and the yield can be improved by trimming the write characteristics.

In still another aspect of the present invention, the control data storage means may comprise an EEPROM cell, which stores control data.

In still another aspect of the present invention, the device further comprises division number storage means for storing the number of divisions of the write division control means, and the number of divisions by the write division control means is changed on the basis of the number of divisions stored in the division number storage means. In this way, when the division method is changed on the basis of the number of divisions stored in the division number storage means, the write time can be shortened and the test cost can be reduced since the write time is optimized.

In still another aspect of the present invention, the division number storage means may comprise an EEPROM cell, which stores the number of divisions.

In still another aspect of the present invention, the write division control means controls the number of divisions on the basis of a test signal. When the number of divisions is controlled on the basis of a test signal, the write time can be shortened and the test cost can be reduced since the write time is optimized.

In still another aspect of the present invention, one or more bits of electrically rewritable memory cells (erase flags) for storing history information indicating if write has been made are assured in units of erase blocks of the flash memory.

Each erase flag is erased simultaneously when a block to which that flag belongs is erased, and is written simultaneously when write is made in the block to which that flag belongs. Hence, once write has been made in a block after erase, the erase flag is set in a write state until the block to which that flag belongs is erased. On the other hand, if no write is made, the erase flag remains in an erase state.

Upon erasing a block, the erase flag that belongs to the block is verified, and if that flag indicates a write history, a series of block erase operations are done; if the flag indicates an erase state, that block need not be erased, and block erase immediately comes to an end without any erase operations.

When a plurality of blocks are to be batch-erased, a block that does not require erase is excluded by verifying the erase flag, and only block that require erase are combined, thus erasing those blocks at the same time. In this manner, the number of times of actual erase operations can often be reduced.

The total erase time is shortened by shortening the verify time for pre-programming.

The erase time can be shortened by setting a cell gate voltage upon verify for pre-programming to be lower than a cell gate voltage upon verify for normal automatic program or write operation. This is because the pre-programming aims at preventing an unwritten cell from being over-erased by unwanted erase operation, and it does not write up to a threshold voltage that can be reliably read out in case of an already written cell. In this manner, even when a cell has a slightly low threshold voltage after pre-programming, the verify result is determined to be OK to avoid an identical cell from being verified and re-programmed more than once, thereby shortening the erase operation time. For the same reason as above, if a sequence which obviates the need for pre-programming of a cell that has undergone write, and omits verify operation itself after programming in pre-programming is used, the erase operation time can be further shortened.

Furthermore, if a sequence which also omits a verify process before pre-programming that checks if write is to be made, and unconditionally pre-programs an already written cell is set based on cell write characteristics in which the increase in threshold voltage is small in an already written cell, the erase operation time can also be shortened.

When an external high voltage input function is provided, the number of bits to be written simultaneously in pre-programming is changed to increase, thus shortening the erase time.

A high-voltage input terminal and power supply voltage terminal are independently provided to change the sequence so that when no high voltage is input to the high-voltage input terminal, a power supply voltage is boosted to generate a high voltage for write; when the high voltage is input, the voltage at the high-voltage input terminal is detected and directly used as a high voltage for write.

For example, when the power supply voltage is low (e.g., 1.8V) and is boosted to be used as a high voltage for write, since that booster device has insufficient current supply performance, a method of controlling the number of bits to be written simultaneously in a cell and dividing one I/O into a plurality of I/Os is used. However, when the high-voltage input terminal directly supplies a high voltage for write, the I/O need not be divided. Upon detecting the input high voltage, a supply source of the high voltage for write is switched from the internal booster device to the high-voltage input terminal, and the number of divisions in pre-programming upon automatic erase is changed to 1. In this manner, the erase time can be shortened.

This scheme can also be applied to an automatic write function.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 14B is a table showing the relationship among the input data, readout data, and write data in the flow chart shown in FIG. 14A;

FIG. 15 is a timing chart for explaining the write verify process in the flash EEPROM with the automatic write function in the flow chart shown in FIG. 14A;

DETAILED DESCRIPTION OF THE INVENTION

The preferred embodiments of the present invention will be described hereinafter with reference to the accompanying drawings.

First Embodiment

Figure 1:
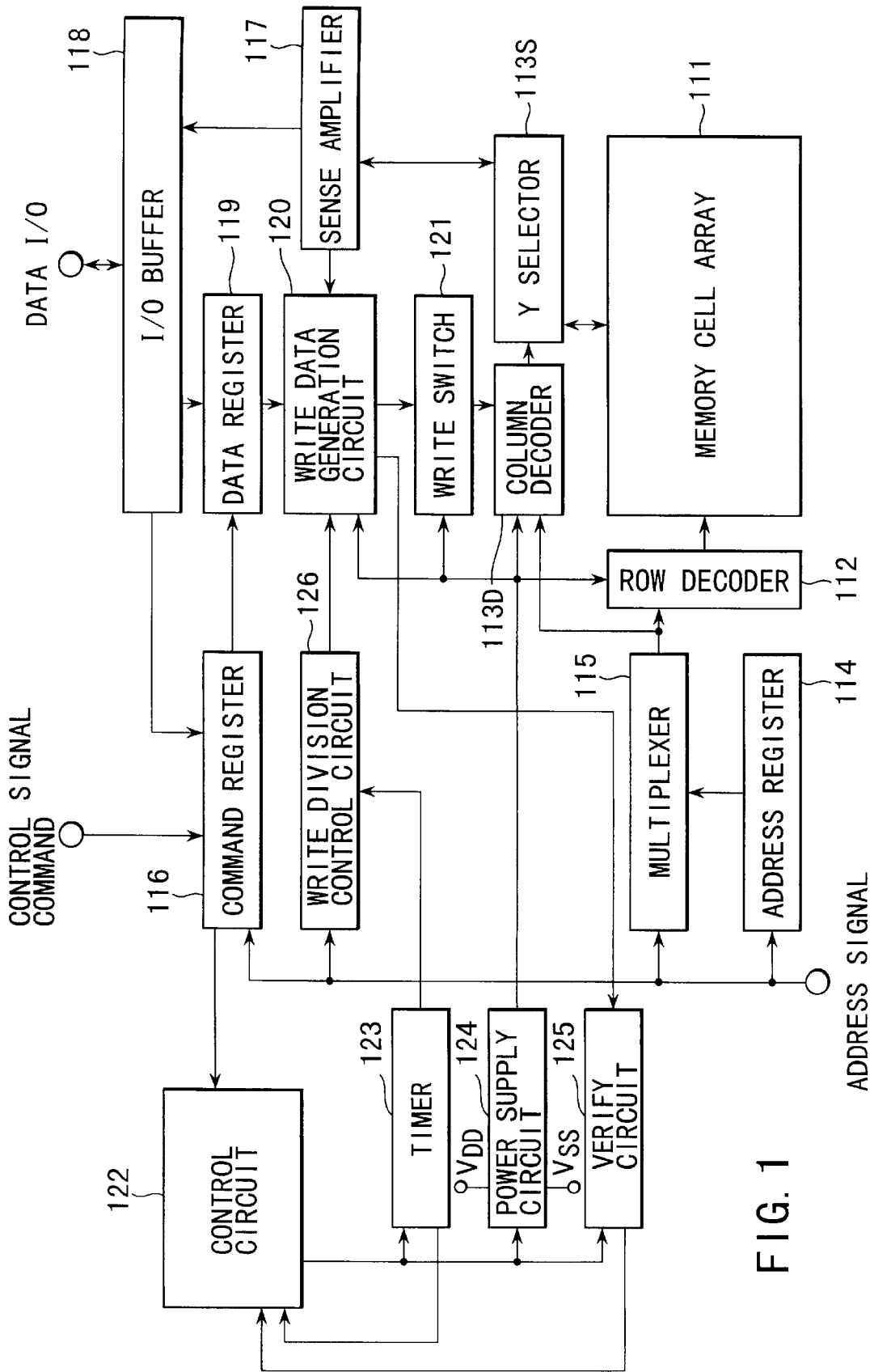
FIG. 1 is a schematic block diagram showing the circuit arrangement of a flash EEPROM with an automatic write function, as a semiconductor storage device according to the first embodiment of the present invention.

FIG. 1 is a schematic block diagram showing the circuit arrangement of a flash EEPROM with an automatic write function to explain a semiconductor storage device according to the first embodiment of the present invention. In a memory cell array 111, each row of memory cells is selected by a row decoder 112, and each column of memory cells is selected by a column decoder 113D via a Y selector 113S. An address signal is supplied to an address register 114, multiplexer 115, write division control circuit 126, and command register 116. The output signal from the address register 114 is supplied to the multiplexer 115, and the address signal selected by the multiplexer 115 is supplied to the row and column decoders 112 and 113D. Data in a memory cell selected by the row and column decoders 112 and 113D is supplied to, and sensed and amplified by a sense amplifier 117 via the Y selector 113S, and the amplified data is read out via an I/O buffer 118. On the other hand, write data input to the I/O buffer 118 is supplied to and latched by a data register 119, and the data latched by the data register 119 is written in a memory cell selected by the row and column decoders 112 and 113D via a write data generation circuit 120 and write switch 121. The write data generation circuit 120 receives the output signal from the sense amplifier 117 to control write data generation.

The command register 116 receives a control signal and command, and the output signal from the command register 116 is supplied to the data register 119 and a control circuit 122. The control circuit 122 controls the operation mode of the flash EEPROM and the like in accordance with the control signal and command supplied to the command register 116, and a timer 123, power supply circuit (booster circuit) 124 connected between power supply terminals $V_{DD}$ and $D_{SS}$, verify circuit 125, and the like are controlled by the output signal from the control circuit 122. The timing output of the timer 123 is supplied to the write division control circuit 126 and control circuit 122. The output signal from the write division control circuit 126 is supplied to the write data generation circuit 120. The power supply circuit 124 comprises a booster circuit, which shifts the level of a power supply voltage (i.e., boosts it) supplied from the power supply terminals $V_{DD}$ and $D_{SS}$, and supplies high voltages for write to the row and column decoders 112 and 113D, write data generation circuit 120, write switch 121, and the like. The verify circuit 125 receives the output signal from the write data generation circuit 120, and supplies a verify result to the control circuit 122.

Figure 2:
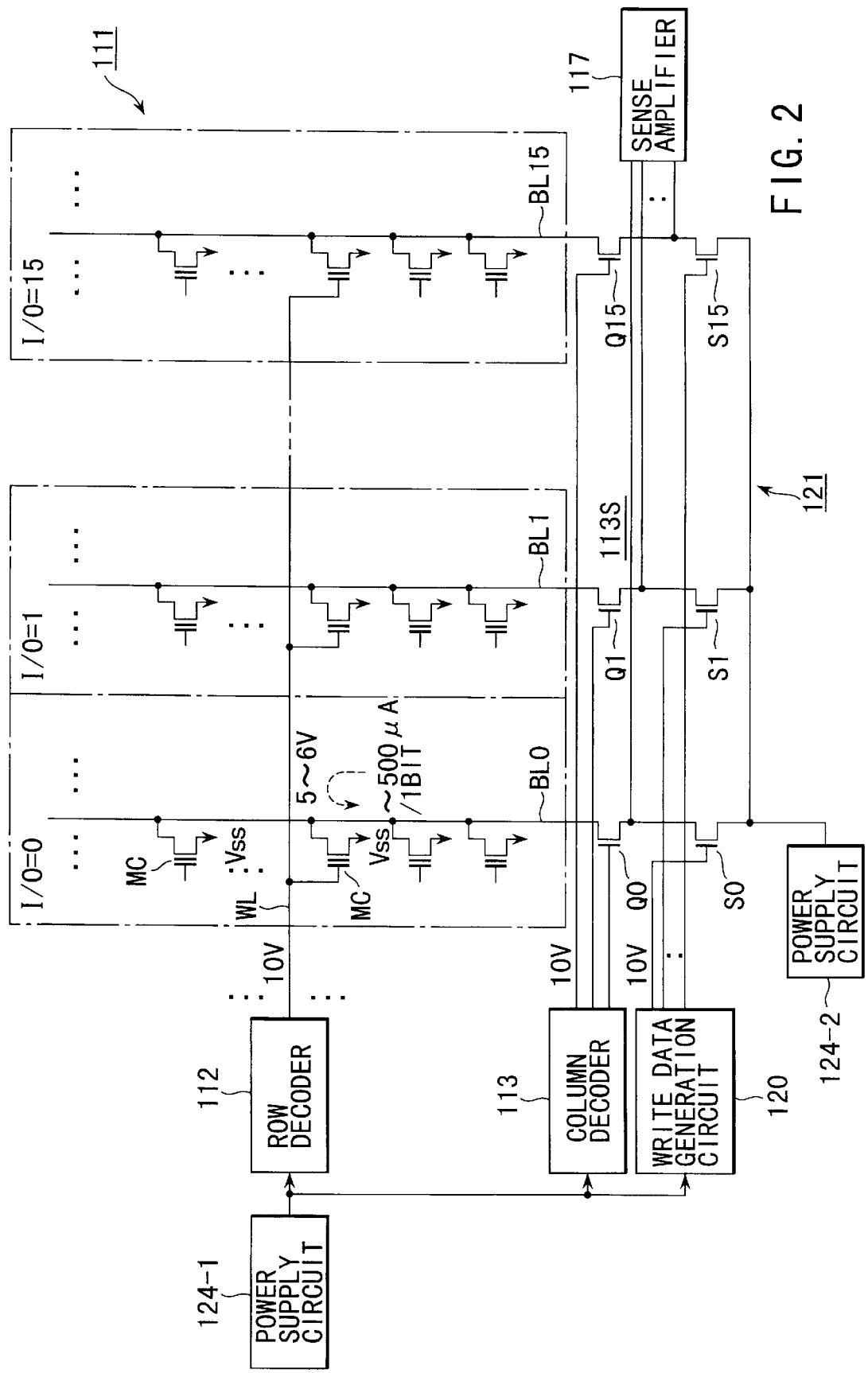
FIG. 2 is a circuit diagram showing principal part directly related to the present invention in the flash EEPROM shown in FIG. 1, i.e., showing the detailed circuit arrangement of some circuits such as a memory cell array, row decoder, column decoder, sense amplifier, write data generation circuit, write switch, and power supply circuit in the circuit shown in FIG. 1.

FIG. 2 shows principal part directly related to the present invention in the flash EEPROM shown in FIG. 1, i.e., the detailed circuit arrangements of some circuits such as the memory cell array 111, row and column decoders 112 and 113D, Y selector 113S, sense amplifier 117, write data generation circuit 120, write switch 121, and power supply circuit 124 in the circuit shown in FIG. 1. Power supply circuits 124-1 and 124-2 of FIG. 2 correspond to the power supply circuit 124 in the circuit shown in FIG. 1, and charge pump circuits are arranged in these power supply circuits 124-1 and 124-2. The output voltage from the power supply circuit 124-1 is supplied to the row and column decoders 112 and 113D, and the write data generation circuit 120. As a result, the output voltages of the row and column decoders 112 and 113D and Y selector 113S, and the write data control circuit 120 are high voltages, e.g., 10V, upon writing data. A high voltage output from the power supply circuit 124-2 is supplied to one end of a current path of MOS transistors S0 to S15 that construct the write switch 121. The gates of these MOS transistors S0 to S15 receive the output signal from the write data generation circuit 120 and are selectively ON/OFF-controlled. Column selection transistors Q0 to Q15 of the Y selector 113S are inserted between the MOS transistors S0 to S15 and bit lines BL0 to BL15, and are selectively ON/OFF-controlled by the output signal from the column decoder 113D. The input terminal of the sense amplifier 117 is connected to the nodes between the MOS transistors S0 to S15 and column selection transistors Q0 to Q15, and data read out from a given memory cell onto a bit line is supplied to that input terminal via a corresponding column selection transistor. Memory cells (EEPROM cells) MC, . . . are connected between the bit lines BL0 to BL15 and ground point $V_{SS}$, and word lines are connected to the control gates of the memory cells MC, . . . in units of rows. The memory cell array 111 has a 16-bit configuration, i.e., I/Os 0 to 15.

Figure 3:
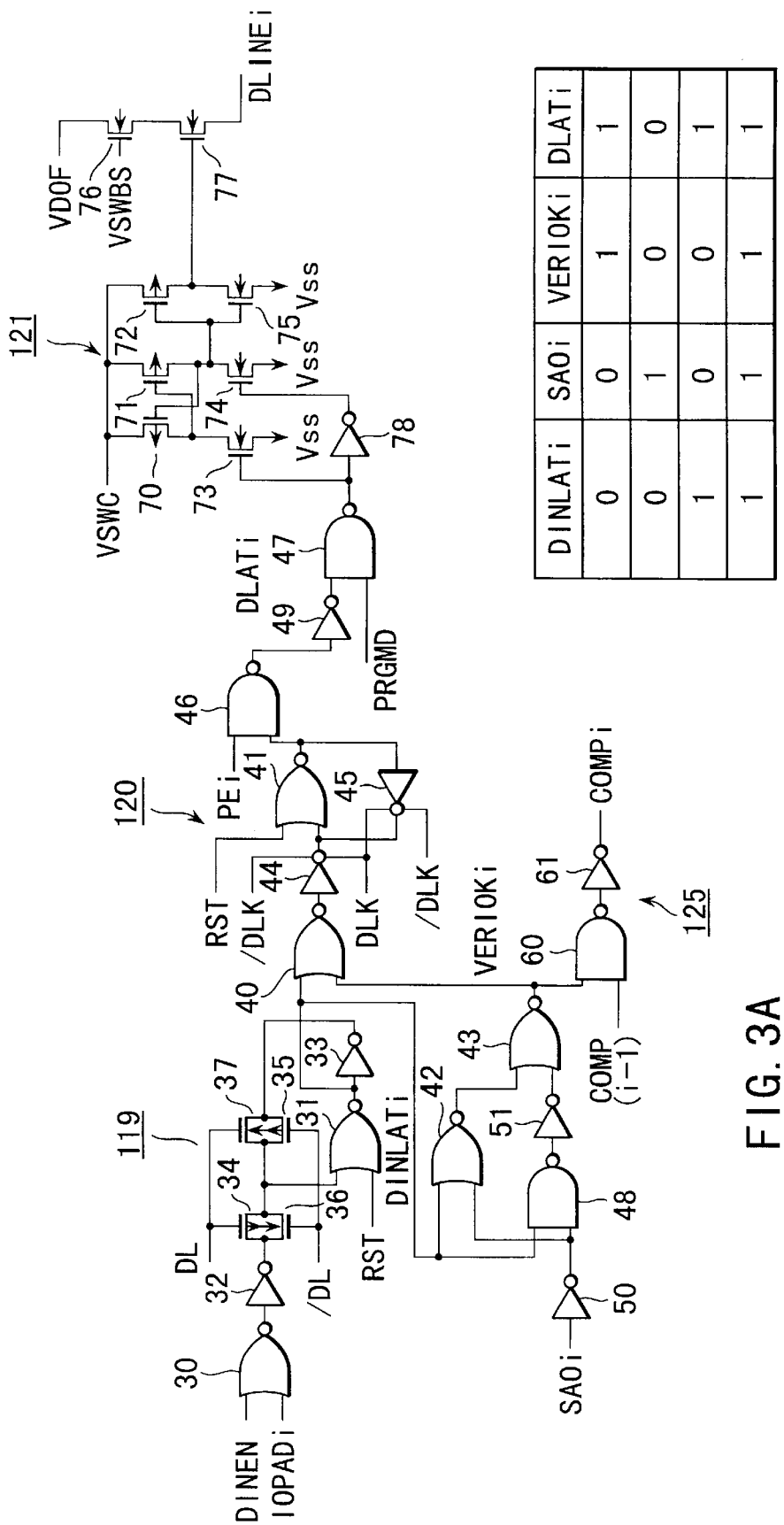
FIG. 3A is a circuit diagram showing the detailed arrangement of a data register, the write data generation circuit, and the write switch in the circuit shown in FIGS. 1 and 2, paying attention to the i-th bit.
FIG. 3B is a table showing the logic levels of signals in the circuit shown in FIG. 3A.

FIG. 3A shows the detailed arrangement of the data register 119, write data generation circuit 120, verify circuit 125, and write switch 121 in the circuit shown in FIGS. 1 and 2, paying attention to the i-th bit. The data register 119 comprises NOR gates 30 and 31, inverters 32 and 33 connected at the output of the NOR gates 30 and 31, p-MOS transistors 34 and 35 serially connected between outputs of the inverters 32 and 33, and n-MOS transistors 36 and 37 connected in parallel with the p-MOS transistors 34 and 35, respectively. One input terminal of the NOR gate 30 receives an operation control signal DINEN from the command register 116, and its other input terminal receives I/O data IOPADi of the i-th bit from the I/O buffer 118. The output signal from the NOR gate 30 is supplied to one end of the current path of the MOS transistors 34 and 36 via the inverter 32. One input end of the current path of the MOS transistors 35 and 37 and one input terminal of the NOR gate 31 are connected to the other end of the current path of these MOS transistors 34 and 36. The other input terminal of the NOR gate 31 receives a reset signal RST from a power ON reset circuit (not shown), and the output signal from the NOR gate 31 is supplied to the other end of the current path of the MOS transistors 35 and 37 via the inverter 33. The gates of the MOS transistors 34 and 37 receive a data latch signal DL from the control circuit 122, and the gates of the MOS transistors 35 and 36 receive an inverted signal /DL of the data latch signal DL.

The write data generation circuit 120 comprises NOR gates 40 to 43, clocked inverters 44 and 45 connected at the output side of the NOR gates 40 and 41, respectively, NAND gates 46 to 48, inverters 49 to 51 respectively connected at one input of the NAND gates 47 and 48 and at one input of the NOR gate 43, and the like. An output signal DINLATi from the NOR gate 31 in the data register 119 is supplied to one input terminal of each of the NOR gates 40 and 42, and one input terminal of the NAND gate 48. An output signal SAOi of the i-th bit of the sense amplifier 117 is supplied to the other input terminal of the NAND gate 48 and the other input terminal of the NOR gate 42 via the inverter 50. The output signal from the NAND gate 48 is supplied to one input terminal of the NOR gate 43 via the inverter 51, and the output signal from the NOR gate 42 is supplied to the other input terminal of the NOR gate 43. An output signal VERIOKi from the NOR gate 43 is supplied to the other input terminal of the NOR gate 40 and to one input terminal of the NAND gate 60. The output signal from this NOR gate 40 is supplied to the input terminal of the clocked inverter 44, and the output signal from this clocked inverter 44 is supplied to one input terminal of the NOR gate 41. The other input terminal of the NOR gate 41 receives the reset signal RST, and the output signal of the NOR gate 41 is supplied to the input terminal of the clocked inverter 45 and one input terminal of the NAND gate 46. The clocked inverters 44 and 45 operate in response to a data latch clock DLK and its inverted signal /DLK supplied from the control circuit 22.

The other input terminal of the NAND gate 46 receives a division control signal PEi of the i-th bit output from the write division control circuit 126. A data latch signal DLATi of the i-th bit output from the NAND gate 46 is supplied to one input terminal of the NAND gate 47 via the inverter 49. The other input terminal of the NAND gate 47 receives a signal PRGMD indicating a write mode, which is output from the control circuit 122.

The verify circuit 125 comprises a NAND gate 60 and inverter 61 connected at the output terminal of the gate 60. One input terminal of the NAND gate 60 receives the output signal VERIOKi from the NOR gate 43, and the other input terminal receives an "i-1"-th bit output signal COMP(i-1) of the verify circuit. The output signal from this NAND gate 60 is supplied to the control circuit 122 via the inverter 61 as a comparison result signal COMPi.

The write switch 121 comprises p-MOS transistors 70 to 72, n-MOS transistors 73 to 77, and an inverter 78. A boosted voltage VSWC around 10V supplied from the power supply circuit 124 is applied to one end of the current path of the MOS transistors 70, 71, and 72. The other end of the current path of the MOS transistor 70 is connected to one end of the current path of the MOS transistor 73, and the gate of the MOS transistor 71. The other end of the current path of the MOS transistor 71 is connected to one end of the current path of the MOS transistor 74 and the gate of the MOS transistor 70. The other end of the current path of the MOS transistors 73 and 74 is connected to ground point $V_{SS}$. The output signal from the NAND gate 47 in the write data generation circuit 120 is supplied to the gate of the MOS transistor 73 and the input terminal of the inverter 78. The output signal from this inverter 78 is supplied to the gate of the MOS transistor 74. The other end of the current path of the MOS transistor 72 is connected to one end of the current path of the MOS transistor 75, and the other end of the current path of the MOS transistor 75 is connected to the ground point $V_{SS}$. The gates of these MOS transistors 72 and 75 are commonly connected to the node of the current path of the MOS transistors 71 and 74 to construct a CMOS inverter. A boosted potential VDOF around 8V output from the power supply circuit 124 is applied to one end of the current path of the MOS transistor 76, and a boosted potential VSWBS is applied to its gate. The boosted potential VSWBS is "6V+threshold voltage of MOS transistor 76". One end of the current path of the MOS transistor 77 is connected to the other end of the current path of the MOS transistor 76, and the gate of the MOS transistor 77 is connected to the node of the current path of the MOS transistors 72 and 75. A potential DLINEi at the other end of the current path of the MOS transistor 77 is supplied to the drain of the selected cell transistor.

The signals DINLATi, SAOi, VERIOKi, and DLATi in the circuit shown in FIG. 3A have a logic relationship shown in FIG. 3B. More specifically, when the signal DINLATi output from the NOR gate 31 matches the output signal SAOi of the sense amplifier, the signal VERIOKi changes to level "", which indicates that the input data matches the readout data. The output signal DLATi from the NAND gate 46 changes to level "1" when the signals DINLATi and SAOi match each other, and also changes to level "1" to control the write switch 121 for rewrite when the input data and readout data do not match and the input data is at level "1".

Figures 4, 5B:
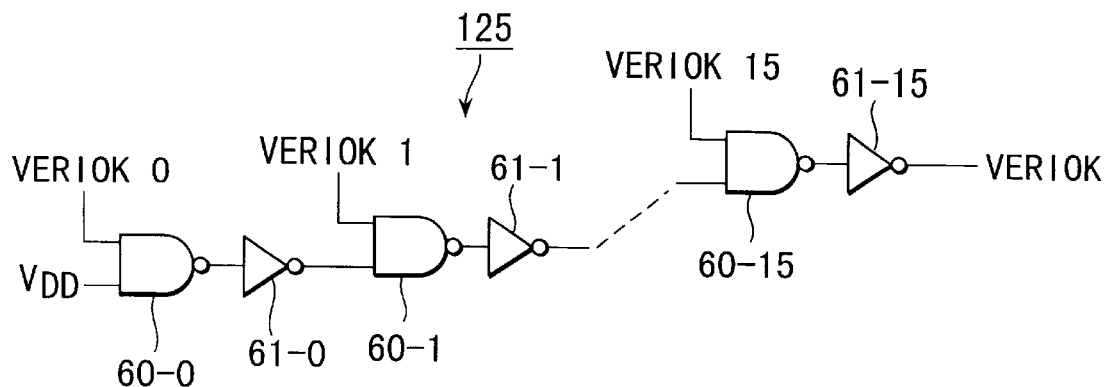
FIG. 4 is a circuit diagram showing the overall arrangement of a verify circuit shown in FIG. 3A.
FIG. 5B is a table for explaining the operation of the circuit shown in FIG. 5A.

FIG. 4 shows the overall circuit (for 16 bits) of the verify circuit 125 shown in FIG. 3A. Signals VERIOK0 to VERIOK15 of the 0th to 15th bits supplied from the data generation circuit 120 are respectively supplied to one input terminal of each of NAND gates 60-0 to 60-15. The other input terminal of the first NAND gate 60-0 receives the power supply voltage $V_{DD}$ as fixed data of level "1", and the output signal from this NAND gate 60-0 is supplied to the other input terminal of the NAND gate 60-1 via an inverter 61-0.

Likewise, the output signals from the NAND gates 60-1 to 60-15 are supplied to the next NAND gates via inverters 61-0 to 61-14, and a matching signal VERIOK is obtained from the last inverter 61-15. The matching signal VERIOK changes to level "1" when all the signals VERIOK0 to VERIOK15 of 16 bits match the input data.

Figure 5A:
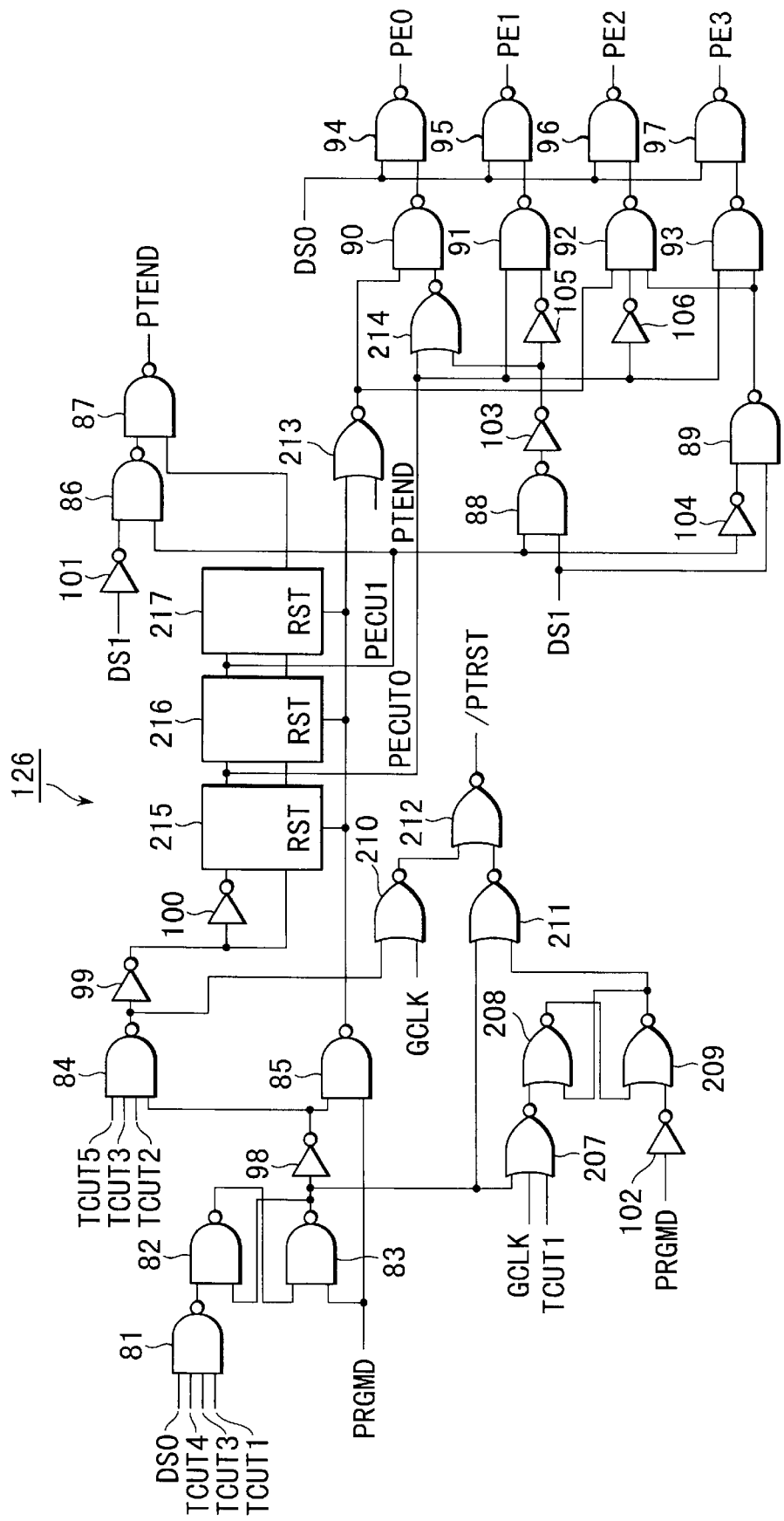
FIG. 5A is a circuit diagram showing the detailed arrangement of a write division control circuit in the circuit shown in FIG. 1.

FIG. 5A is a circuit diagram showing the detailed arrangement of the write division control circuit 126 in the circuit shown in FIG. 1. This circuit includes NAND gates 81 to 97, inverters 98 to 106, NOR gates 207 to 214, and binary counters 215 to 217. The first input terminal of the NAND gate 81 receives a signal DSO, and the second to fourth input terminals thereof respectively receive output signals TCUT4, TCUT3, and TCUT1 from the timer 123. The output from the NAND gate 81 is supplied to one input terminal of the NAND gate 82, whose output signal is supplied to one input terminal of the NAND gate 83. The other input terminal of the NAND gate 83 receives a signal PRGMD indicating a write mode, which is output from the control circuit 122, and the output signal of the NAND gate 83 is supplied to the other input terminal of the NAND gate 82, the input terminal of the inverter 98, the first input terminal of the NOR gate 207, and one input terminal of the NOR gate 211. The output signal from the inverter 98 is supplied to the first input terminal of the NAND gate 84, and one input terminal of the NAND gate 85. The other input terminal of the NAND gate 85 receives the signal PRGMD. The second to fourth input terminals of the NAND gate 84 respectively receive output signals TCUT5, TCUT3, and TCUT2 from the timer 123, and the output signal of the NAND gate 84 is supplied to one input terminal of each of the inverter 99 and NOR gate 110. The other input terminal of the NOR gate 210 receives an output signal GCLK from the timer 123, and the output signal of this NOR gate 210 is supplied to one input terminal of the NOR gate 212. The second input terminal of the NOR gate 207 receives the output signal GCLK from the timer 123, and the third input terminal thereof receives the output signal TCUT1 from the timer 123. The output signal from the NOR gate 207 is supplied to one input terminal of the NOR gate 208. The output signal from the NOR gate 208 is supplied to one input terminal of the NOR gate 209. The other input terminal of the NOR gate 209 receives the signal PRGMD via the inverter 102, and the output signal of the NOR gate 209 is supplied to the other input terminal of the NOR gate 208 and the other input terminal of the NOR gate 211. The output signal from the NOR gate 211 is supplied to the other input terminal of the NOR gate 212, which outputs a signal /PTRST.

The output signal of the inverter 99 is supplied to an input terminal /CI1 of the binary counter 215, and is also supplied to an input terminal CI1 via the inverter 100. Output terminals CI and /CI of the binary counter 215 are respectively connected to input terminals CI1 and /CI1 of the binary counter 216, whose output terminals CI and /CI are respectively connected to input terminals CI1 and /CI1 of the binary counter 217. Reset input terminals RST of the binary counters 215 to 217 receive the output signal from the NAND gate 85. An output signal PECUT0 output from the output terminal CI of the binary counter 215 is supplied to one input terminal of the NOR gate 214, one input terminal of each of the NAND gates 91 and 93, and the input terminal of the inverter 106. An output signal PECUT1 output from the output terminal CI of the binary counter 216 is supplied to one input terminal of each of the NAND gates 86 and 88, and the input terminal of the inverter 104. An output signal /PECUT2 output from the output terminal /CI of the binary counter 217 is supplied to one input terminal of the NAND gate 87. The other input terminal of the NAND gate 86 receives a signal DS1 via the inverter 101, and the output signal of this NAND gate 86 is supplied to the other input terminal of the NAND gate 87. The NAND gate 87 outputs a signal PTEND.

One input terminal of the NOR gate 213 receives the output signal from the NAND gate 85, and the other input terminal thereof receives the output signal PTEND from the NAND gate 87. The output signal from this NOR gate 213 is supplied to one input terminal of each of the NAND gates 90 and 92. The other input terminal of the NAND gate 88 receives the signal DS1, and the output signal of the NAND gate 88 is supplied to the other input terminal of the NOR gate 214 and the input terminal of the inverter 105 via the inverter 103. The 34 output signal from the inverter 104 is supplied to the other input terminal of the NAND gate 89, whose output signal is supplied the other input terminal of the NAND gate 93, and the second input terminal of the NAND gate 92. The output signal from the inverter 105 is supplied to the other input terminal of the NAND gate 91, and the output signal from the inverter 106 is supplied to the third input terminal of the NAND gate 92. The output signals from the NAND gates 90 to 93 are respectively supplied to one input terminal of each of the NAND gates 94 to 97, and the other input terminal of each of these NAND gates 94 to 97 receives the signal DS0. Write data PE0 to PE4 are then output from the output terminals of the NAND gates 94 to 97. The write data PE0 is supplied to the I/Os 0 to 3, the write data PE1 to the I/Os 8 to 11, the write data PE2 to the I/Os 4 to 7, and the write data PE3 to the I/Os 12 to 15.

FIG. 5B shows the relationship between the signals DS0 and DS1, and the division schemes in the circuit shown in FIG. 5A. When a signal DS0 of level "0" and a signal DS1 of level "0" are input, no division is done, and a 16-bit batch selection mode is set. Also, when a signal DS0 of level "0" and a signal DS1 of level "1" are input, no division is done, and a 16-bit batch selection mode is set. By contrast, when a signal DS0 of level "1" and a signal DS1 of level "0" are input, a 2-division mode is set, and selection is made in units of 8 bits. Furthermore, when a signal DS0 of level "1" and a signal DS1 of level "1" are input, a 4-division mode is set, and selection is made in units of 4 bits.

Figure 6:
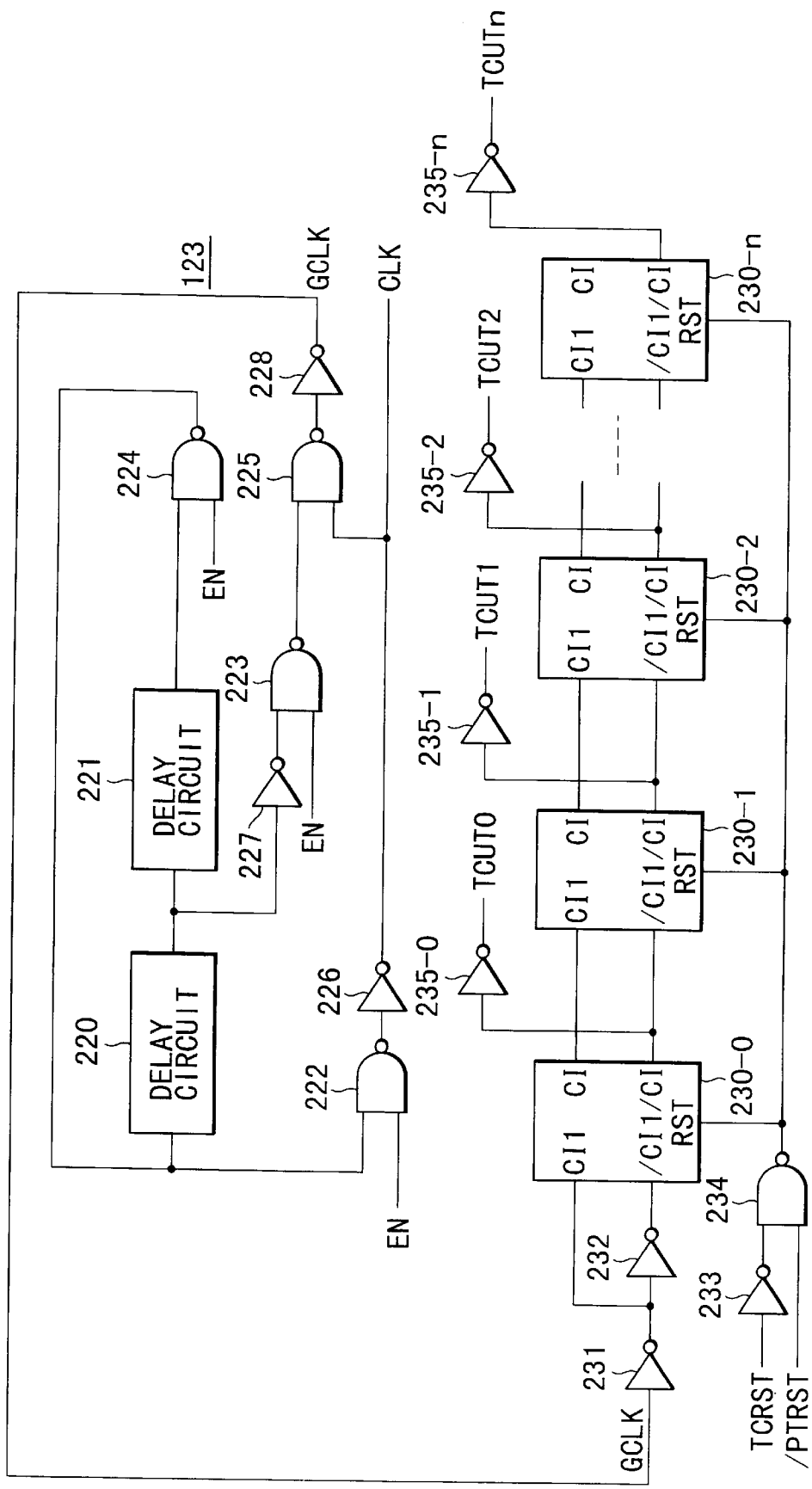
FIG. 6 is a circuit diagram showing the detailed arrangement of a timer in the circuit shown in FIG. 1.

FIG. 6 is a circuit diagram showing the detailed arrangement of the timer 123 in the circuit shown in FIG. 1. The timer 123 comprises delay circuits 220 and 221, NAND gates 222 to 225, inverters 226 to 228, binary counters 230-0 to 230-n, inverters 231 to 233 and 235-0 to 235-n, and a NAND gate 234. One input terminal of the NAND gate 222 receives an enable signal EN from the control circuit 122, and the output signal of the NAND gate 222 is supplied to one input terminal of the NAND gate 225 via the inverter 226 as a clock signal CLK. The output signal from the delay circuit 220 is supplied to the delay circuit 221, and is also supplied to one input terminal of the NAND gate 223 via the inverter 227. The output signal of the delay circuit 221 is supplied to one input terminal of the NAND gate 224, the other input terminal of which receives the enable signal EN. The output signal of the NAND gate 224 is supplied to the input terminal of the delay circuit 220, and the other input terminal of the NAND gate 222. The output signal of the NAND gate 223 is supplied to the other input terminal of the NAND gate 225, whose output signal is supplied to the input terminal of the inverter 231 via the inverter 228 as the clock signal GCLK. The output signal of the inverter 231 is supplied to an input terminal CI1 of the binary counter 230-1, and is also supplied to an input terminal /CI1 via the inverter 232. Output terminals CI and /CI of the binary counters 230-0 to 230-n are respectively supplied to input terminals CI1 and /CI1 of their respective neighboring binary counters, and signals from the output terminals /CI of the binary counters 230-0 to 230-n are supplied to the write division control circuit 126 shown in FIG. 5A via the inverters 235-0 to 235-n as the signals TCUT0 to TCUTn. One input terminal of the NAND gate 234 receives a signal TCRST via the inverter 233, and the other input terminal thereof receives an output signal /PTRST from the write division control circuit 126.

The signal TCRST is used for detecting a status change, and resetting the timer 123, and the output signal from the NAND gate 234 is supplied to reset input terminals RST of the binary counters 230-0 to 230-n to reset the timer 123.

Figure 7A:
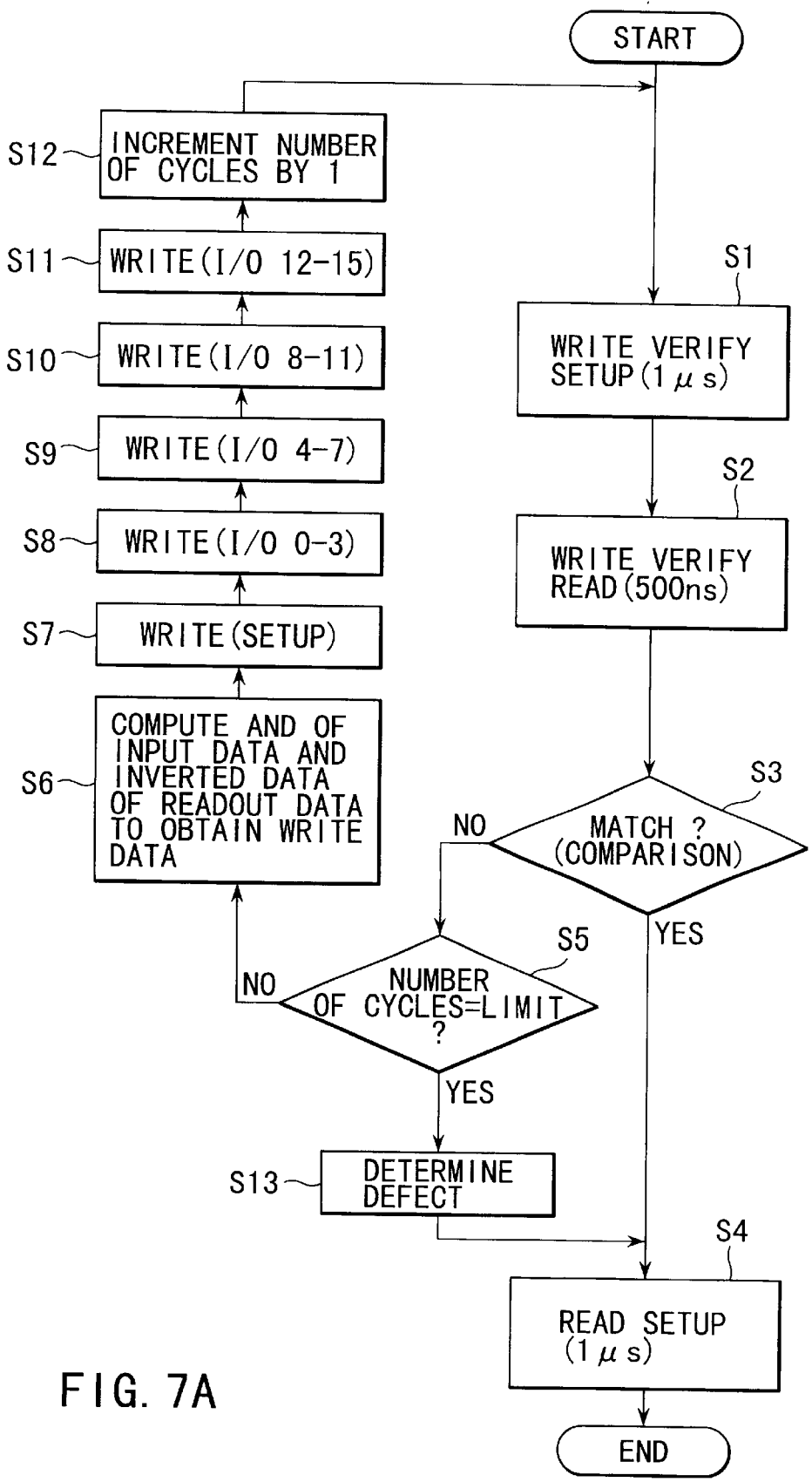
FIG. 7A is a flow chart showing a write verify process in verify processes of the flash EEPROM shown in FIGS. 1 to 6.
Figures 7B, 8:
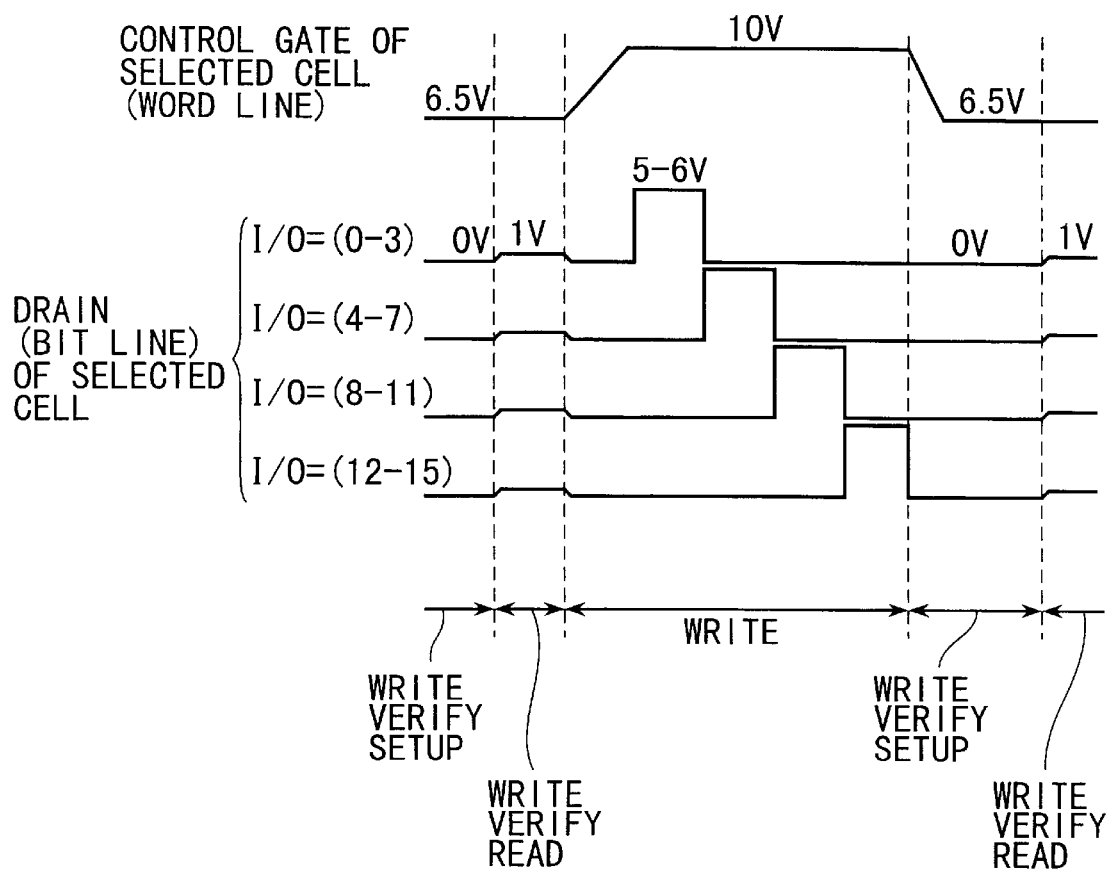
FIG. 7B is a table showing the relationship among the input data, readout data, and write data.
FIG. 8 is a timing chart for explaining verify processes of the flash EEPROM shown in FIGS. 1 to 6.

FIGS. 7A and 7B, and FIG. 8 are views for explaining a write verify process in the flash EEPROM shown in FIGS. 1 to 6. FIG. 7A is a flow chart showing the write verify process, FIG. 7B shows the logic relationship among the input data, readout data, and write data, and FIG. 8 is a timing chart of the process.

As shown in the flow chart in FIG. 7A, when the write verify process is started, a write verify setup is made (step S1), and a write verify read is done after an elapse of a power supply setup period around 1 $\mu$s (step S2). It is checked by comparison if the input data matches the readout data (step S3). If the two data match each other, a read setup is done (step S4), thus ending the process. On the other hand, if the two data do not match, it is checked if the number of rewrite cycles has reached a limit (step S5). If NO in step S5, the input data and inverted data of the readout data are ANDed to obtain write data (step S6). The input data, readout data, and write data in step S6 have a logic relationship shown in FIG. 7B. Subsequently, a write setup is done (step S7). After that, 4-bit data is written in the I/Os 0 to 3 in the memory cell array (step S8), next 4-bit data in the I/Os 4 to 7 (step S9), still next 4-bit data in the I/Os 8 to 11 (step S10), and last 4-bit data in the I/Os 12 to 15 (step S11). In the writes in steps S8 to S11, a voltage supplied to the memory cells is a high voltage generated by boosting the power supply voltage $V_{DD}$ (e.g., 3V). As shown in the timing chart in FIG. 8, for example, a voltage of 10V is applied to the control gate (word line) of the selected cell transistor, and a voltage of 5 to 6V is applied to its drain (bit line). The write method to this cell transistor is hot electron injection, and requires a drain current around 500 $\mu$A/bit. The write continues for a write time (e.g., about 5 $\mu$s) set in the timer 123. After that, the number of cycles is incremented by 1 (step S12), and the flow returns to step S1 to repeat the aforementioned write verify process until the input data matches the readout data. If the two data do not match even after the number of cycles has reached a predetermined limit, a defect is determined (step S13), and a read setup is done (step S4), thus ending the process.

In the first embodiment, since 16 bits are batch-selected or divided into two or four groups depending on the levels of the signals DS0 and DS1, and the number of memory cells that undergo a write is selectively switched to 16, 8, or 4, thus reducing the consumption current of the power supply circuit (booster circuit) 24. Hence, when the power supply voltage lowers, the number of divisions is increased to minimize the pattern occupation area of the booster circuit in the power supply circuit. In this case, in order to prevent the first and last selected memory cells from having a write characteristic difference, the selection timing of a bit line is set after completion of boosting of the gate voltage, and the selection time per bit line is made constant, thus reducing variations of write characteristics depending on the I/Os. Therefore, a low power supply voltage can be used without increasing the chip area.

In the first embodiment described above, the number of divisions is switched using the signals DS0 and DS1. Alternatively, fixed-level potentials may be input as these signals, and a circuit arrangement that does not switch the number of divisions may be provided. In the above description, the memory cell array 111 is divided into two or four groups, but may be divided into eight groups, 16 groups, and the like as needed.

Second Embodiment

Figure 9:
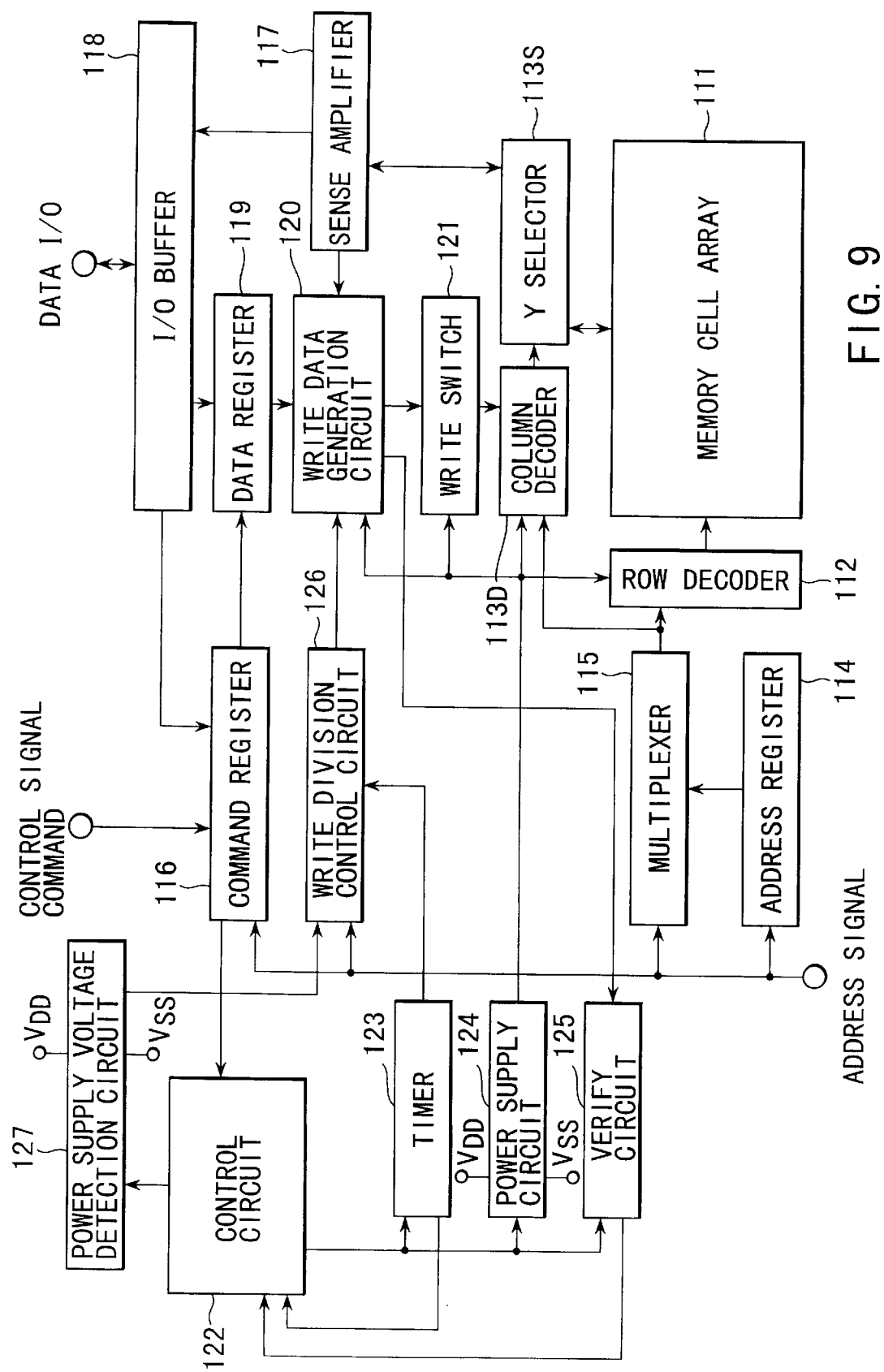
FIG. 9 is a schematic block diagram showing the circuit arrangement of a flash EEPROM with an automatic write function as a semiconductor storage device according to the second embodiment of the present invention.

FIG. 9 is a schematic block diagram showing the circuit arrangement of a flash EEPROM with an automatic write function so as to explain a semiconductor storage device according to the second embodiment of the present invention. In the second embodiment, a power supply voltage detection circuit 127 is added to the circuit arrangement shown in FIG. 1, and the operation of the write division control circuit 126 is controlled in accordance with the detection result of the power supply voltage detection circuit 127. More specifically, at the beginning of an automatic write process, the power supply voltage detection circuit 127 detects the power supply voltage $V_{DD}$, and holds detection signals A and B. According to the levels of these signals A and B (i.e., according to the power supply voltage levels), one of a no-division mode ($V_{DD}$=high level), a two-division mode ($V_{DD}$=middle level), and a four-division mode ($V_{DD}$ low level) is selected. The same reference numerals in FIG. 9 denote the same parts as those in FIG. 1, and a detailed description thereof will be omitted.

Figures 10A, 10B:
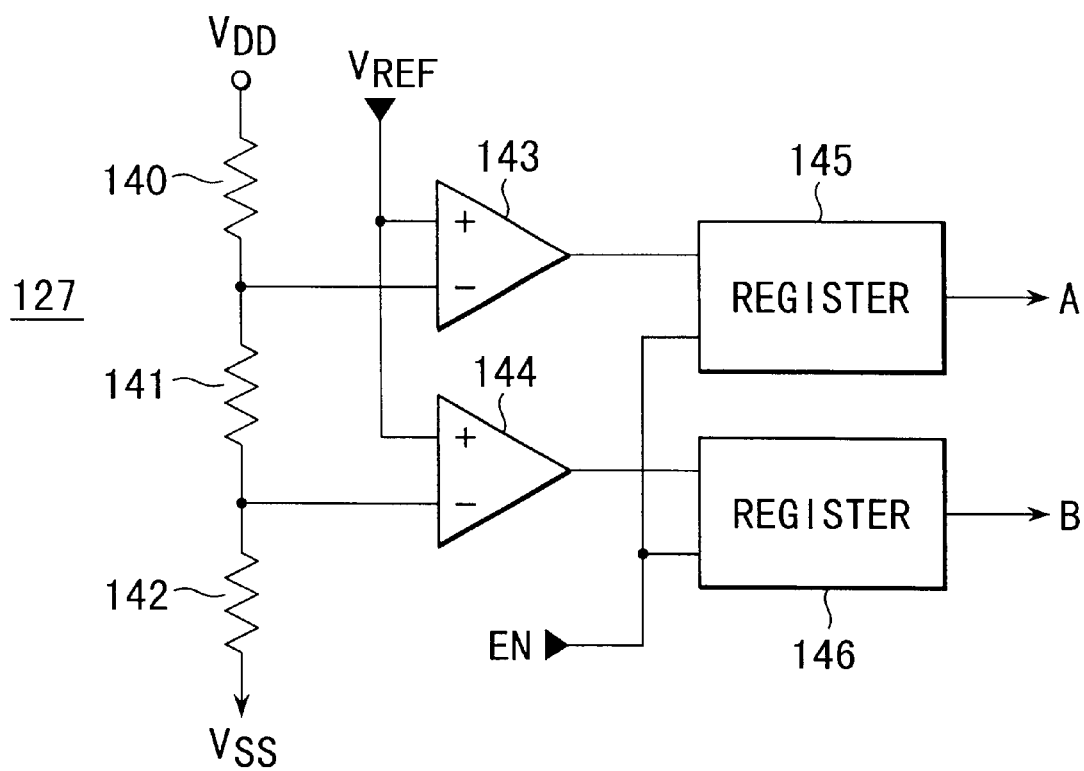
FIG. 10A is a circuit diagram showing an arrangement of a power supply voltage detection circuit in the circuit shown in FIG. 9.
FIG. 10B is a table showing the relationship between the output signals from registers and division process.

FIG. 10A is a circuit diagram showing an arrangement of the power supply voltage detection circuit 127 in the circuit shown in FIG. 9. The circuit 127 comprises resistors 140, 141, and 142, operational amplifiers 143 and 144, registers 145 and 146, and the like. The resistors 140, 141, and 142 are connected in series between the power supply $V_{DD}$ and ground point $V_{SS}$ to generate two potentials by resistively dividing the voltage across the power supply $V_{DD}$ and ground point $V_{SS}$. These potentials are respectively supplied to the inverting input terminals (−) of the operational amplifiers 143 and 144. The non-inverting input terminals (+) of the operational amplifiers 143 and 144 receive a reference potential $V_{REF}$, and their comparison outputs are respectively latched by the registers 145 and 146 in response to the enable signal EN. The division operation of the write division control circuit 126 is controlled by output signals A and B from these registers 145 and 146, as shown in, e.g., FIG. 10B.

More specifically, when both the signals A and B are at level "0", 16 bits are batch-selected; when the signal A is at level "0" and the signal B is at level "1", 8 bits are selected (two-division); and when both the signals are at level "1", 4 bits are selected (four-division).

Note that the division operation shown in FIG. 5A is available if the signals A and B are used as the signals DS0 and DS1 shown in FIG. 5A.

Figure 11A:
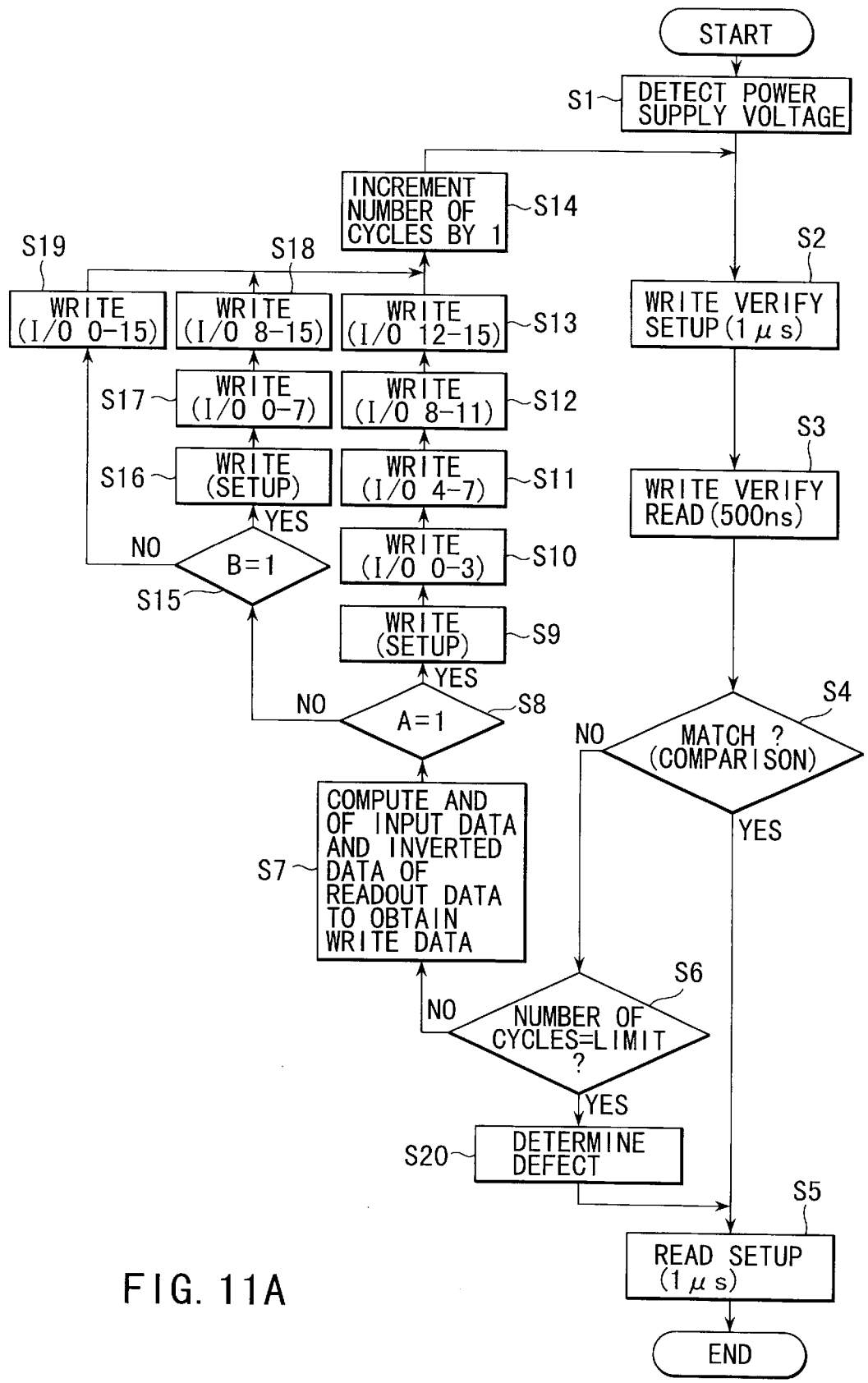
FIG. 11A is a flow chart showing a write verify process in verify processes of the flash EEPROM shown in FIGS. 9 and 10.
Figures 11B, 12:
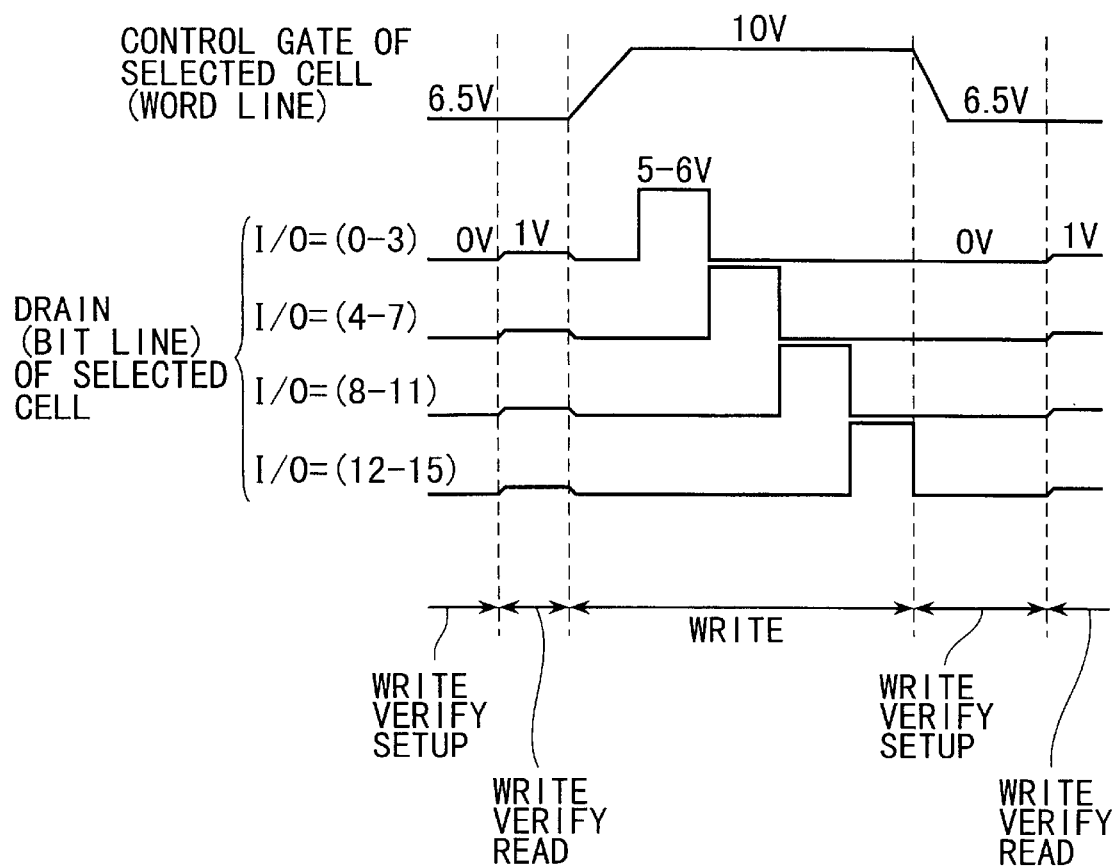
FIG. 11B is a table showing the relationship among the input data, readout data, and write data.
FIG. 12 is a timing chart for explaining the verify processes in the flash EEPROM shown in FIGS. 9 and 10.

FIGS. 11A and 11B and FIG. 12 are views for explaining a write verify process in the flash EEPROM shown in FIGS. 9 and 10. FIG. 11A is a flow chart showing the write verify process, FIG. 11B shows the logic relationship among the input data, readout data, and write data, and FIG. 12 is a timing chart of the process.

As shown in the flow chart in FIG. 11A, the power supply voltage detection circuit 127 detects the power supply voltage prior to a data write (step S1). After that, when the write verify process is started, a write verify setup is made (step S2), and a write verify read is done after an elapse of a power supply setup period around 1 $\mu$s (step S3). It is checked by comparison if the input data matches the readout data (step S4). If the two data match each other, a read setup is done (step S5), thus ending the process. On the other hand, if the two data do not match, it is checked if the number of rewrite cycles has reached a limit (step S6). If NO in step S6, the input data and inverted data of the readout data are ANDed to obtain write data (step S7). The input data, readout data, and write data in step S6 have a logic relationship shown in FIG. 11B. Subsequently, it is checked if the output signal A of the power supply voltage detection circuit 127 is at level "1" (step S8). If YES in step S8, a write process is done in the four-division mode. More specifically, after a write setup is done (step S9), 4-bit data is written in the I/Os 0 to 3 in the memory cell array (step S10), next 4-bit data in the I/Os 4 to 7 (step S11), still next 4-bit data in the I/Os 8 to 11 (step S12), and last 4-bit data is written in the I/Os 12 to 15 (step S13). In the writes in steps S10 to S13, the voltage supplied to the memory cells is a high voltage generated by boosting the power supply voltage $V_{DD}$ (e.g., 3V). As shown in the timing chart in FIG. 12, for example, a voltage of 10V is applied to the control gate (word line) of the selected cell transistor, and a voltage of 5 to 6V is applied to its drain (bit line). The write method to this cell transistor is hot electron injection, and a drain current around 500 $\mu$A/bit is required. The write continues for a write time (e.g., about 5 $\mu$s) set in the timer 123. After that, the number of cycles is incremented by 1 (step S14), and the flow returns to step S1 to repeat the aforementioned write verify process until the input data matches the readout data.

On the other hand, if it is determined in step S8 that the output signal A is not at level "1", it is checked if the output signal B of the power supply voltage detection circuit 127 is at level "1" (step S15). If YES in step S15, a write process is done in the two-division mode. After a write setup is made (step S16), 8-bit data is written in the I/Os 0 to 7 in the memory cell array (step S17), and the remaining 8-bit data is written in the I/Os 8 to 15 (step S18). In the writes in steps S17 and S18, the voltages to be supplied to the memory cells are as shown in the timing chart in FIG. 12, as in steps S10 to S13. After that, the number of cycles is incremented by 1 (step S14), and the flow returns to step S1 to repeat the aforementioned write verify process until the input data matches the readout data.

Furthermore, if it is determined in step S15 that the output signal B is not at level "1", a batch write process is done, and 16-bit data is written in the I/Os 0 to 15 in the memory cell array (step S19). In a write in step S19, the voltages to be supplied to the memory cells are as shown in the timing chart in FIG. 12. After that, the number of cycles is incremented by 1 (step S14), and the flow returns to step S1 to repeat the aforementioned write verify process until the input data matches the readout data. If the two data do not match even after the number of cycles has reached a predetermined limit, a defect is determined (step S20), and a read setup is done (step S5), thus ending the process.

With this arrangement, when the power supply voltage $V_{DD}$ has a wide range (e.g., 1.8V to 3.6V) or a write is done using a high power supply voltage $V_{DD}$ in, e.g., an acceleration test, an optimal division method can be selected depending on the power supply voltage $V_{DD}$. For this reason, compared to a case that always assumes the lowest voltage, the write speed can be optimized, and a short write time and test time (a test cost reduction) can be expected.

In the second embodiment, two detection levels are prepared to select one of the no-division, two-division, and four-division modes. However, the number of detection levels and division methods may be arbitrarily selected. For example, when the power supply voltage detection circuit is arranged, as shown in FIG. 13A, and four detection levels A, B, C and D are prepared, no-division, two-division, four-division, eight-division, and 16-division modes can be realized.

Figures 13A, 13B:
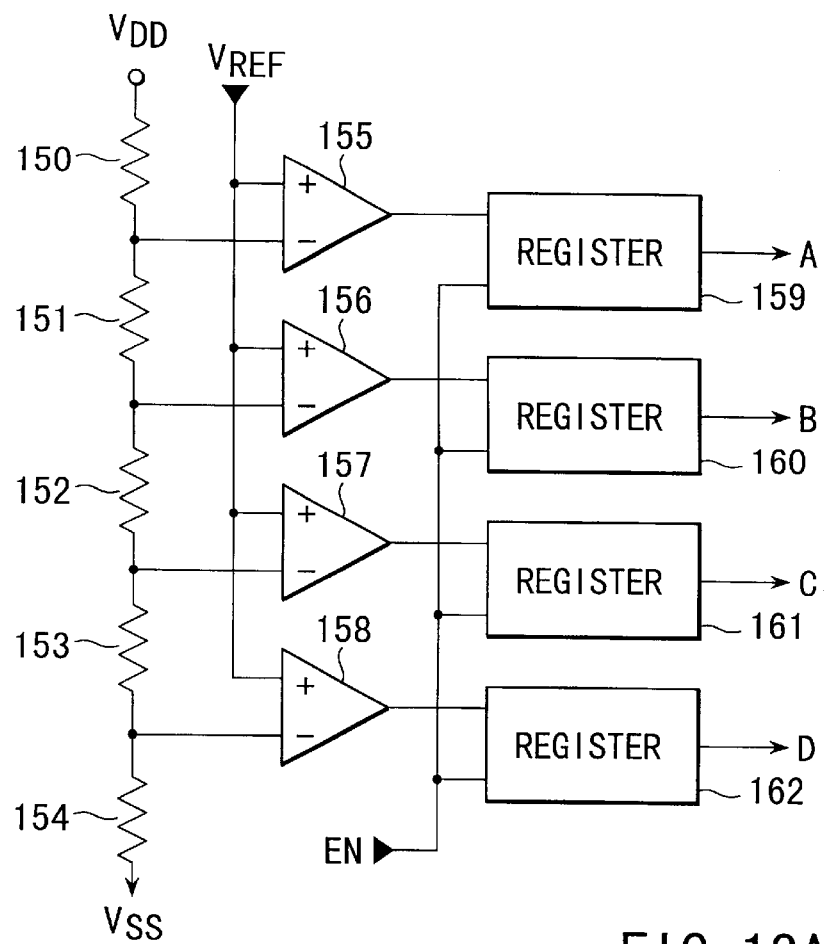
FIG. 13A is a circuit diagram showing another arrangement of the power supply voltage detection circuit in the circuit shown in FIG. 9.
FIG. 13B is a table showing the relationship between the output signals from registers and division process.

FIG. 13A is a circuit diagram showing another arrangement of the power supply voltage detection circuit 127 in the circuit shown in FIG. 9. This circuit comprises resistors 150 to 154, operational amplifiers 155 to 158, registers 159 to 162, and the like. The resistors 150 to 154 are connected in series between the power supply $V_{DD}$ and ground point $V_{SS}$ to generate four potentials by resistively dividing the voltage across the power supply $V_{DD}$ and ground point $V_{SS}$. These potentials are respectively supplied to the inverting input terminals (−) of the operational amplifiers 155 to 158. The non-inverting input terminals (+) of the operational amplifiers 155 to 158 receive a reference potential $V_{REF}$, and their comparison outputs are latched by the registers 159 to 162 in response to the enable signal EN. The division operation of the write division control circuit 126 is controlled by the output signals A, B, C, and D from these registers 159 to 162, as shown in FIG. 13B.

More specifically, when all the signals A, B, C, and D are at level "0", 16 bits are batch-selected; when the signals A, B, and C are at level "0" and the signal D is at level "1", 8 bits are selected (two-division); when the signals A and B are at level "0" and the signals C and D are at level "1", 4 bits are selected (four-division); when the signal A is at level "0" and the signals B, C, and D are at level "1", two bits are selected (eight-division); and when all the signals A, B, C, and D are at level "1", 1 bit is selected (16-division).

Third Embodiment

Figure 14A:
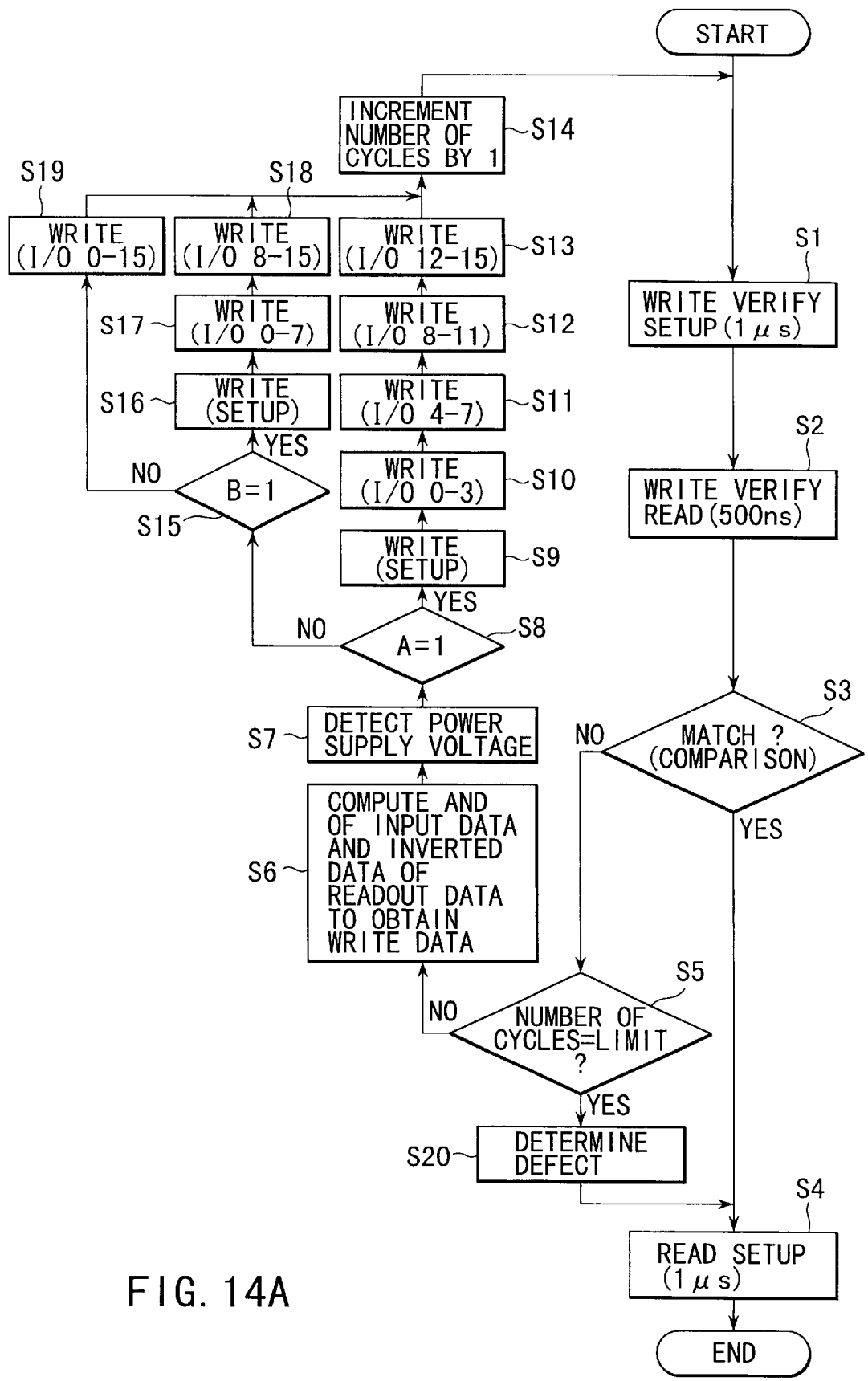
FIG. 14A is a flow chart showing a write verify process in a flash EEPROM with an automatic write function as a semiconductor storage device according to the third embodiment of the present invention.

FIGS. 14A and 14B, and FIG. 15 are views for explaining a semiconductor storage device according to the third embodiment of the present invention. FIG. 14A is a flow chart showing a write verify process in a flash EEPROM with an automatic write function, FIG. 14B shows the logic relationship among the input data, readout data, and write data, and FIG. 15 is a timing chart of the process. The basic arrangement of the flash EEPROM of the third embodiment is substantially the same as that of the second embodiment, except for a verify process.

As shown in the flow chart in FIG. 14A, when the write verify process is started, a write verify setup is made (step S1), and a write verify read is done after an elapse of a power supply setup period around 1 $\mu$s (step S2). It is checked by comparison if the input data matches the readout data (step S3). If the two data match each other, a read setup is done (step S4), thus ending the process. On the other hand, if the two data do not match, it is checked if the number of rewrite cycles has reached a limit (step S5). If NO in step S5, the input data and inverted data of the readout data are ANDed to obtain write data (step S6). The input data, readout data, and write data in step S6 have a logic relationship shown in FIG. 14B. After the power supply voltage detection circuit 127 detects a power supply voltage (step S7), it is checked if the output signal A of the power supply voltage detection circuit 127 is at level "1" (step S8). If YES in step S8, a write is done in the four-division mode. More specifically, after a write setup is made (step S9), 4-bit data is written in the I/Os 0 to 3 in the memory cell array (step S10), next 4-bit data in the I/Os 4 to 7 (step S11), still next 4-bit data in the I/Os 8 to 11 (step S12), and last 4-bit data in the I/Os 12 to 15 (step S13). In the writes in steps S10 to S13, the voltage supplied to the memory cells is a high voltage generated by boosting the power supply voltage $V_{DD}$ (e.g., 3V). As shown in the timing chart in FIG. 15, for example, a voltage of 10V is applied to the control gate (word line) of the selected cell transistor, and a voltage of 5 to 6V is applied to its drain (bit line). The write method to this cell transistor is hot electron injection, and a drain current around 500 $\mu$A/bit is required. The write continues for a write time (e.g., about 5 $\mu$s) set in the timer 123. After that, the number of cycles is incremented by 1 (step S14), and the flow returns to step S1 to repeat the aforementioned write verify process until the input data matches the readout data.

On the other hand, if it is determined in step S8 that the output signal A is not at level "1", it is checked if the output signal B from the power supply voltage detection circuit 127 is at level "1" (step S15). If YES in step S15, a write process is done in the two-division mode. After a write setup is made (step S16), 8-bit data is written in the I/Os 0 to 7 in the memory cell array (step S17), and the remaining 8-bit data is written in the I/Os 8 to 15 (step S18). In the writes in steps S17 and S18, the voltages to be supplied to the memory cells are as shown in the timing chart in FIG. 15, as in steps S10 to S13. After that, the number of cycles is incremented by 1 (step S14), and the flow returns to step S1 to repeat the aforementioned write verify process until the input data matches the readout data.

Furthermore, if it is determined in step S15 that the output signal B is not at level "1", a batch write process is done, and 16-bit data is written in the I/Os 0 to 15 in the memory cell array (step S19). In a write in step S19, the voltages to be supplied to the memory cells are as shown in the timing chart in FIG. 15. After that, the number of cycles is incremented by 1 (step S14), and the flow returns to step S1 to repeat the aforementioned write verify process until the input data matches the readout data. If the two data do not match even after the number of cycles has reached a predetermined limit, a defect is determined (step S20), and a read setup is done (step S4), thus ending the process.

More specifically, in the second embodiment, $V_{DD}$ is detected only at the beginning of the automatic write process. However, in the third embodiment, $V_{DD}$ is detected immediately before every write operation. Hence, even when the power supply voltage $V_{DD}$ has changed during a write, it can be done by a division method suitable for the power supply voltage $V_{DD}$ at that time.

Note that the number of divisions in the third embodiment can be arbitrarily set as in the second embodiment.

Fourth Embodiment

Figure 16:
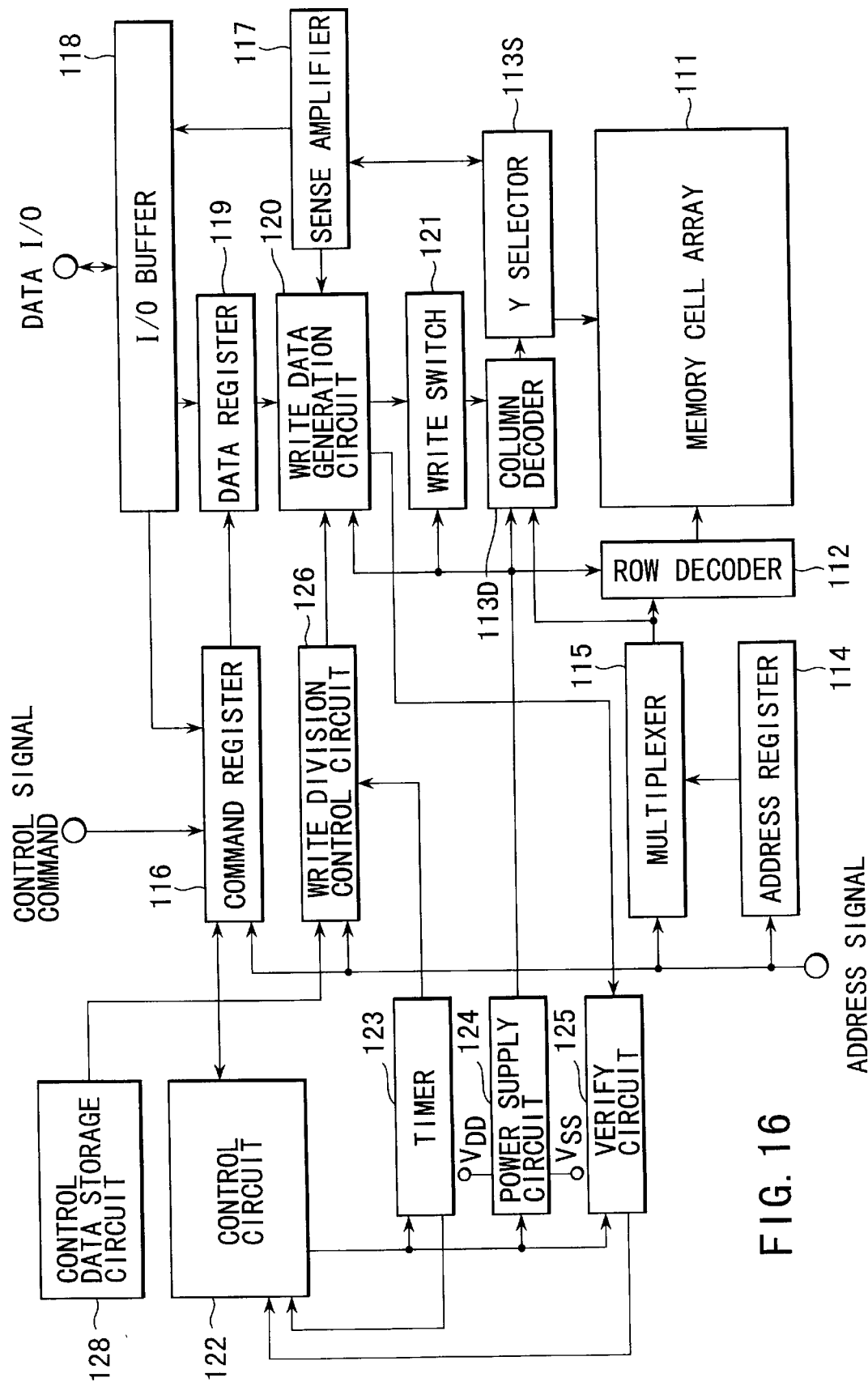
FIG. 16 is a schematic block diagram showing the circuit arrangement of a flash EEPROM with an automatic write function as a semiconductor storage device according to the fourth embodiment of the present invention.

FIG. 16 is a schematic block diagram showing the circuit arrangement of a flash EEPROM with an automatic write function to explain a semiconductor storage device according to the fourth embodiment of the present invention. In the fourth embodiment, the control method is determined on the basis of data stored in a control data storage circuit 128 which comprises nonvolatile memory cells such as EEPROM cells or the like, in place of the detection signals A and B of the power supply voltage $V_{DD}$ in the second embodiment described above.

With this arrangement, by rewriting data stored in the memory cells in the control data storage circuit 128 depending on purposes, e.g., the level of the power supply voltage $V_{DD}$ used, an acceleration test, and the like, the division method can be freely changed. In this way, the write time can be shortened since it is optimized, and the yield can be improved by trimming the write characteristics.

Note that some memory cells in the memory cell array 111 may be used for storing control data in place of the control data storage circuit 128. Also, in place of the detection signals A and B, data for controlling, e.g., the driving performance of the booster circuit in the power supply circuit 124 may be stored, and the control method may be changed to raise the current supply performance of the booster circuit when the power supply voltage drops or the consumption current increases, or to lower the driving performance of the booster circuit when the power supply voltage rises or the consumption current decreases. Furthermore, more accurate control may be realized by combining such control of the driving performance of the booster circuit and a change in the number of divisions.

Fifth Embodiment

Figure 17:
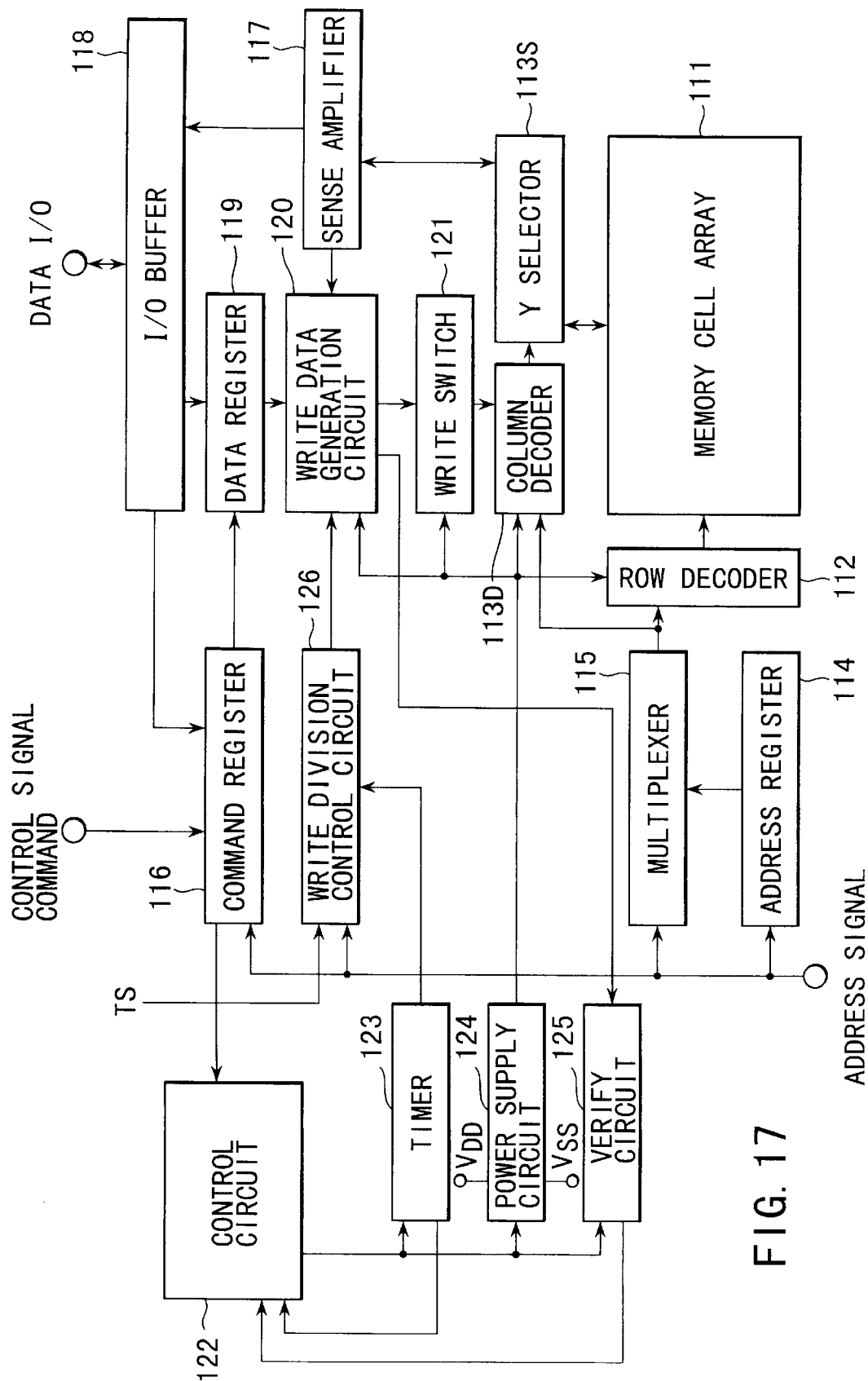
FIG. 17 is a schematic block diagram showing the circuit arrangement of a flash EEPROM with an automatic write function as a semiconductor storage device according to the fifth embodiment of the present invention.

FIG. 17 is a schematic block diagram showing the circuit arrangement of a flash EEPROM with an automatic write function to explain a semiconductor storage device according to the fifth embodiment of the present invention.

In the fifth embodiment, a control signal is determined on the basis of a test signal TS supplied from a circuit outside the chip in place of the detection signals A and B of the power supply voltage $V_{DD}$ in the second embodiment described above. In this case as well, the division method can be switched depending on purposes, e.g., the level of the power supply voltage $V_{DD}$ used, an acceleration test, and the like. Hence, the write time can be shortened since it is optimized, and a test cost reduction can be achieved.

Sixth Embodiment

Figure 18:
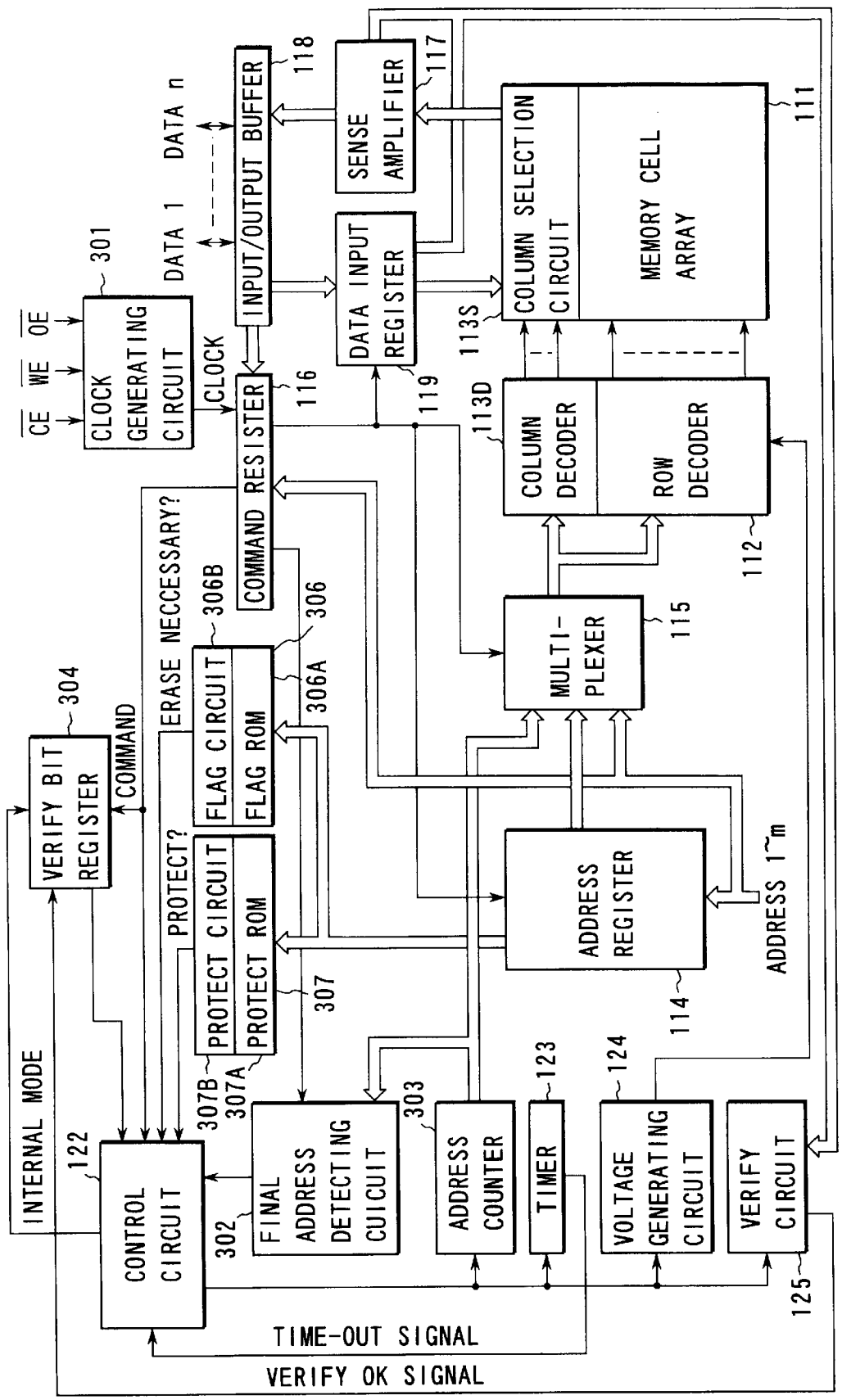
FIG. 18 is a schematic block diagram showing the circuit arrangement of a flash EEPROM having an automatic erase function as a semiconductor storage device according to the sixth embodiment of the present invention.

FIG. 18 is a schematic block diagram showing the circuit arrangement of an electrically data rewritable flash EEPROM to explain a semiconductor storage device according to the sixth embodiment of the present invention. Note that the same or similar reference numerals in the embodiments to be described hereinafter denote the same or corresponding portions in the embodiments described so far.

Referring to FIG. 18, in a memory cell array 111, each row of memory cells is selected by a row decoder 112, and each column of memory cells is selected by a column decoder 113D via a column selection circuit 113S. An address signal is supplied from an address register 114 to a multiplexer 115, and also to a command register 116.

The address signal selected by this multiplexer 115 is supplied to the row decoder 112 and column decoder 113D. Data in a memory cell selected by the row and column decoders 112 and 113D is supplied to, and sensed and amplified by a sense amplifier 117, and the amplified data is read out via an input/output (I/O) buffer 118.

By contrast, write data input to the I/O buffer 118 is supplied to and latched by a data register 119, and the data latched by the data register 119 is written in a memory cell selected by the row and column decoders 112 and 113D.

The command register 116 receives a clock signal from a clock generating circuit 301 and an erase command (to be described later) via the I/O buffer 118 in addition to the address signal, and the output signal from the command register 116 is supplied to the address register 114, the multiplexer 115, the data input register 119, a control circuit 122, and a final address detecting circuit 302. The output from this final address detecting circuit 302 is supplied to the control circuit 122.

The clock generating circuit 301 receives an external chip enable signal CE, write enable signal /WE, and output enable signal OE, and generates a clock signal at a predetermined timing and period.

The control circuit 122 controls the operation mode of the flash EEPROM and makes various kinds of control in accordance with a control signal and command supplied to the command register 116. The output signal from the control circuit 122 controls a timer 123, voltage generating circuit (booster circuit) 124, verify circuit 125, address counter 303, and the like.

The timing output (e.g., a time-out signal or the like) of the timer 123 is supplied to the control circuit 122.

The voltage generating circuit 124 comprises a booster circuit, which shifts the level of a power supply voltage (i.e., boosts it), and supplies high voltages to the row decoder 112, column decoder 113D, and the like.

The verify circuit 125 outputs a verify OK signal as a verify result signal, which is supplied to a verify bit register 304. The verify bit register 304 receives a command from the command register 116, and an internal mode signal from the control circuit 122, and sends out verify bit contents to the control circuit 122. The verify bit contents will be explained in detail later.

Furthermore, the address signal from the address register 114 is also supplied to a flag ROM 306A in an erase flag (history) storage circuit 306, and a protect ROM 307A in a protect control circuit 307. A flag circuit 306B and protect circuit 307B are provided to these flag ROM 306A and protect ROM 307A.

The flag circuit 306B has, as an erase flag, 1 bit of an electrically rewritable memory cell that stores history information indicating if write has been made, for each erase block of the memory cell array 111.

This erase flag is erased simultaneously when a block to which that erase flag belongs is erased, and is written simultaneously when the block to which that erase flag belongs is written. Hence, once data is written in a given block after erase, the erase flag is set in a write state until the block to which the erase flag belongs is erased again. On the other hand, if no write is made, the erase flag stays in an erase state.

Figure 19:
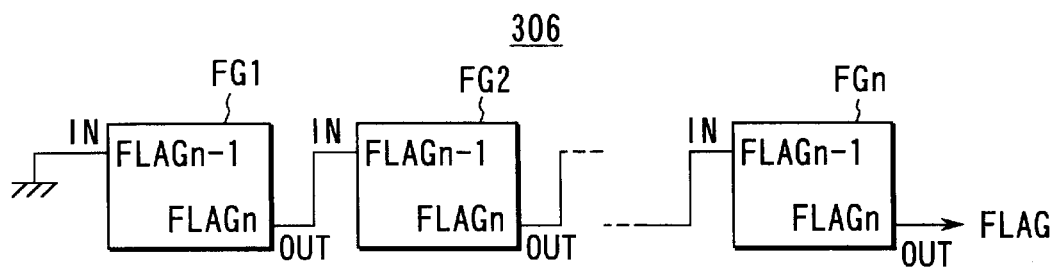
FIG. 19 is a block diagram of an erase history storage circuit shown in FIG. 18.

The erase history storage circuit 306 is constructed by n erase flag storage units FG1 to FGn provided in correspondence with n memory blocks, as shown in FIG. 19. Referring to FIG. 19, an input terminal IN of the first unit FG1 is connected to ground, and its output terminal OUT is connected to an input terminal IN of the next unit FG2. Likewise, the output terminal of the previous unit is connected to the input terminal of the next unit, and a flag output FLAG indicating the write history of a selected block memory is output from an output terminal OUT of the final unit FGn.

Figure 20:
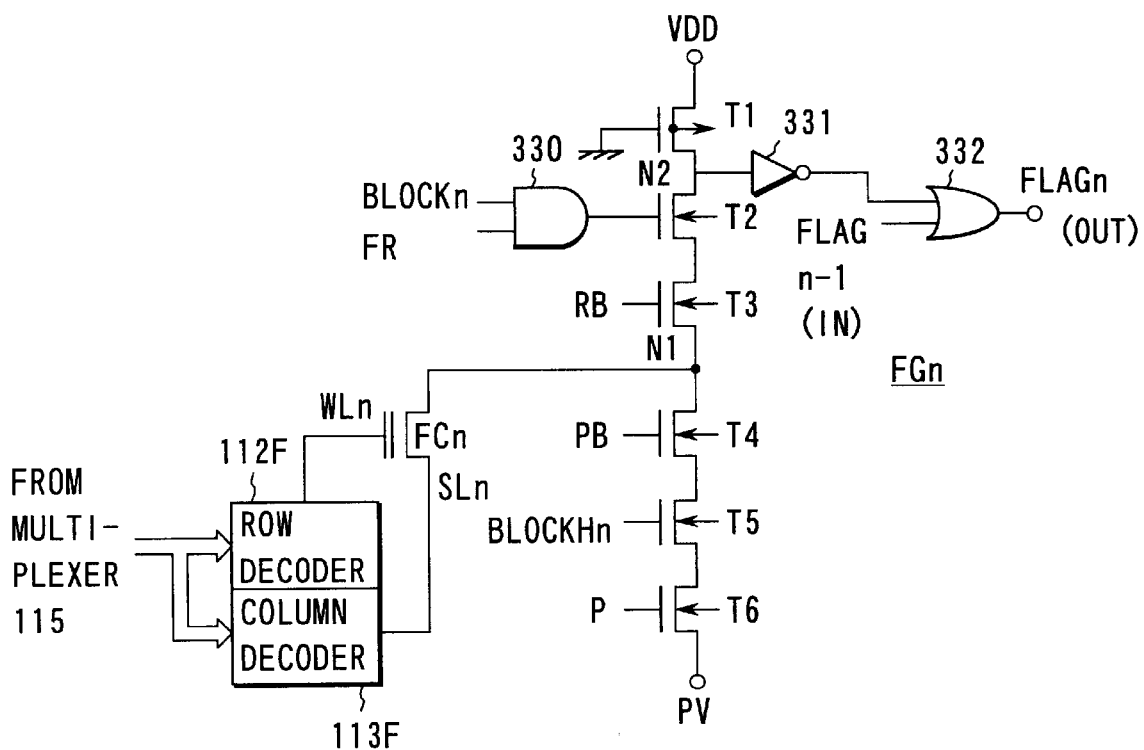
FIG. 20 is a circuit diagram showing the arrangement for one unit of the erase history storage circuit shown in FIG. 19 in detail.

For example, the final unit FGn has an internal arrangement, as shown in FIG. 20. Referring to FIG. 20, the control gate of a dedicated flag cell FCn provided in correspondence with the n-th memory block receives the decode output from a dedicated row decoder 112F, and its source terminal receives the decode output from a column decoder 113F. These row decoder 112F and column decoder 113F receive the address signal from the multiplexer 115 shown in FIG. 18.

Figure 21:
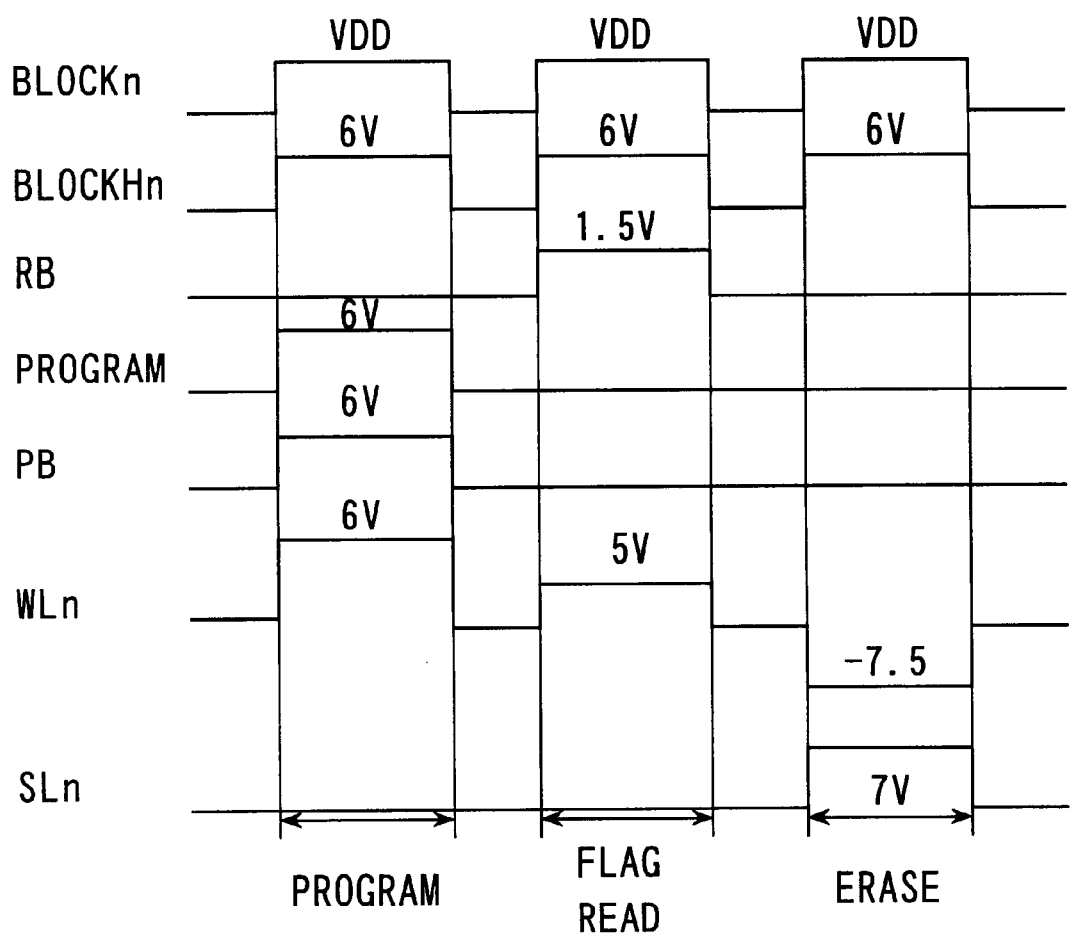
FIG. 21 is a timing chart for explaining the operation of the circuit shown in FIG. 20.

The drain of the flag cell FCn is connected to a node N1 between the source of an n-channel transistor T3 and the drain of an n-channel transistor T4. When a read bias RB of, e.g., 1.5V is supplied to the gate of the transistor T3 upon flag read, as shown in FIG. 21, the transistor T3 is turned on. Upon programming, the gate of the transistor T4 receives a program bias, as shown in FIG. 21, and the transistor T4 is turned on.

A p-channel transistor T1 and n-channel transistor T2 are connected in series with each other via a node N2 between the node N1 and a $V_{DD}$ power supply terminal. The gate of the transistor T1 is connected to ground, and is normally ON.

The gate of the transistor T2 receives the output from an AND gate 330, one input terminal of which receives a designation signal BLOCKn of this n-th memory block, and the other input terminal of which receives a flag read signal FR. Hence, when the flag read signal is supplied while the block of interest is selected, the transistor T3 is turned on in response to the output from the AND gate 330.

Three n-channel transistors T4, T5, and T6 are connected in series with each other between the node N1 and a program voltage terminal PV. The gate of the transistor T4 receives a program bias signal PB, which rises to 6V during a program period, as shown in FIG. 21, and the transistor T4 is turned on. The gate of the transistor T5 receives a signal BLOCKHn, which rises to 6V during the program period, and the transistor T5 is turned on. The gate of the transistor T6 receives a program signal P, which rises to 6V during only the program period, and the transistor T6 is turned on.

The node N2 is connected to one input terminal of an OR gate 332 via an inverter 331, and the other input terminal of the OR gate 332 receives an output FLAGn-1 from the previous flag unit. Since the transistor T1 is normally ON, the node N2 is always at HIGH level and, hence, a LOW-level signal is always supplied from the inverter 331 to one input terminal of the OR gate 332.

In this manner, if the input signal FLAGn-1 from the previous flag unit at an input terminal IN is at HIGH level, an output signal FLAGn at an output terminal OUT is also at high level, and vice versa.

For example, when a predetermined memory block in the memory cell array 111 shown in FIG. 18 corresponding to the flag cell FCn shown in FIG. 20 is selected upon data write, an address signal is supplied from the address register 114 to the row decoder 112 and column decoder 113D via the multiplexer 115. In this manner, a memory cell in the predetermined memory block is selected, and data is stored therein.

At this time, the transistors T4, T5, and T6 in FIG. 20 are turned on, as shown in FIG. 21, and a high voltage for write of 10V is supplied onto a word line WLn connected to the control gate of the flag cell FCn, thus setting a write enable state.

The transistors T2 and T3 remain OFF at that time.

In this state, when an identical address signal is supplied from the multiplexer 115 to the row decoder 112F and column decoder 113F in FIG. 20, and write is made in the memory cell array 111, the same write is made in the flag cell FCn.

On the other hand, in an erase mode, the flag read signal FR is supplied to the AND gate 330. In this mode, since the block select signal BLOCKn (FIG. 21) is HIGH, the transistor T2 is turned on in response to the output from the AND gate 330. The read bias signal RB also rises to 1.5V simultaneously with the block select signal BLOCKn to turn on the transistor T3.

Note that the block select signal BLOCKn goes HIGH in only the selected block. Hence, in each flag unit corresponding to a non-selected block, since the transistor T2 is not turned on, a LOW flag signal FLAGn-1 is supplied to the next unit.

When the flag cell FCn has not undergone any write, the node N2 on the input side of the inverter 331 goes LOW, and the output from the inverter 331 goes HIGH. In this case, however, since write has been made, no current is supplied to the transistors T1 to T3, and the node N2 stays at a high potential. Since the flag signal FLAGn-1 from the previous unit is LOW, as described above, the output from the inverter 331 changes to LOW.

In this manner, by watching the output FLAGn from the final unit FGn shown in FIG. 19, if the output is HIGH, no erase operation is required for the block of interest; if the output is LOW, i.e., "0", erase operation is required.

In erase operation, voltages of −7.5V and 7V are respectively applied to the word line WLn and a source line SLn during an erase period shown in FIG. 21, thus erasing the block.

The automatic erase operation in the flash memory in the embodiment shown in FIG. 18 will be described in detail below with reference to the flow chart shown in FIG. 22.

When the erase mode is set, an external circuit generates an erase command and supplies it to the I/O buffer 118 via the data line. The erase command is stored in the command register 116, and is then supplied to the verify bit register 304 and control circuit 122. In this manner, the control circuit 122 starts the operation shown in FIG. 22.

In the first step S31, the control circuit 122 supplies an initial set signal to the timer 123, verify circuit 125, address counter 303, and voltage generating circuit 124. In this state, an address signal is stored in the address register 114, and is also supplied to the multiplexer 115 and command register 116.

Upon erasing a block, in step S32 the address signal output from the multiplexer 115 is supplied to the row decoder 112 and column decoder 113D to select a predetermined memory block. Also, in order to obtain protect information and write history information corresponding to this block, the storage areas of the protect ROM 307A and erase flag ROM 306A corresponding to that block are accessed to read out and check the information. That is, the protect information and erase flag corresponding to the block to be erased are read out from the protect ROM 307A and flag ROM 306A, and are sent to the control circuit 122 to verify their contents.

If the selected block is unprotected and the contents of the erase flag indicate write state "0", the control circuit 122 executes a series of block erase operations. By contrast, if the contents of the erase flag indicate erase state "1", this block need not be erased, and the flow jumps to step S38 without executing any erase operations to check if the block of interest is the last one in the memory cell array 111. If the block of interest is not the last one, the flow advances to step S40 to proceed with erase operations; otherwise, read setups are made in step S39, thus ending the block erase operation.

If the contents of the erase flag indicate write state "0" in step S32, the voltage generating circuit 124 generates a high voltage for pre-programming in response to a command from the control circuit 122, and supplies it to the row decoder 112 to pre-program all the memory cells and flag cell in the block of interest in step S33.

The flow then advances to step S34 to execute erase operations. At this time as well, as has been explained above with reference to FIG. 21, predetermined erase voltages are supplied from the voltage generating circuit 124 to the control gate and source of the flag cell to erase its contents, and identical voltages are supplied to all the memory cells in the block of interest to erase their contents.

After the erase operations, the flow advances to step S35 to verify the presence/absence of an over-erased memory cell. If the verify result is OK, the flow jumps to step S38 to check if the block of interest is the last one. If the block of interest is not the last one, the next block is selected in step S40, and the flow returns to step S32.

If an over-erased memory cell is found in step S35, weak write (programming) is made for the entire block in step S36, and the presence/absence of an over-erased memory cell is checked again in step S37. If normal erase level has not been reached yet, erase operations are executed again in step S34.

On the other hand, if it is confirmed in step S37 that normal erase level has been reached, it is checked in step S38 if the last block has been erased. If the block of interest is not the last one, the next block is designated in step S40 to repeat operations in step S32 and the subsequent steps.

If the block of interest is the last one, the flow advances to step S39 to make read setups, thus ending the process.

In the embodiment shown in FIG. 18, flag cells formed independently of the memory cell array 111 are assured in the flag ROM 306A, but they may be integrally formed in the memory cell array 111.

Seventh Embodiment

Figure 23:
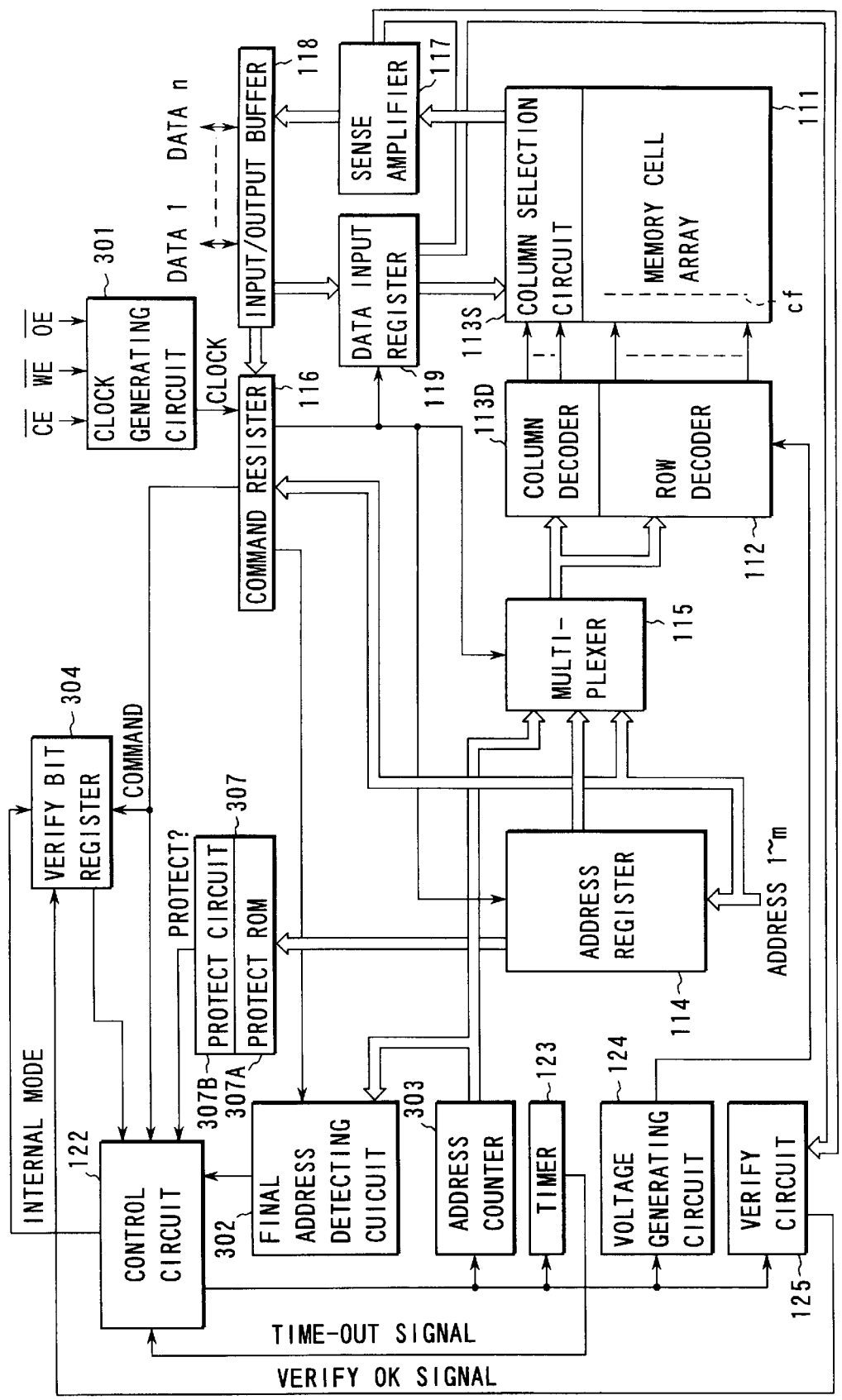
FIG. 23 is a schematic block diagram showing the circuit arrangement of a flash EEPROM having an automatic erase function as a semiconductor storage device according to the seventh embodiment of the present invention.

FIG. 23 is a block diagram showing such example.

The arrangement of the embodiment shown in FIG. 23 is nearly the same as that of the embodiment shown in FIG. 18, except that the flag ROM 306A and flag circuit 306B in FIG. 18 are removed from the embodiment shown in FIG. 23, but flag column circuits Cf are provided to individual blocks in the memory cell array 111 in the embodiment shown in FIG. 23. Hence, the same reference numerals in the embodiment shown in FIG. 23 denote the same parts as those in FIG. 18, and a detailed description thereof will be omitted.

Referring to FIG. 23, when an external erase command is supplied to the I/O buffer 118, this erase command is supplied to the control circuit 122 via the command register 116. In response to this command, a given block is selected, and whether or not that block is protected is checked with reference to the protect ROM 307A in step S32 in FIG. 22 in the same manner as in the embodiment shown in FIG. 18. At the same time, a flag column circuit Cf of the selected block is selected by the column decoder 113D, and individual flag cells of this flag column circuit Cf are selected in turn to check the contents of erase flags. The subsequent erase operations in the embodiment shown in FIG. 23 are the same as those in the embodiment shown in FIG. 18, that have been explained with reference to FIG. 22.

Figure 24:
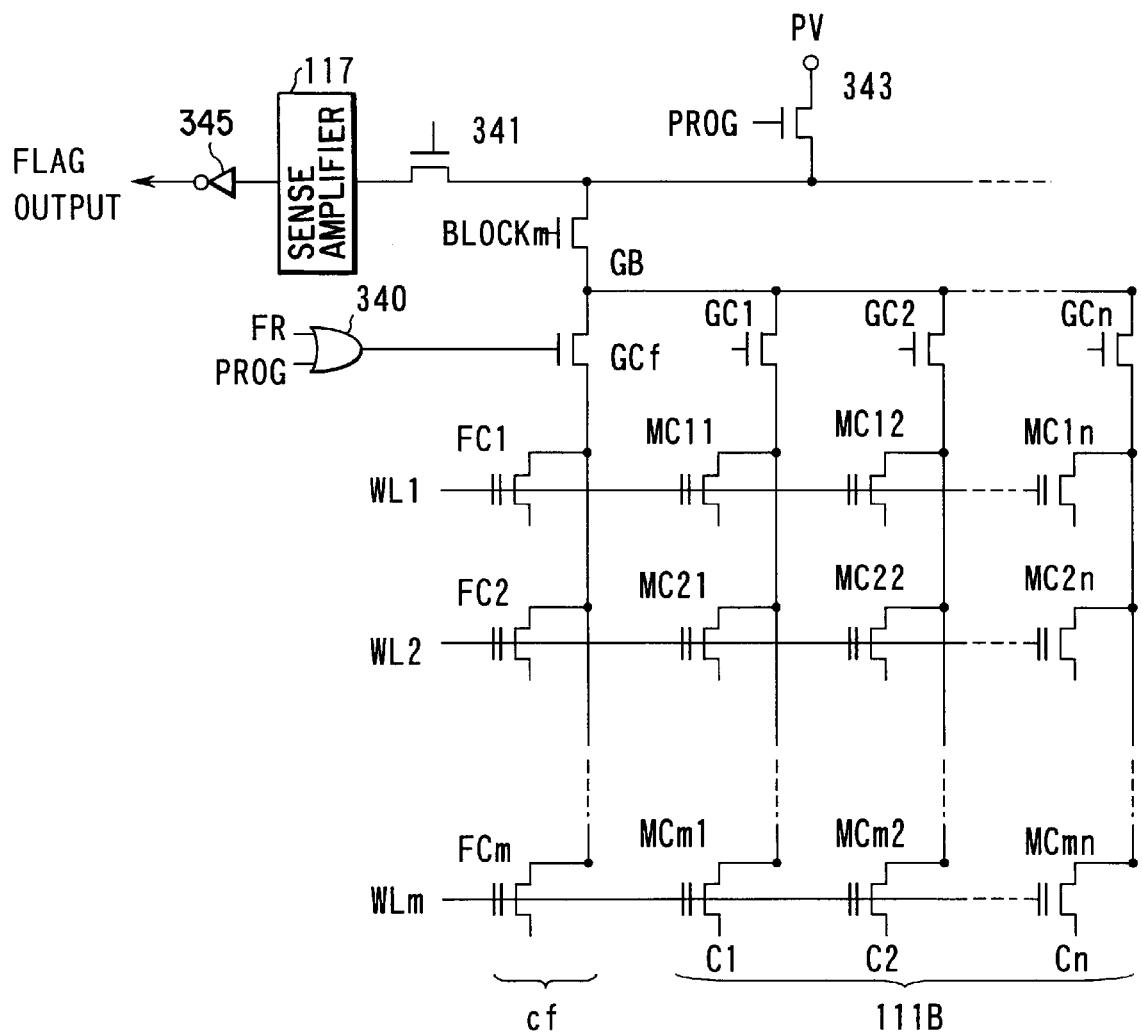
FIG. 24 is a partial circuit diagram showing a memory cell array shown in FIG. 23, which includes an internal erase flag circuit.

FIG. 24 is a circuit diagram showing the arrangement of the flag column circuit Cf shown in FIG. 23 in detail. FIG. 24 shows one memory cell block 111B of a plurality of memory cell blocks that form the memory cell array 111 shown in FIG. 23. The flag column circuits Cf are provided to the individual memory cell blocks.

The memory cell block 111B has a plurality of columns C1, C2, ..., Cn, and also has a column Cf for erase flags, which column has the same arrangement as that of the columns C1 to Cn. The columns C1, C2, ..., Cn have memory cells Mc11, Mc21, ..., Mcm1, Mc12, Mc22, ..., Mcm2, Mc1n, Mc2n, ..., Mcmn corresponding in number to word lines WL1, WL2, ..., WLm. Likewise, the column Cf for erase flags has flag cells Fc1, Fc2, ..., Fcm corresponding in number to the word lines WL1, WL2, ..., WLm.

The plurality of columns C1, C2, ..., Cn and column Cf for erase flags in the memory cell block 111B are commonly connected to a block select gate GB via column select gates GC1, GC2, ..., GCn, GCf. The column select gates GCd, GC2, ..., GCn receive a select signal from the column selection circuit 113S shown in FIG. 23, but the column select gate GCf for erase flags receives an erase flag read signal FR or program command signal PROG via an OR gate 340. The block select gate GB receives a block select signal BLOCKn.

The other terminal of the block select gate GB is connected to the sense amplifier 117 via a transfer gate 341, and is also connected to a write voltage terminal PV via a write load transistor 343.

In the circuit shown in FIG. 24, when the block 111B is selected upon write, the program signal PROG is supplied to the OR gate 340 and load transistor 343, and a program voltage is supplied to the column for erase flags. In this state, for example, when the column select gate GC1 opens in response to a select signal from the column selection circuit 113S in FIG. 23, the column C1 is selected, and the program voltage is supplied to that column.

When a high voltage for write shown in FIG. 21 is supplied to, e.g., the word line WL1, write is made in the selected memory cell Mc11, and is also made in the flag cell Fc1. Likewise, write is made even when another column is selected.

The erase operation in the embodiment shown in FIGS. 23 and 24 will be explained below with reference to FIG. 25. When an erase command is externally supplied to the I/O buffer 118, that command is transferred to the control circuit 122 via the command register 116, thus starting the erase operation shown in FIG. 25.

Assume that the block select signal BLOCKn is supplied to the block select gate GB to select the block 111B. In this state, the flag read signal FR is supplied to the OR gate 340 to open the column gate GCf for erase flags.

Figure 25:
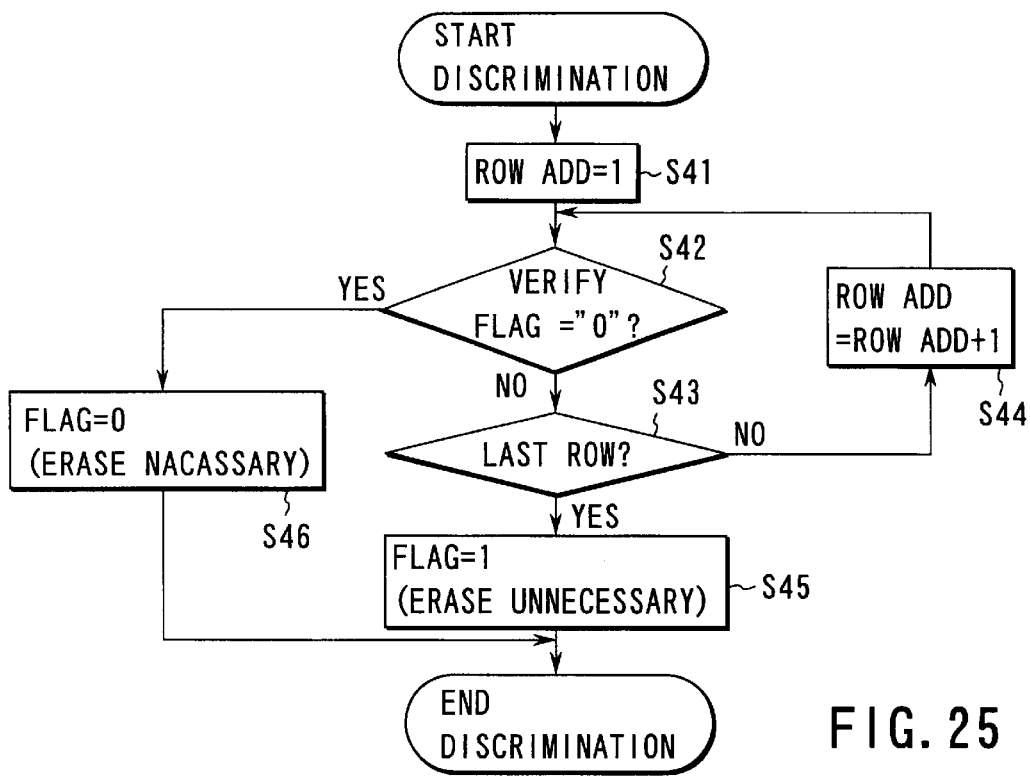
FIG. 25 is a flow chart for explaining the operation of the circuit shown in FIGS. 23 and 24.

In the first step S41 in FIG. 25, when the row address (=1) is supplied from the row decoder 112 to the word line WL1, the contents of the flag cell Fc1 are read out to the sense amplifier 117 via the column gate GCf and block select gate GB, and the flag output is supplied from the sense amplifier 117 to the verify circuit 125 via the inverter 345. It is verified in step S42 if the erase flag is "1".

Since the flag cell Fc1 has not undergone any write, the flag is "0". In such case, the flow advances to step S43 to check if the row of interest is the last one. Since NO is determined in step S43 in this case, the flow advances to step S44 to increment the row address by 1, and operations in steps S42 and S43 are repeated for the flag cell Fc2 of the second row (WL2).

If it is detected in step S43 that the verify process for the flag cell Fcm of the last row is complete, the flow advances to step S45 to set FLAG=0 indicating that erase for the block 111B is not necessary. The flag is stored in the verify bit register 304.

If any of the flag cells Fc1 to Fcm in the column for erase flag has a write history, and FLAG=1 is detected in step S42, the flow immediately advances to step S46 without verifying the remaining flag cells, and FLAG=1 indicating that erase for the block 111B is necessary is set and is stored in the verify bit register 304.

The aforementioned verify operation is repeated for all the blocks, and verify results are stored in the verify bit register 304. Hence, erase operations can be executed for only required blocks with reference to the contents of the verify bit register 304. Upon erase, flag cells are erased simultaneously with main body cells in the blocks.

Eighth Embodiment

Figure 26:
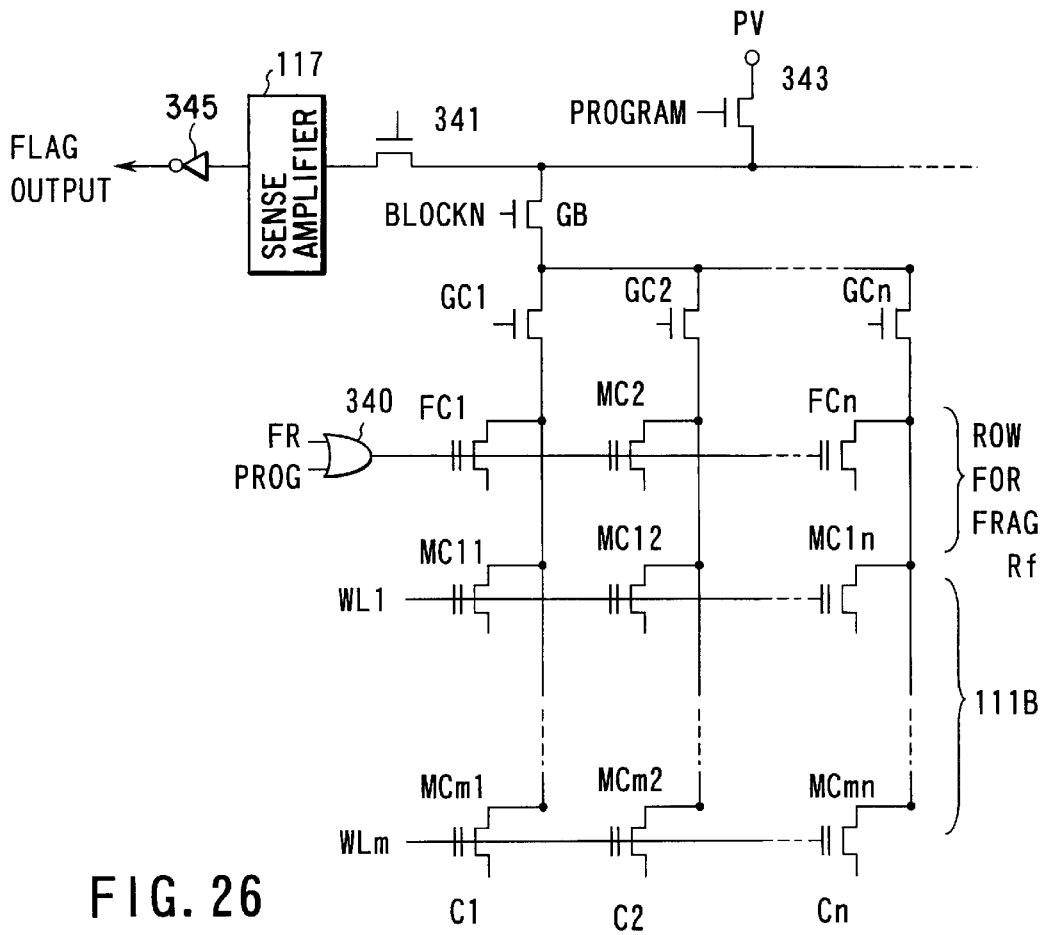
FIG. 26 is a partial circuit diagram showing another memory cell array which includes an internal erase flag circuit.
Figure 27:
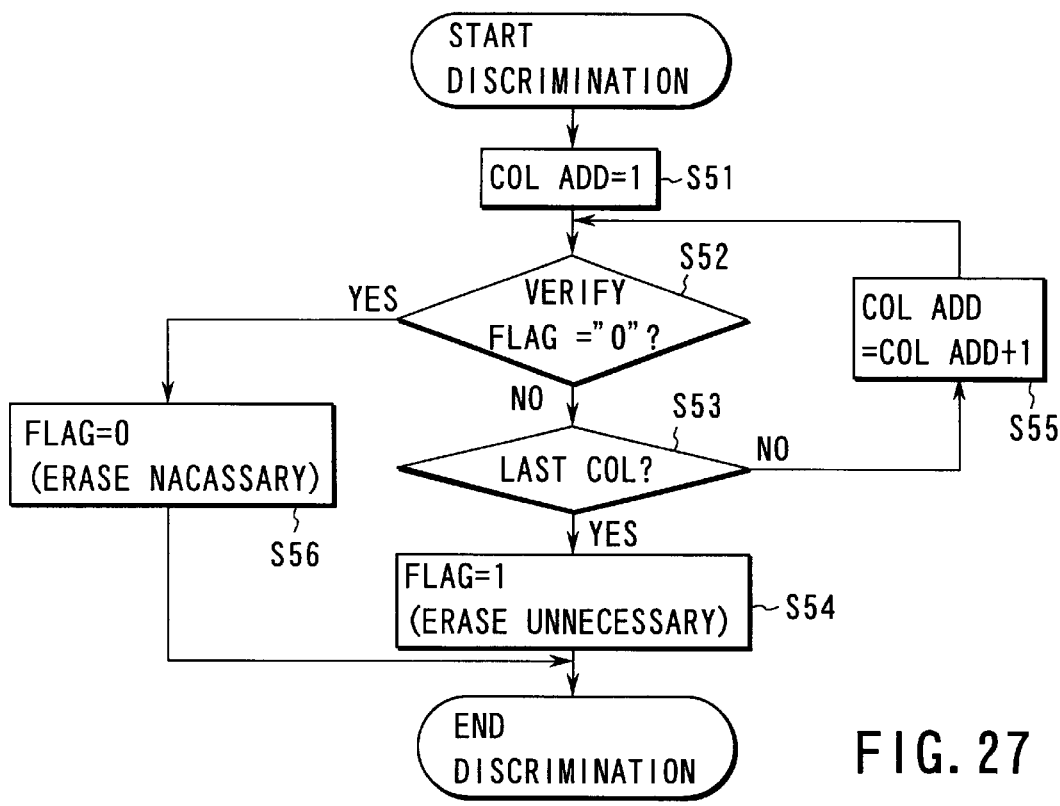
FIG. 27 is a flow chart for explaining the operation of the circuit shown in FIG. 26.

In the embodiment shown in FIG. 24, the column for erase flag is provided to each block. Likewise, a row circuit for erase flags may be added to each block. FIG. 26 is a circuit diagram showing such example, and FIG. 27 is a flow chart showing the operation of that circuit.

Referring to FIG. 26, a row Rf for erase flags is added to rows of the main body memory block 111B consisting of a plurality of word lines WL1 to WLn. This row Rf consists of a plurality of erase flag cells Fc1 to Fcn, the gates of which are commonly connected to the output terminal of the OR gate 340. The input terminals of the OR gate 340 receive the flag read signal FR and write command signal PROG as in FIG. 24, the gate opens by either signal, and an output appears. Since other arrangements are the same as those in FIG. 24, no more explanation will be given.

The operation of the embodiment shown in FIG. 26 will be described below with reference to FIG. 27. In step S51, the column address=1 is selected from the column decoder 113D in FIG. 23 to the column selection circuit 113S to select the first column C1. At this time, the flag read signal FR is supplied from the OR gate 340 to the gate of the flag cell Fc1, and its output is sent to the sense amplifier 117 via the block select gate GB and transfer gate 341.

The output from the sense amplifier 117 is supplied, via the inverter 345, to the verify circuit 125 in FIG. 23 and is verified, thus verifying a flag in step S52. Likewise, the columns C2, . . . , Cn are selected to verify flags. If none of memory cells in the block 111B have undergone write, flag=0 is detected in the loop of steps S52, S53, and S55, and flag=0 indicating that erase is not necessary is set in step S54 and is stored in the verify bit register 304.

If any of the memory cells in the block 111 has undergone write, verify flag=1 is detected in step S52, and flag=1 indicating that erase is necessary is set in step S56 and is stored in the verify bit register 304.

Figure 28:
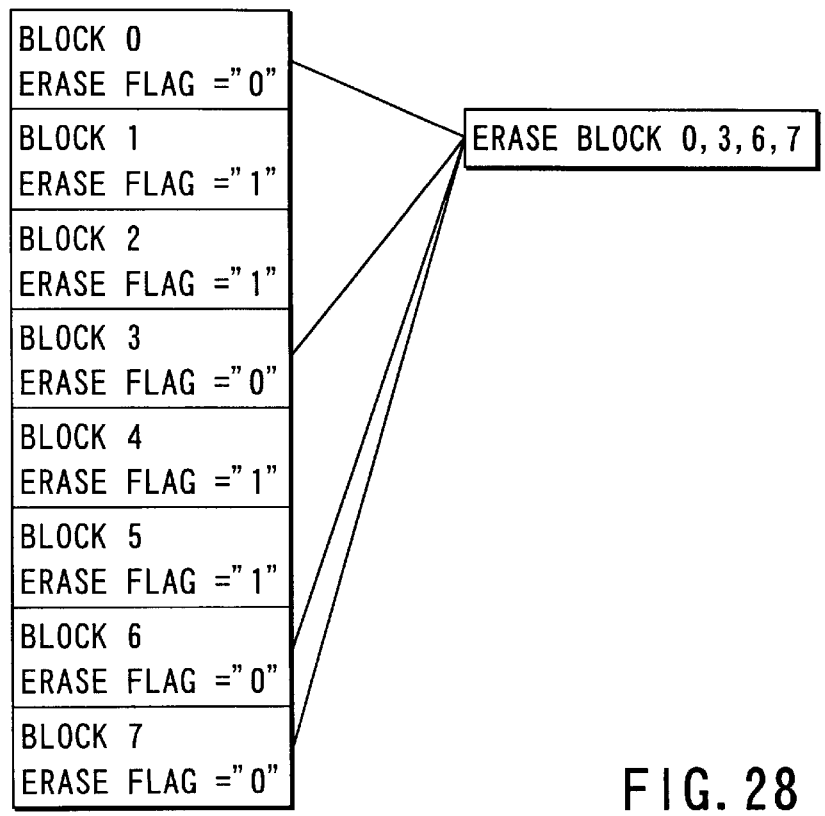
FIG. 28 is a view for explaining a function of automatically erasing only required blocks in a semiconductor storage device according to the eighth embodiment of the present invention.

FIG. 28 shows the storage contents of the verify bit register 304 that stores the flag verify results of all the blocks in the memory cell array 111 in any of the embodiments shown in FIGS. 20, 24, and 26. In this example, the number of blocks is 7, and flags of block Nos. 0, 3, 6, and 7 are all "0". Hence, erase operations are required for these blocks. Conversely, since erase operations for the remaining block Nos. 1, 2, 4, and 5 are not necessary, and are not executed for these blocks, the erase time can be greatly shortened compared to conventional devices.

In case of a flash memory that simultaneously erases a plurality of blocks, blocks which do not require erase operations are excluded from the combination of blocks to be simultaneously erased, and only blocks that require erase operations are simultaneously erased. In this way, the number of times of erase operations can be reduced.

For example, in case of a flash memory that can simultaneously erase four blocks, if there are eight blocks, as shown in FIG. 28, erase operations must be repeated twice in units of four blocks. However, by providing the erase flag verify function, erase operations need only be done once by erasing blocks 0, 3, 6, and 7 at the same time.

Note that the erase flag cell may undergo write every time the cell array undergoes write. However, whether or not write has already been made can be easily detected by verifying flags. Hence, only erase flag cells in an erase state may undergo write with reference to the verify results.

Ninth Embodiment

Figure 22:
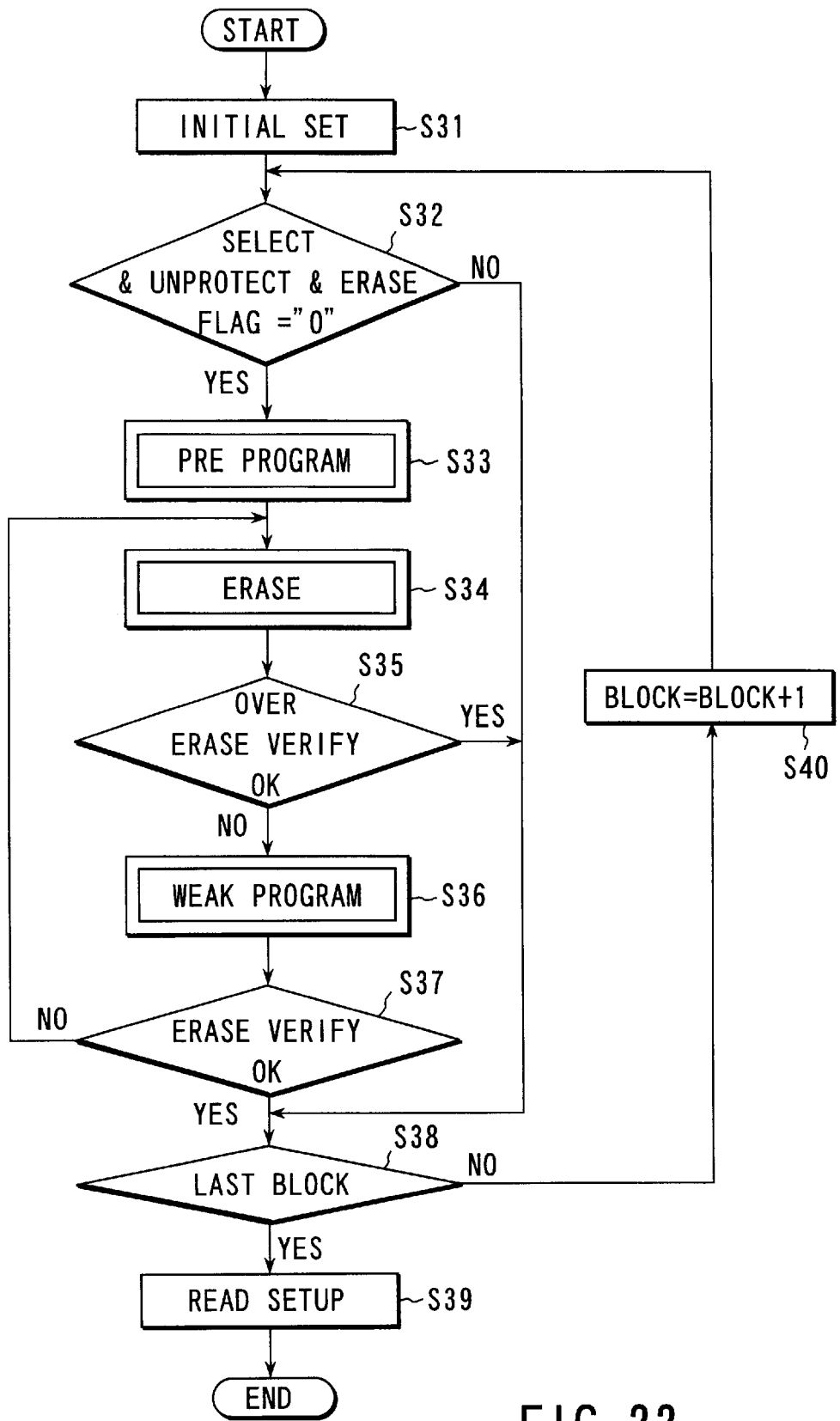
FIG. 22 is a flow chart for explaining the operation sequence of the embodiment shown in FIG. 18.

In erase operations, upon completion of pre-programming in step S33 in FIG. 22, it is often verified to confirm if pre-programming is normally done. By setting a lower cell gate voltage at that time than that upon verify for normal automatic program operation, the erase time can be shortened as a whole.

The pre-programming prevents an unwritten cell from being over-erased by batch-erase. Hence, the pre-programming need not completely write up to a threshold voltage that can be reliably read out in case of an already written cell.

Figure 29A:
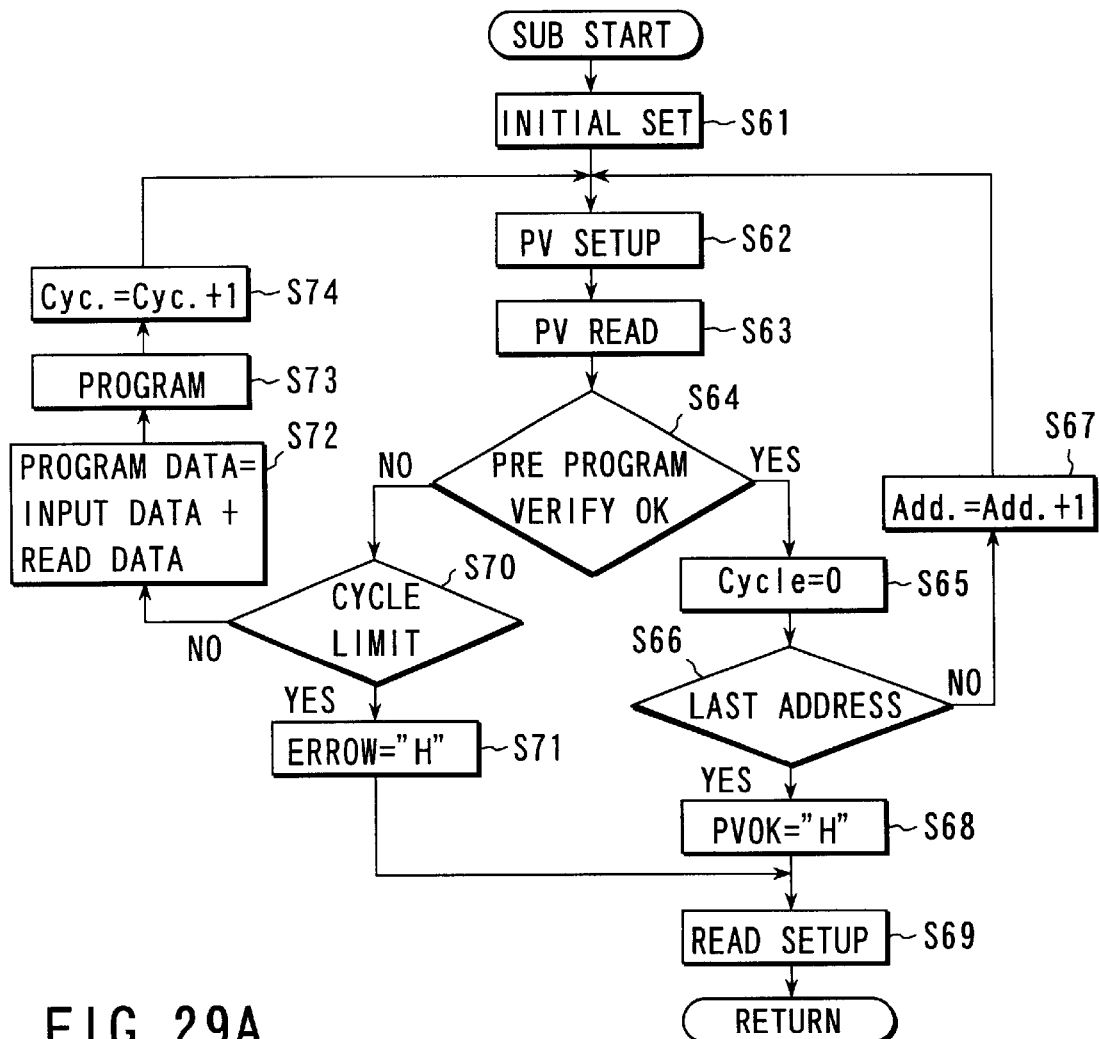
FIG. 29A is a flow chart showing the operation sequence of pre-programming upon automatic erase according to the ninth embodiment of the present invention.

Pre-programming is done in accordance with a sequence shown in, e.g., FIG. 29A. That is, initial setups are made in the first step S61, and a cell undergoes write by setting up a pre-program voltage PV in step S62.

Subsequently, a verify voltage Vth for pre-programming is read in step S63. That is, in the graph shown in FIG. 29B, a verify voltage Vth2 for pre-programming, which is lower than a verify voltage Vth1 for normal programming, and it is checked based on the read voltage in step S64 if the verify result is OK.

If the verify result is OK, the number of cycles is set to be zero in step S65. It is then checked in step S66 if the current address is the last address of an erase block. If the current address is not the last address, the address is incremented by 1 in step S67, and the flow returns to step S62.

If the current address is the last address in step S66, a flag indicating verify for pre-programming=OK is set in step S68, and setups for the next read are made in step S69. Then, the control returns to the main routine.

If the verify result for pre-programming is not OK in step S64, the flow advances to step S70 to check if the number of cycles has reached a limit value. If YES in step S70, an error flag is set in step S71, and the flow advances to step S69 to end the process.

If the number of cycles has not reached the limit value in step S70, the sum of input data and read data is set as program data in step S72, and programming is done in step S73. The number of cycles is incremented by 1 in step S74, and the flow then returns to step S62.

In this process, the voltage to be applied to the cell gate upon programming in step S73 is set at 5.5V, while it is, e.g., 6.5V in normal automatic programming. In this manner, the write time can be set to be shorter than in normal programming.

Figure 29B:
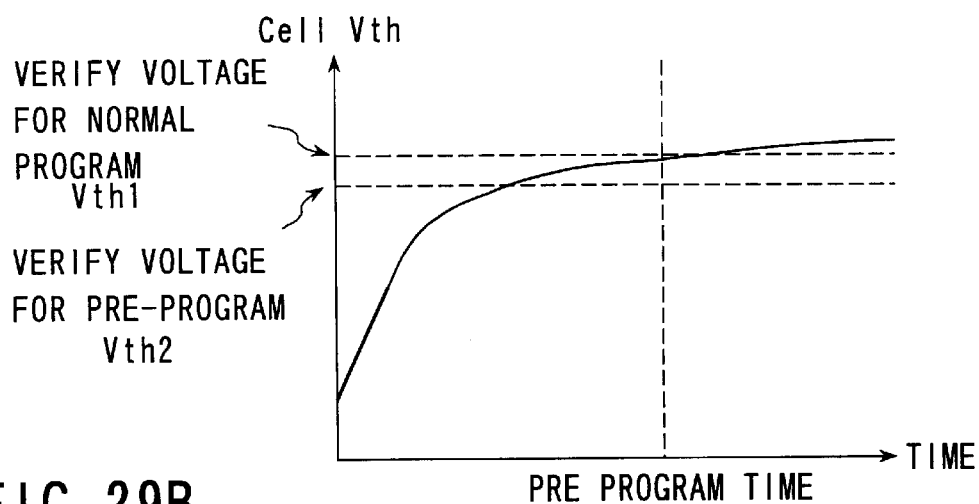
FIG. 29B is a graph showing a change in verify voltage for pre-programming shown in FIG. 29A.

Even when the threshold voltage Vth2 of a cell after programming is slightly lower than the normal value Vth1, as shown in FIG. 29B, a verify result=OK is obtained. Hence, the number of times of programming of an identical cell until a verify result=OK is obtained can be reduced.

10th Embodiment

Figure 30A:
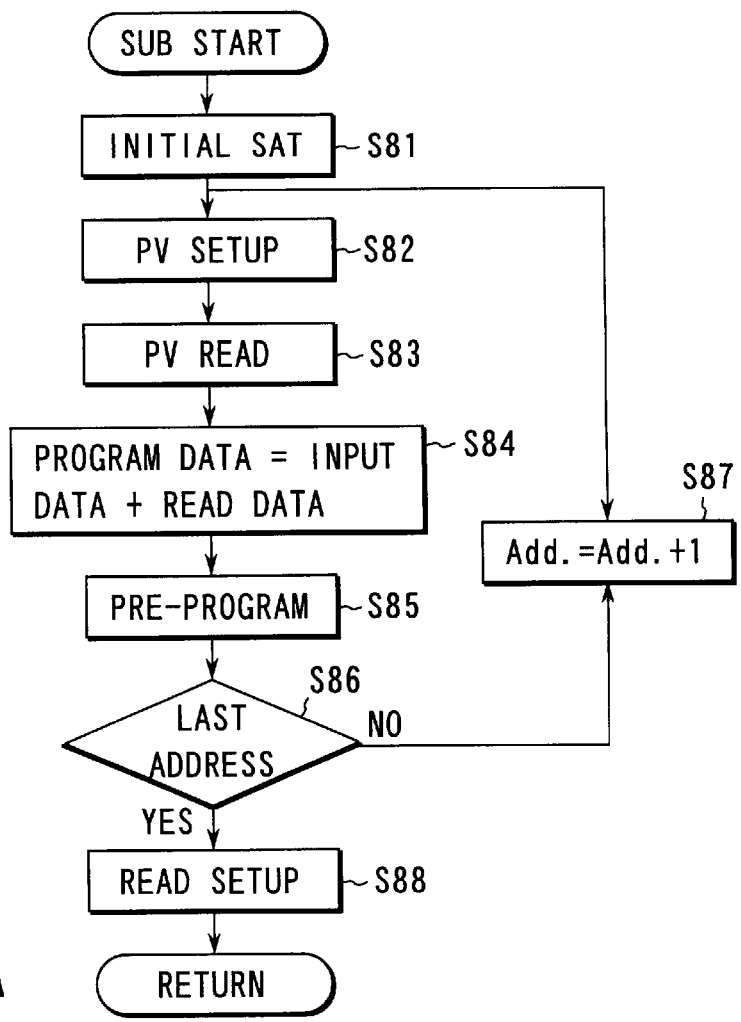
FIG. 30A is a flow chart showing the operation sequence of pre-programming upon automatic erase according to the 10th embodiment of the present invention.

Since pre-programming need not completely write up to a threshold voltage that can be reliably read out in case of an already written cell as in the ninth embodiment, a sequence that omits the verify process itself after pre-programming may be used, as shown in FIG. 30A. More specifically, a verify process before programming is done to determine a bit to be programmed. In this case, since the cell threshold voltage has risen to a value near a verify voltage after a single write access, programming at that address then ends without any verify process.

Referring to FIG. 30A, after initial setups are made in step S81, a program voltage VP setup process in step S82 for setting a bit to be programmed and a voltage PV read process in step S83 for verifying the cell threshold value are executed in the same manner as in the embodiment shown in FIG. 29A.

Input data and read data are added to generate program data in step S84, and pre-programming is done using the generated program data in step S85.

After pre-programming, the pre-programming process continues without any verify process until the last address of a given block is detected in steps S86 and S87, and if the last address is detected, the flow advances to step S88 to make setups for the next read, thus ending the process.

Figure 30B:
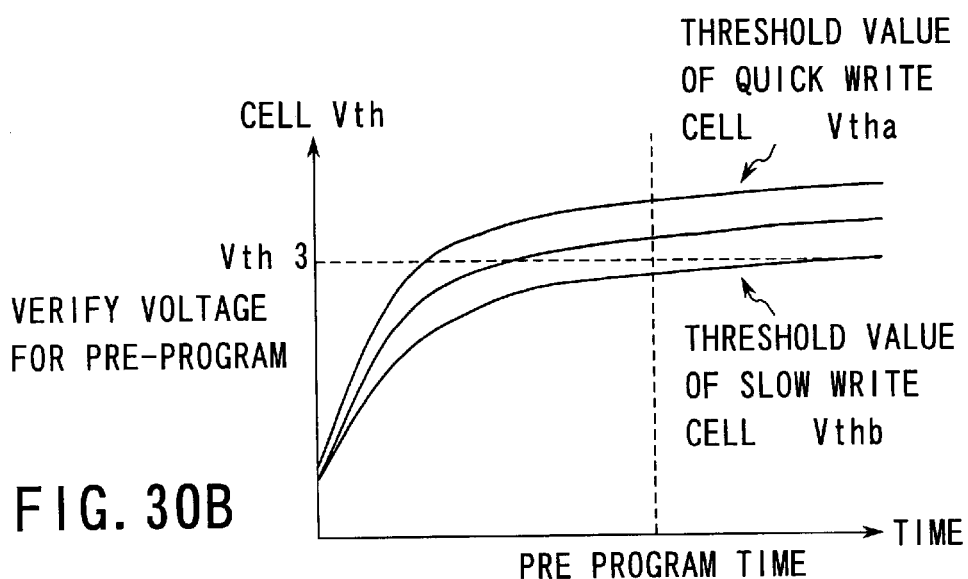
FIG. 30B is a graph showing a change in verify voltage for pre-programming shown in FIG. 30A.

That is, as can be seen from FIG. 30B, when an average verify voltage Vth3 of memory cells read out after a pre-program time T in step S85 falls within the range between a threshold value Vtha of a quick write cell, and a threshold value Vthb of a slow write cell, and assumes a value closer to the threshold value Vthb of the slow write cell, that average voltage is sufficient as an amount written by pre-programming in step S85.

11th Embodiment

Figure 31A:
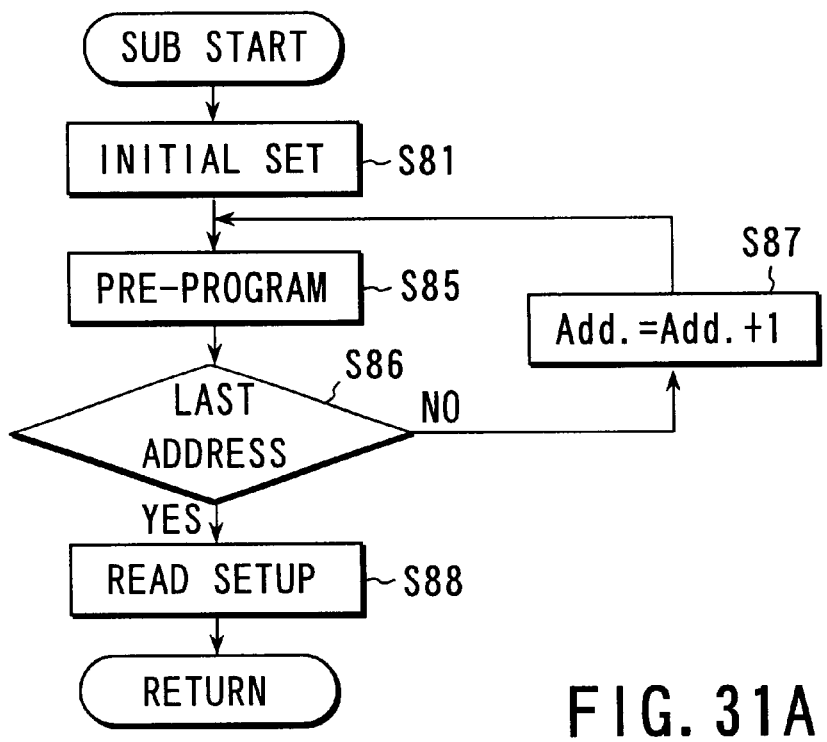
FIG. 31A is a flow chart showing the operation sequence of pre-programming upon automatic erase according to the 11th embodiment of the present invention.
Figure 31B:
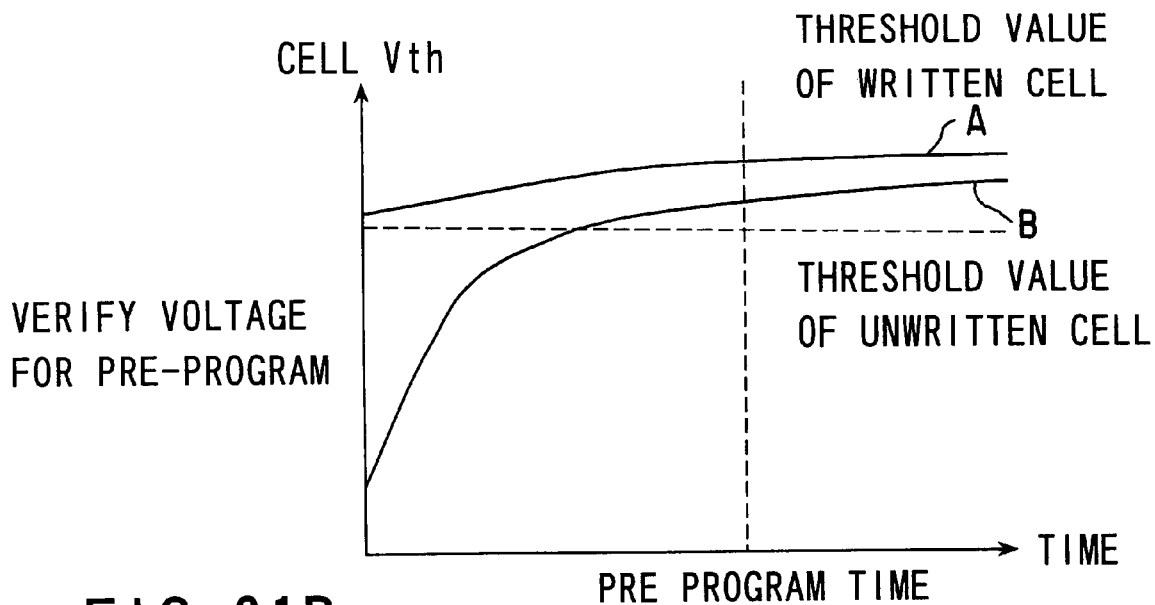
FIG. 31B is a graph showing a change in verify voltage for pre-programming shown in FIG. 31A.

As shown in FIG. 31B, the cell threshold value rise with respect to the cell write time normally becomes smaller as the cell threshold value is higher. When an already written cell is pre-programmed, the Vth rise is small even when the write time is extended, as indicated by curve A in FIG. 31B. On the other hand, when an unwritten cell which has not undergone write is pre-programmed, the Vth rise is initially large, but its rate drops considerably as the write time becomes longer, as indicated by curve B in FIG. 31B.

In this manner, upon writing the already written cell in pre-programming, the threshold value rise of this cell is not so large. That is, pre-programming before erase can be done for only unwritten cells as needed so as to prevent them from being over-erased, and no problem is posed even when an already written cell undergoes another write. Hence, a verify process before pre-programming may also be omitted, and the pre-programming may be done in a sequence shown in FIG. 31A.

The sequence shown in FIG. 31A is substantially the same as that in FIG. 30A, except that steps S82 to S84 in FIG. 30A are omitted. Hence, the same step numbers denote the same processes, and a detailed description thereof will be omitted.

12th Embodiment

When the power supply voltage is low (e.g., 1.8V), since a device for obtaining a write voltage by boosting the power supply voltage has insufficient current supply performance, the number of cell bits to be written simultaneously is controlled to divide one I/O into a plurality of I/Os, as has been described earlier in the embodiment shown in FIG. 1. This method is effective not only for normal write but also for pre-programming upon erase.

Figure 32:
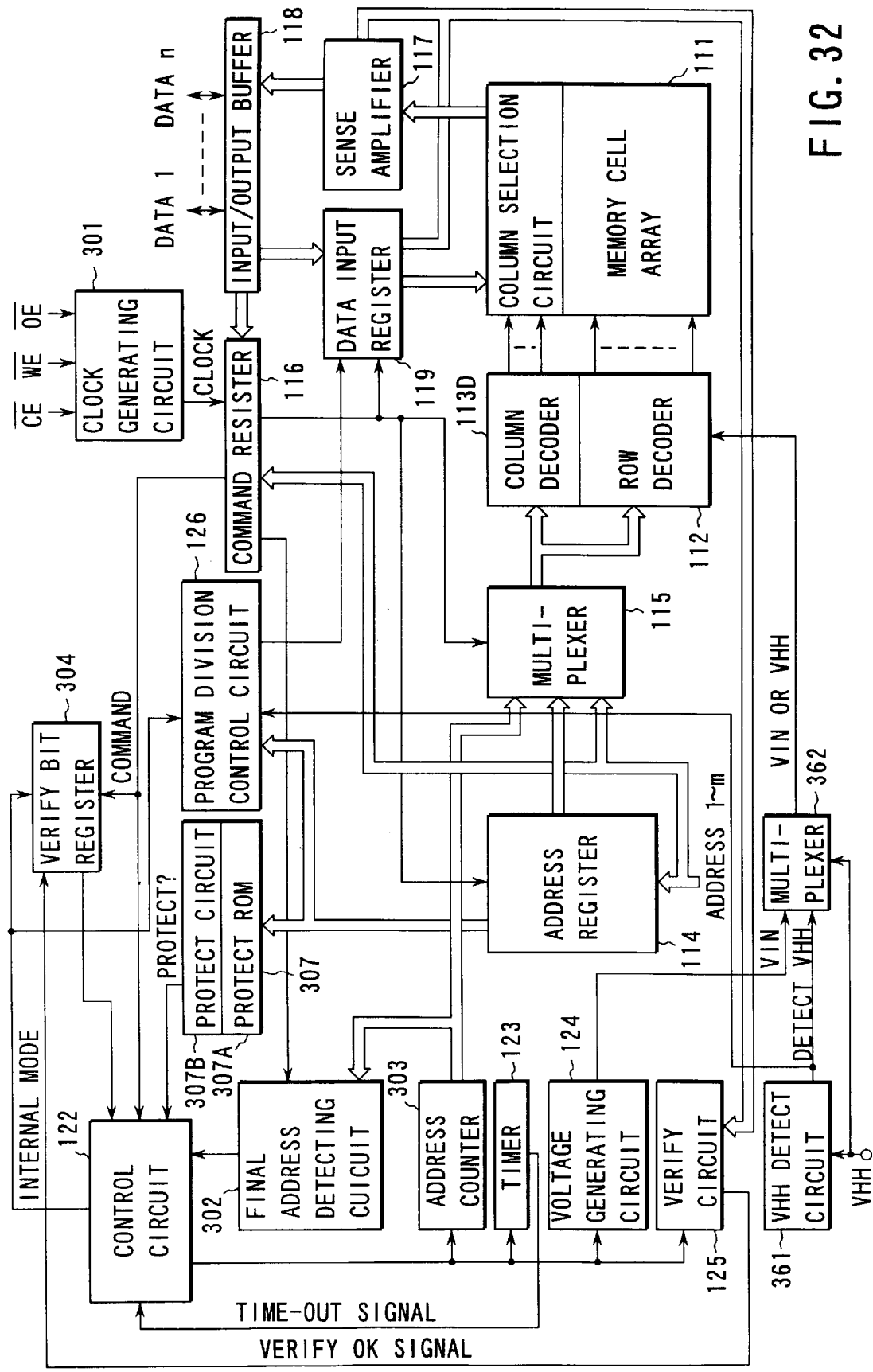
FIG. 32 is a schematic block diagram showing the circuit arrangement of a flash EEPROM having an automatic erase function as a semiconductor storage device according to the 12th embodiment of the present invention.

On the other hand, in a system having such low-voltage power supply, a semiconductor device having an automatic erase function, which comprises a high-voltage input terminal and high-voltage detect circuit for receiving a high voltage from an external circuit, generates a high voltage for write by boosting a power supply voltage by an internal booster circuit if the external high voltage is not detected, and directly switches the voltage at the high-voltage input terminal to a high voltage for write if the external high voltage is detected, may be proposed. FIG. 32 shows an example of such device.

The arrangement of the device of the embodiment shown in FIG. 32 is nearly the same as that of the device of the embodiment shown in FIG. 18. Hence, the same reference numerals denote the same parts as those in the device shown in FIG. 18, and only differences will be explained below.

Referring to FIG. 32, a write (program) division control circuit 126 used in the embodiment shown in FIG. 1 is used in place of the erase history storage circuit 306 in the embodiment shown in FIG. 18. Furthermore, the device shown in FIG. 32 has an external high-voltage reception terminal VHH, and a high-voltage detect unit (circuit) 361 and multiplexer 362 are connected to this terminal VHH.

The multiplexer 362 receives a detect signal detected by the high-voltage detect unit 361, and also receives an internal boosted voltage VIN from the voltage generating circuit 124. When an external high voltage is supplied to the terminal VHH, the multiplexer 362 supplies this external high voltage VHH to the row decoder 112; when no detect signal of the voltage VHH is received, the multiplexer 362 selects the internal high voltage VIN and supplies it to the row decoder 112. This high-voltage detect signal is also supplied to the write division control circuit 126.

Figure 33:
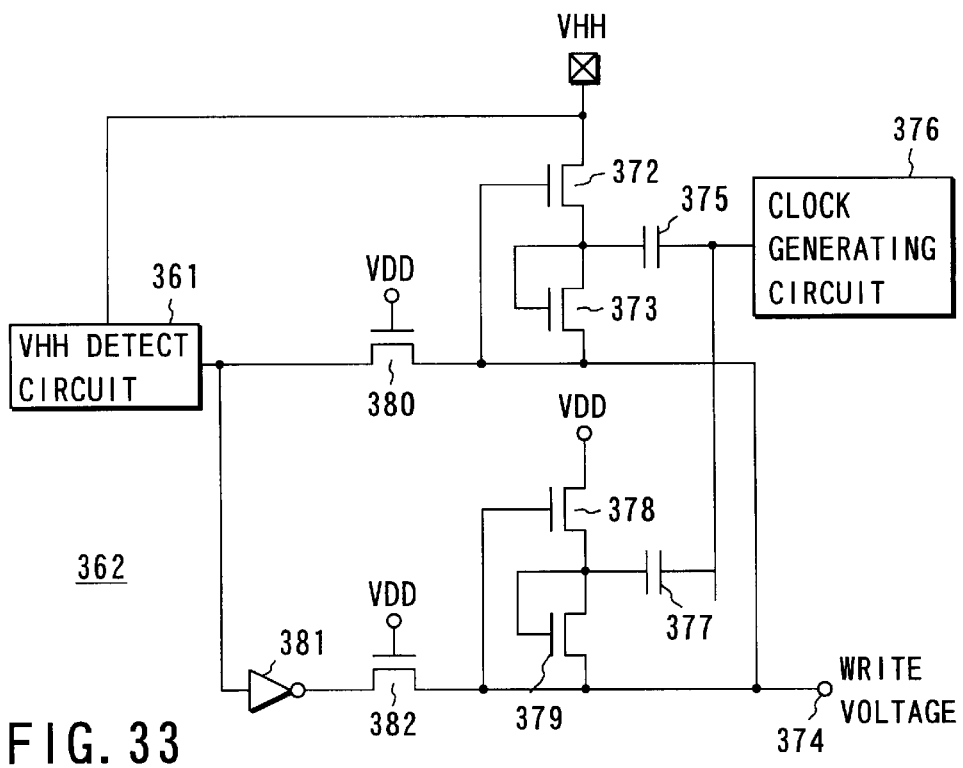
FIG. 33 is a block diagram showing an example of the arrangement of a high-voltage detect circuit used in the embodiment shown in FIG. 32.

FIG. 33 is a block diagram showing an example of the internal arrangement of the multiplexer 362. The terminal VHH is connected to the VHH detect circuit 361, and is also connected to a write voltage output terminal 374 via two transistors 372 and 373.

A clock generating circuit 376 is connected to the node between the transistors 372 and 373 via a capacitor 375. The node between transistors 378 and 379 is also connected to the output of the clock generating circuit 376 via a capacitor 377. The gates of the transistors 372 and 378 are connected to the output terminal 374, and those of the transistors 373 and 379 are connected to their nodes.

The output terminal of the VHH detect circuit 361 is connected to the output terminal 374 via a gate 380 which opens in response to VDD, and also via an inverter 381 and gate 382.

In the circuit shown in FIG. 33, when an external high voltage is supplied to the terminal VHH, the VHH detect circuit 361 detects it, and changes its output to HIGH. As a result, since the gate 380 opens, and the transistor 372 is turned on, the high voltage supplied to the terminal VHH is output to the output terminal 374 as a write voltage in accordance with clocks from the clock generating circuit 376. At this time, the output from the inverter 381 changes to LOW, and the transistor 378 is turned off. Hence, the VDD voltage does not appear at the output terminal 374.

When no external high voltage is supplied to the terminal VHH, since the output from the VHH detect circuit 361 is LOW, the output from the inverter 381 changes to HIGH to turn on the transistor 378 and turn off the transistor 372, and the VDD voltage appears at the output terminal 374 in accordance with clocks.

Referring back to FIG. 32, when an external high voltage is supplied to the terminal VHH, the high-voltage detect signal is supplied from the VHH detect circuit 361 to the write division control circuit 126. In response to this detect signal, the write division control circuit 126 sets the number of divisions of bits to be written simultaneously to be 1, i.e., sets to simultaneously write all bits of one I/O using the external high voltage without division in the sequence of pre-programming upon automatic erase.

Figure 34A:
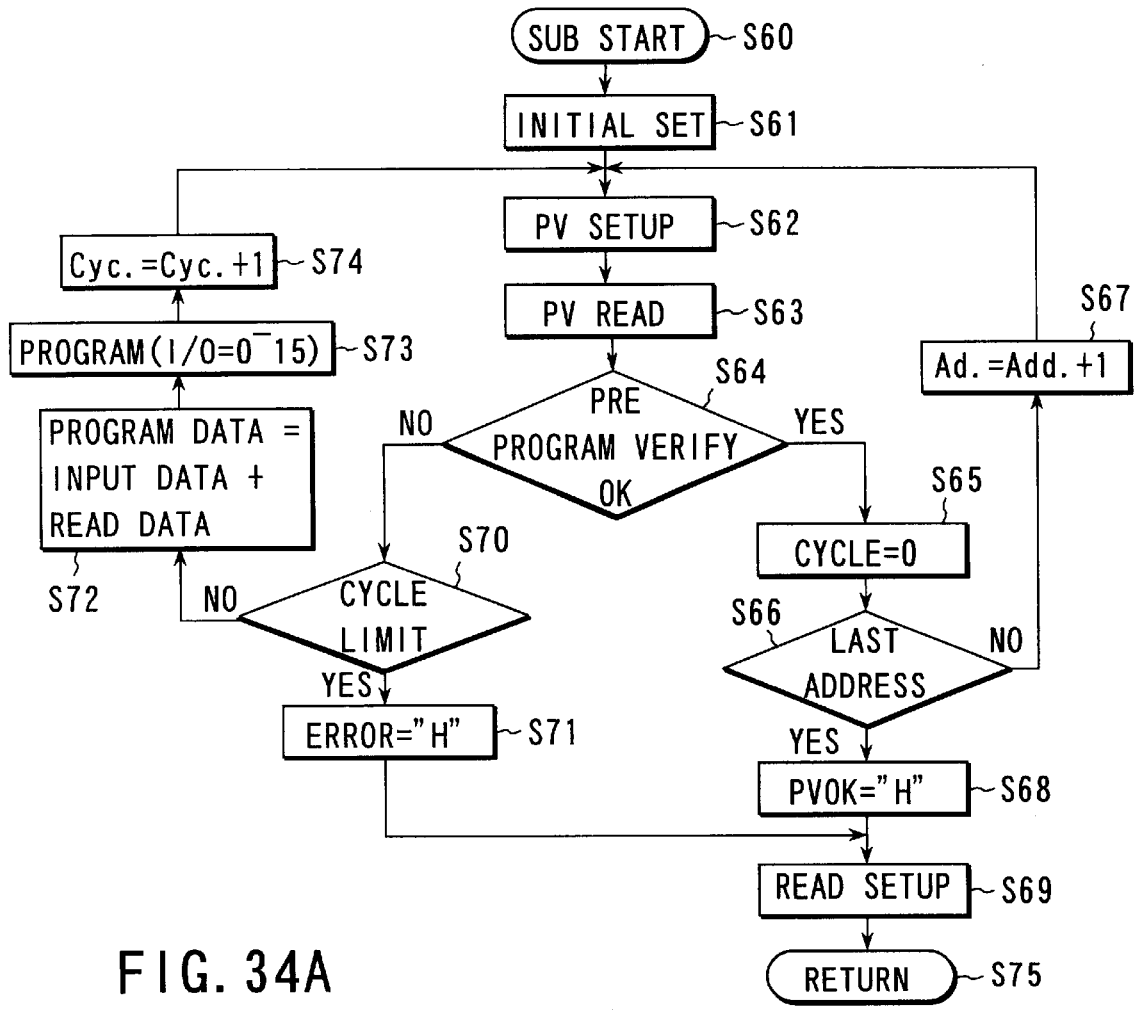
FIG. 34A is a flow chart showing the operation of the embodiment shown in FIG. 32.

FIG. 34A shows this batch-erase operation, which is substantially the same as the sequence that has already been explained above with reference to FIG. 29A, and the same step numbers denote the same processes. Only the difference from FIG. 29A is that a write voltage is simultaneously supplied to all 16 I/O terminals (0 to 15) based on the output from the program division control circuit 126 upon programming in step S73.

Figure 34B:
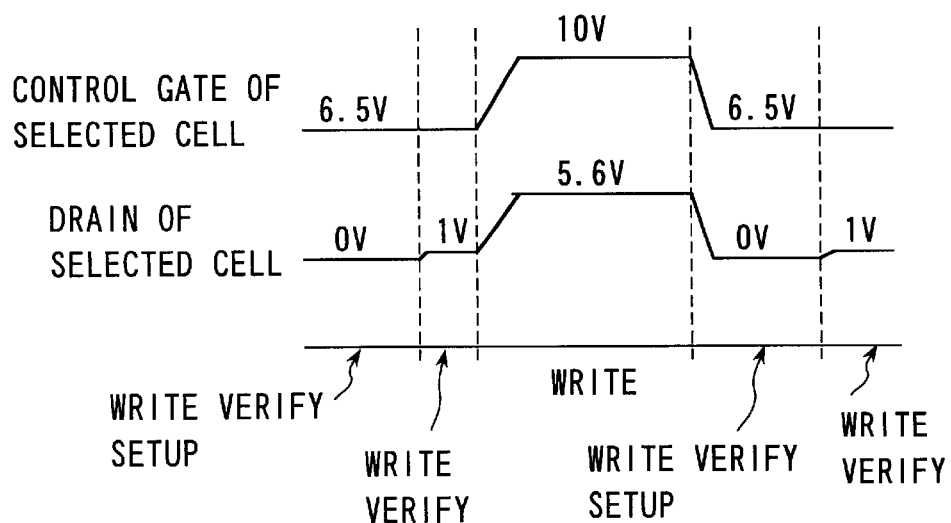
FIG. 34B is a graph showing changes in voltage in the respective portions of a selected cell, which is used in explanation of the operation of the flow chart shown in FIG. 34A.
Figure 36:
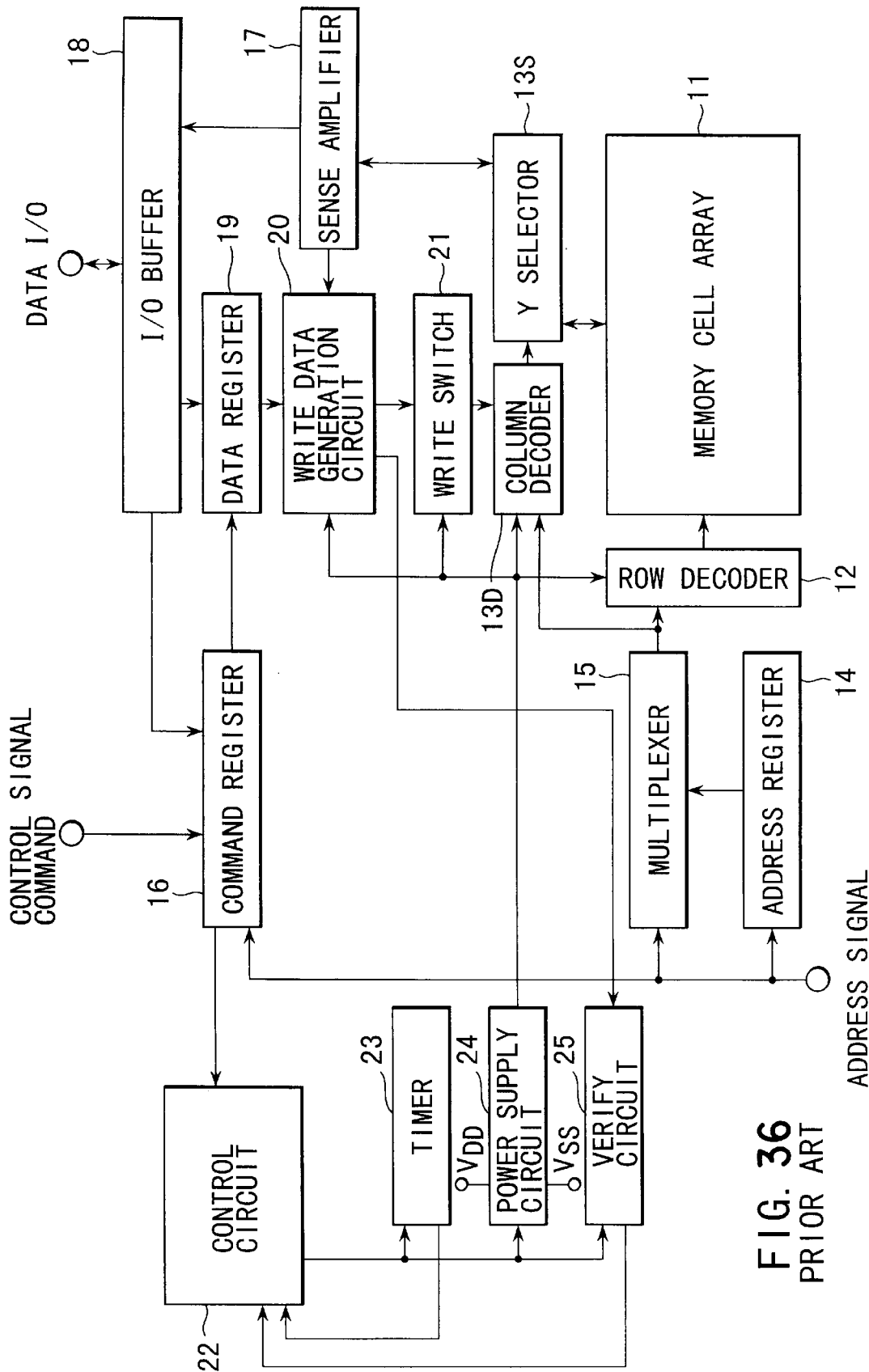
FIG. 36 is a schematic block diagram showing the circuit arrangement of a conventional flash EEPROM with an automatic write function.
Figure 37A:
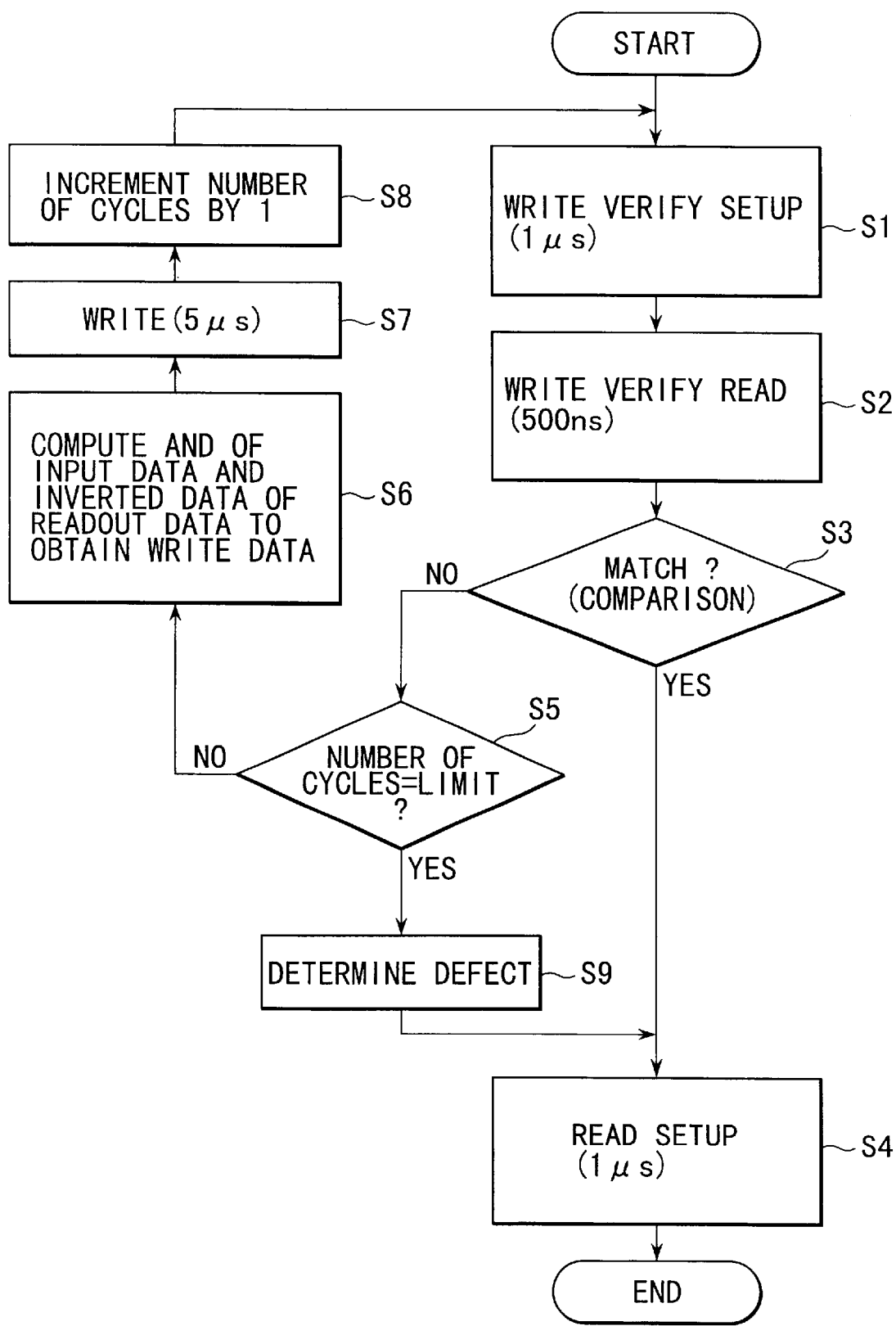
FIG. 37A is a flow chart for explaining the automatic write operation in the conventional circuit shown in FIG. 36.
Figures 37B, 38:
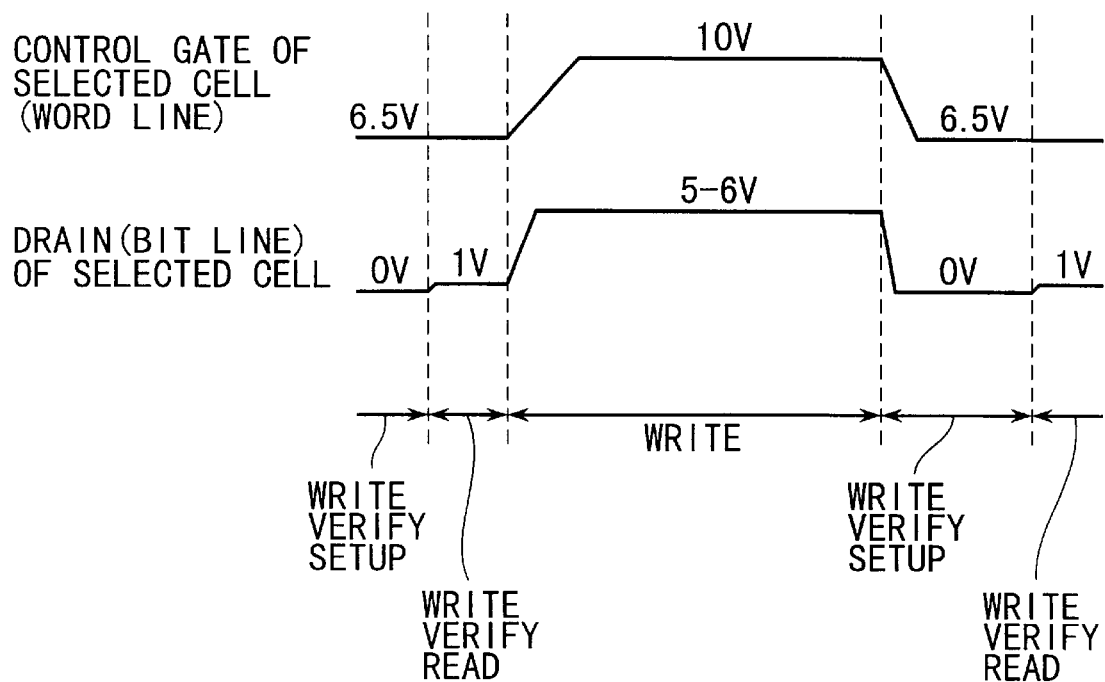
FIG. 37B is a table showing the logic relationship among the input data, readout data, and write data in the prior art shown in FIG. 36.
FIG. 38 is a timing chart for explaining the automatic write operation in the prior art shown in FIG. 36.

That is, the sequence shown in FIG. 34A will be briefly described:

steps S60 and S61: start and initial set, step S62: setup the high voltage PV in FIG. 34B, (if the protect circuit 307 denies write, the control advances to step S75 via some steps)

step S63: read the PV, step S64: write very in FIG. 34B, (if verify=OK, the control advances to step S75 via some steps)

step S72: write high voltage setups, (shorter than those in the sequence with write division)

step S73: write using external high voltage of 10V in FIG. 34B (I/O: 0 to 15), step S66: check as to whether the current address is the last address or not, (if not the last address, the address is incremented by 1, and the control returns to step S62)

steps S69 and S75: process for returning to a read state, and end.

The wait time until the booster circuit 124 is ready in step S62 can be the time required until the write voltage input from the high-voltage input terminal VHH charges the internal wiring. Hence, setups can be done earlier than in the corresponding step in the sequence with write division using the internal voltage.

In this manner, by applying a high voltage to the high-voltage input terminal VHH, the automatic erase operation time can be shortened since the number of write divisions can be reduced and the setup time of the booster circuit 124 can be shortened.

13th Embodiment

An automatic erase device performs automatic erase in the system having the arrangement shown in FIG. 32 in the sequence shown in FIG. 34A. Likewise, automatic write is made using the system with the arrangement shown in FIG. 32 in accordance with a sequence shown in FIG. 35. This is because pre-programming upon erase is write operation in a broad sense, and can use the system having the same arrangement.

When the automatic write function is implemented, a high-voltage input terminal is provided independently of a power supply voltage terminal, a high-voltage detect circuit is connected to the high-voltage input terminal, a high voltage for write is generated by boosting a power supply voltage by an internal booster circuit if no external high voltage is detected, and the voltage at the high-voltage input terminal is directly switched to a high voltage for write if the external high voltage is detected, as in automatic erase shown in FIGS. 32 and 34A.

Figure 35:
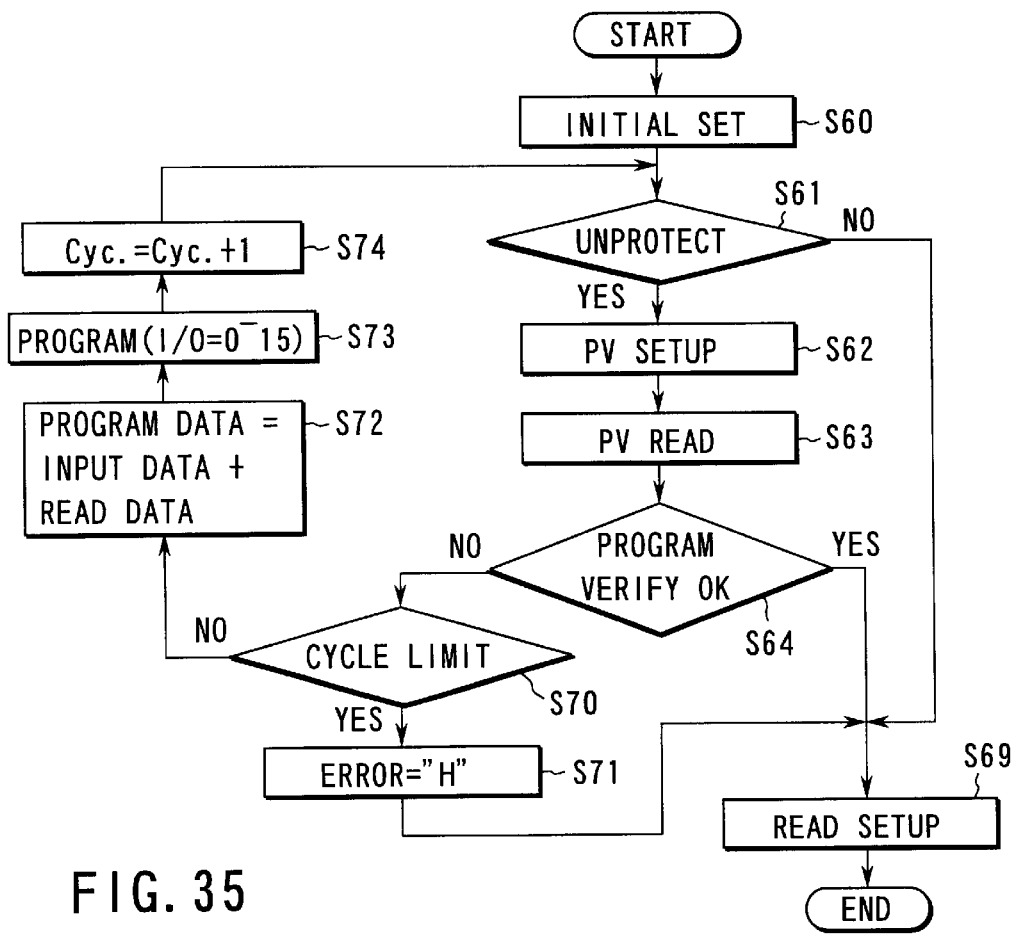
FIG. 35 is a flow chart showing the operation sequence upon automatic write according to the 13th embodiment of the present invention.

An automatic write sequence at that time is changed, as shown in FIG. 35, and the number of divisions of bits to be simultaneously written is set at 1 (16/16), as shown in step S73. In this manner, the automatic write operation time can be shortened.

Other operations are the same as those in FIG. 34A if steps S65 to S68 are omitted.

As described above, upon block erase, it is checked by verifying erase flags if erase operations are required. If erase operations are not required, the block erase sequence ends without any erase operations.

Upon erasing a plurality of blocks simultaneously, blocks which need not be erased are excluded from a at combination of batch-erase blocks by verifying erase flags, and only blocks that require erase operations are simultaneously erased. In this manner, since blocks which need not be erased can be excluded from those to be selected, the erase operation time required for those unnecessary blocks can be shortened.

Furthermore, (1) a cell gate voltage upon verify for pre-programming is set to be lower than that upon verify for normal automatic program operation, (2) a verify process after pre-programming is omitted, or (3) verify processes before and after pre-programming are omitted, thus shortening the erase time itself.

When a high voltage is input from the external high-voltage terminal, the internal booster circuit is disabled, and the number of bits to be written simultaneously upon pre-programming is set to be 1, thus shortening the pre-program time and, hence, the erase operation time.

This method can also be applied to automatic program operation, and can shorten the automatic program time.

As described above, according to the present invention, a semiconductor storage device which can suppress an increase in write time when the power supply voltage drops can be provided.

Also, a semiconductor storage device which can set a low power supply voltage without increasing any chip area can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device which has an automatic write function, and uses a high voltage obtained by boosting a power supply voltage upon write, comprising:

booster means for generating the high voltage for write by boosting the power supply voltage;

write division control means for, upon writing data, divisionally performing a write operation in a plurality of number of times by shifting selection timings of bit lines by selectively ON/OFF-controlling a bit line write switch that controls whether or not input data is supplied to a bit line; and write means for writing data by supplying the high voltage output from said booster means to a memory cell connected to the bit line selected by said write division control means.

2. A device according to claim 1, wherein a first bit line is selected by said write division control means after completion of boosting of a word line of the memory cell in which the data is to be written.

3. A device according to claim 1, wherein selection times of bit lines divisionally selected in the plurality of number of times by said write division control means are substantially equal to each other.

4. A device according to claim 1, further comprising power supply voltage detection means for detecting the power supply voltage of said booster means, and means for changing the number of selected bit lines on the basis of a level of the power supply voltage detected by said power supply voltage detection means.

5. A device according to claim 1, further comprising power supply voltage detection means for detecting the power supply voltage of said booster means before data is written, and wherein when the power supply voltage detected by said power supply voltage detection means has a low level, the number of divisions by said write division control means is increased, and when the detected power supply voltage has a high level, the number of divisions is decreased.

6. A device according to claim 1, further comprising power supply voltage detection means for detecting the power supply voltage of said booster means, and wherein said power supply voltage detection means detects a power supply voltage immediately after the beginning of an automatic write process, and when the detected power supply voltage has a low level, the number of divisions by said write division control means is increased, and when the detected power supply voltage has a high level, the number of divisions is decreased.

7. A device according to claim 1, further comprising control data storage means for storing a control method data for controlling said write division control means, and wherein the number of the write division is changed on the basis of the control method data stored in said control data storage means.

8. A device according to claim 7, wherein said control data storage means comprises an EEPROM cell, which stores the control data.

9. A device according to claim 1, further comprising division number storage means for storing the number of divisions of said write division control means, and wherein the number of divisions by said write division control means is changed on the basis of the number of divisions stored in the division number storage means.

10. A device according to claim 9, wherein said division number storage means comprises an EEPROM cell, which stores the number of divisions.

11. A device according to claim 1, wherein said write division control means controls the number of divisions on the basis of a test signal.

12. A semiconductor storage device comprising:

a nonvolatile memory cell array;

at least one write history storage element provided in correspondence with said nonvolatile memory cell array; and a controller for determining in accordance with contents of said write history storage element upon erase if erase operation is required for said nonvolatile memory cell array.

13. A device according to claim 12, wherein said nonvolatile memory cell array is divided into a plurality of blocks, and said write history storage element is provided to each of the plurality of blocks.

14. A device according to claim 13, wherein said controller includes erase means for referring to contents of the plurality of write history storage elements provided to the plurality of blocks, and executing batch erase of a plurality of blocks with write history.

15. A device according to claim 14, wherein said erase means includes voltage generating means for generating a voltage, lower than a cell gate voltage upon verify for normal automatic write, as a cell gate voltage upon verify for pre-erase write.

16. A device according to claim 14, wherein said erase means comprises means for performing pre-erase write, and means for executing erase operation without any verify process after the pre-erase write.

17. A device according to claim 14, wherein said erase means comprises means for executing erase operation without any verify processes before and after the pre-erase write.

18. A device according to claim 12, further comprising:

a high-voltage input terminal;

a power supply voltage terminal;

a detect circuit for detecting if a high voltage is input to said high-voltage input terminal; and means for generating, in accordance with an output from said detect circuit, a high voltage for write by boosting a power supply voltage at said power supply voltage terminal when no high voltage is input, or directly using the input high voltage in place of the boosted power supply voltage when the high voltage is input.

19. A device according to claim 18, further comprising means for increasing the number of bits to be simultaneously written when the voltage at said high-voltage input terminal is used in write.

20. A device according to claim 12, said write history storage element is formed in a peripheral circuit of said nonvolatile memory cell array independently of said nonvolatile memory cell array.

21. A device according to claim 13, wherein said write history storage elements are integrally formed as columns of the plurality of memory blocks.

22. A device according to claim 14, wherein said write history storage elements are integrally formed as rows of the plurality of memory blocks.

* * * * *